(12) United States Patent
Resch et al.

(10) Patent No.: US 10,169,125 B2
(45) Date of Patent: Jan. 1, 2019

(54) RE-ENCODING DATA IN A DISPERSED STORAGE NETWORK

(71) Applicant: CLEVERSAFE, INC., Chicago, IL (US)

(72) Inventors: Jason K. Resch, Chicago, IL (US); Greg Dhuse, Chicago, IL (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 147 days.

(21) Appl. No.: 15/075,946

(22) Filed: Mar. 21, 2016

(65) Prior Publication Data

US 2016/0350171 A1    Dec. 1, 2016

Related U.S. Application Data

(60) Provisional application No. 62/168,114, filed on May 29, 2015.

(51) Int. Cl.
*G06F 11/16* (2006.01)
*G06F 11/07* (2006.01)
(Continued)

(52) U.S. Cl.
CPC .......... *G06F 11/0727* (2013.01); *G06F 3/064* (2013.01); *G06F 3/067* (2013.01); *G06F 3/0619* (2013.01); *G06F 3/0644* (2013.01); *G06F 11/073* (2013.01); *G06F 11/0787* (2013.01); *G06F 11/1076* (2013.01); *G06F 11/1088* (2013.01); *G06F 11/1612* (2013.01); *G06F 17/30578* (2013.01); *H03M 13/1515* (2013.01); *H04L 67/1097* (2013.01); *G06F 17/30575* (2013.01); *G06F 2211/1028* (2013.01)

(58) Field of Classification Search
CPC ............. H04L 67/1095; H04L 67/1097; G06F 2211/1028; G06F 2211/1023; G06F 2211/1026; G06F 17/30575; G06F 17/30578

See application file for complete search history.

(56) References Cited

U.S. PATENT DOCUMENTS

| | | |
|---|---|---|
| 4,092,732 A | 5/1978 | Ouchi |
| 5,454,101 A | 9/1995 | Mackay et al. |

(Continued)

OTHER PUBLICATIONS

Shamir; How to Share a Secret; Communications of the ACM; vol. 22, No. 11; Nov. 1979; pp. 612-613.

(Continued)

*Primary Examiner* — Joseph O Schell
(74) *Attorney, Agent, or Firm* — Garlick & Markison; Timothy W. Markison; Shayne X. Short

(57) ABSTRACT

A method begins by a storage unit partially decoding a first encoded data slice of a set of encoded data slices in accordance with previous dispersed storage error encoding parameters to produce a partially decoded first encoded data slice that is stored by another storage unit. The method continues with the storage unit partially re-encoding the partially decoded first encoded data slice in accordance with updated dispersed storage error encoding parameters to produce a first partially re-encoded data slice that is used to create a new first encoded data slice of a new set of encoded data slices.

16 Claims, 59 Drawing Sheets

(51) Int. Cl.
*G06F 17/30* (2006.01)
*H04L 29/08* (2006.01)
*G06F 3/06* (2006.01)
*G06F 11/10* (2006.01)
*H03M 13/15* (2006.01)

(56) References Cited

U.S. PATENT DOCUMENTS

| | | |
|---|---|---|
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |
| 6,128,277 A | 10/2000 | Bruck et al. |
| 6,175,571 B1 | 1/2001 | Haddock et al. |
| 6,192,472 B1 | 2/2001 | Garay et al. |
| 6,256,688 B1 | 7/2001 | Suetaka et al. |
| 6,272,658 B1 | 8/2001 | Steele et al. |
| 6,301,604 B1 | 10/2001 | Nojima |
| 6,356,949 B1 | 3/2002 | Katsandres et al. |
| 6,366,995 B1 | 4/2002 | Vilkov et al. |
| 6,374,336 B1 | 4/2002 | Peters et al. |
| 6,415,373 B1 | 7/2002 | Peters et al. |
| 6,418,539 B1 | 7/2002 | Walker |
| 6,449,688 B1 | 9/2002 | Peters et al. |
| 6,567,948 B2 | 5/2003 | Steele et al. |
| 6,571,282 B1 | 5/2003 | Bowman-Amuah |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,636,724 B2 * | 12/2009 | de la Torre ............ H03M 7/30 |
| 8,495,466 B2 * | 7/2013 | Cilfone ............... G06F 11/1076 |
| | | 714/47.1 |
| 8,683,286 B2 * | 3/2014 | Gladwin ............ G06F 11/1076 |
| | | 714/752 |
| 8,839,068 B2 * | 9/2014 | Grube .................. H03M 13/05 |
| | | 714/752 |
| 9,692,593 B2 * | 6/2017 | Gladwin ............... H04L 9/0819 |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula |
| 2005/0132070 A1 | 6/2005 | Redlich et al. |
| 2005/0144382 A1 | 6/2005 | Schmisseur |
| 2005/0229069 A1 | 10/2005 | Hassner et al. |
| 2006/0047907 A1 | 3/2006 | Shiga et al. |
| 2006/0136448 A1 | 6/2006 | Cialini et al. |
| 2006/0156059 A1 | 7/2006 | Kitamura |
| 2006/0224603 A1 | 10/2006 | Correll |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Soran et al. |
| 2007/0283167 A1 | 12/2007 | Venters et al. |
| 2009/0094251 A1 | 4/2009 | Gladwin et al. |
| 2009/0094318 A1 | 4/2009 | Gladwin et al. |
| 2010/0023524 A1 | 1/2010 | Gladwin et al. |
| 2013/0031414 A1 * | 1/2013 | Dhuse ................. G06F 11/0727 |
| | | 714/37 |
| 2014/0068320 A1 * | 3/2014 | Vedpathak .......... G06F 21/6272 |
| | | 714/6.2 |
| 2014/0281550 A1 * | 9/2014 | Resch .................. H04L 9/0822 |
| | | 713/171 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

Kubiatowicz, et al.; OceanStore: An Architecture for Global-Scale Persistent Storage; Proceedings of the Ninth International Confer-

(56) References Cited

OTHER PUBLICATIONS ence on Architectural Support for Programming Languages and Operating Systems (ASPLOS 2000); Nov. 2000; pp. 1-12.

* cited by examiner distributed computing system 10

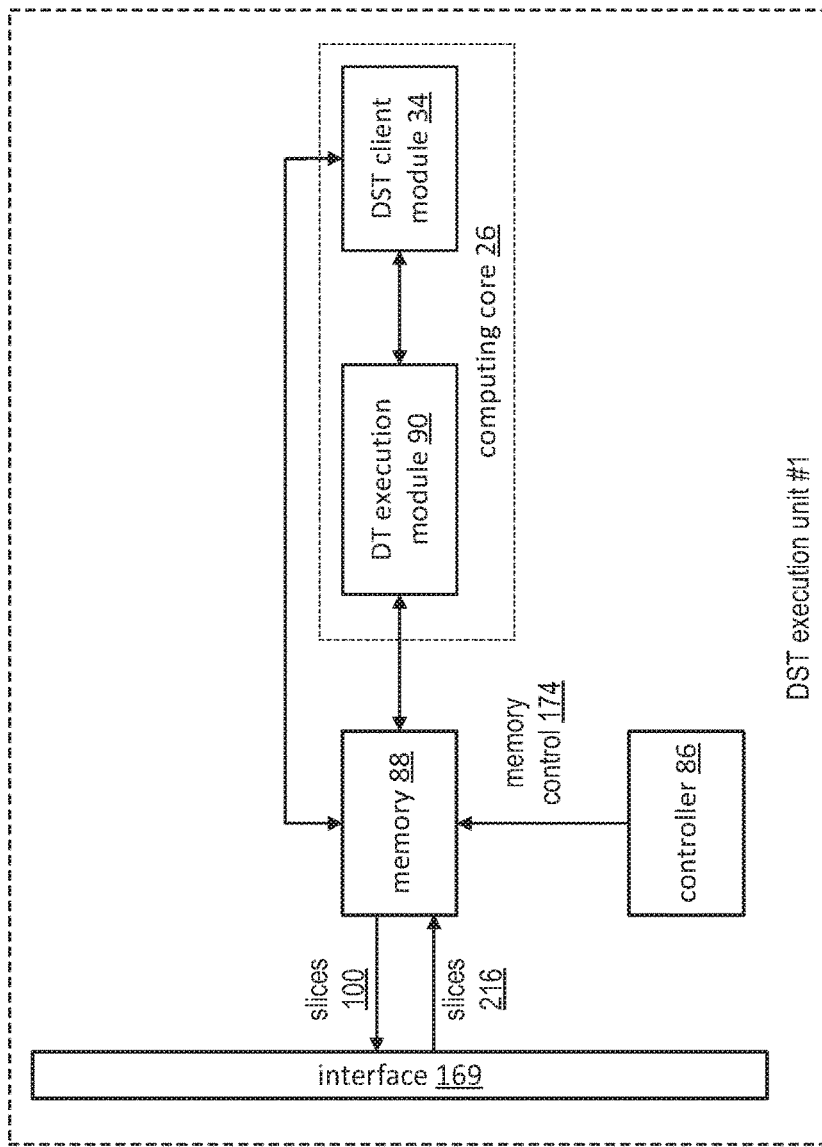
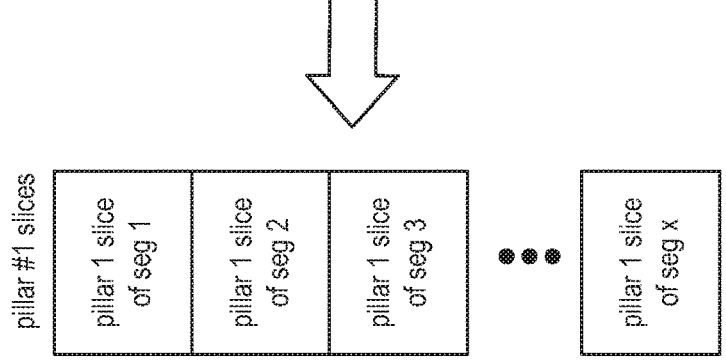
FIG. 24

DST allocation info 242 | data partition info 320: data ID; No. of partitions; Addr. info for each partition; format conversion indication intermediate result info 324

| task 326 | task ordering 328 | data partition 330 | set of DT EX mods 332 | Name 334 | interm result processing 336 | scratch pad storage 338 | intermediate result storage 340 |
|---|---|---|---|---|---|---|---|
| 1_1 | none | 2_1 - 2_z | 1_1, 2_1, 3_1, 4_1, & 5_1 | R1-1 | DST unit 1 | DST unit 1 | DST units 1-5 |
| 1_2 | none | 2_1 - 2_4 | 1_1, 2_1, 3_1, 4_1, & 5_1 | R1-2 | DST unit 1 | DST unit 1 | DST units 1-5 |
| 1_3 | none | 2_1 - 2_4<br>2_5 - 2_z | 1_1, 2_1, 3_1, 4_1, & 5_1<br>1_2, 2_2, 3_2, 4_2, & 5_2 | R1-3 | DST unit 2 | DST unit 2 | DST units 2-6 |
| 1_4 | after 1_3 | R1-3_1 - R1-3_4<br>R1-3_5 - R1-3_z | 1_1, 2_1, 3_1, 4_1, & 5_1<br>1_2, 2_2, 6_1, 7_1, & 7_2 | R1_4 | DST unit 3 | DST unit 3 | DST units 3-7 |
| 1_5 | after 1_4 | R1-4_1 - R1-4_z &<br>2_1 - 2_z | 1_1, 2_1, 3_1, 4_1, & 5_1 | R1-5 | DST unit 1 | DST unit 1 | DST units 1-5 |
| 1_6 | after 1_1 &<br>1_5 | R1-1_1 - R1-1_z &<br>R1-5_1 - R1-5_z | 1_2, 2_2, 3_2, 4_2, & 5_2 | R1-6 | DST unit 2 | DST unit 2 | DST units 2-6 |
| 1_7 | after 1_2 &<br>1_5 | R1-2_1 - R1-2_z &<br>R1-5_1 - R1-5_z | 3_1, 4_1, 5_1, 6_1, & 7_1 | R1-7 | DST unit 3 | DST unit 3 | DST units 3-7 |
| 2 | none | 2_1 - 2_z | 1_2, 2_2, 3_2, 4_2, & 5_2 | R2 | DST unit 7 | DST unit 7 | DST units 7, 1-4 |
| 3_1 | none (same as 1_3) | use R1_3 |  | R1-1 |  |  |  |
| 3_2 | after 3_1 | R1-3_1 - R1-3_z | 1_2, 2_2, 3_2, 4_2, & 5_2 | R3-2 | DST unit 5 | DST unit 5 | DST units 5,6, 1-3 | task execution info 322

FIG. 32

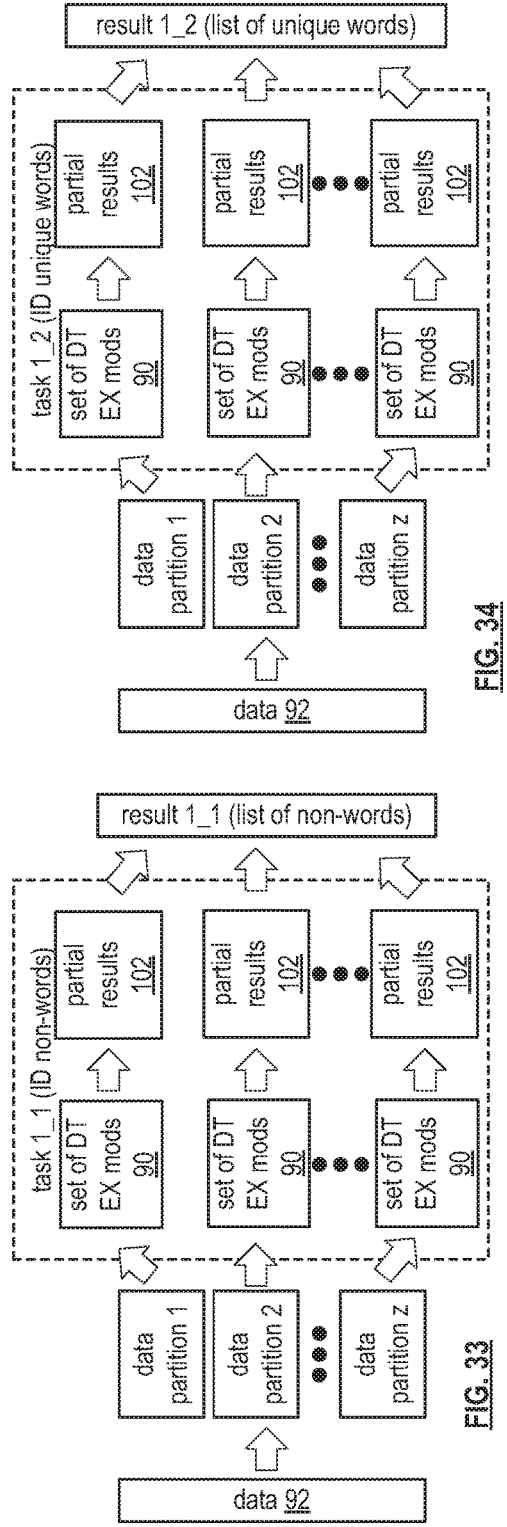
FIG. 33
FIG. 34
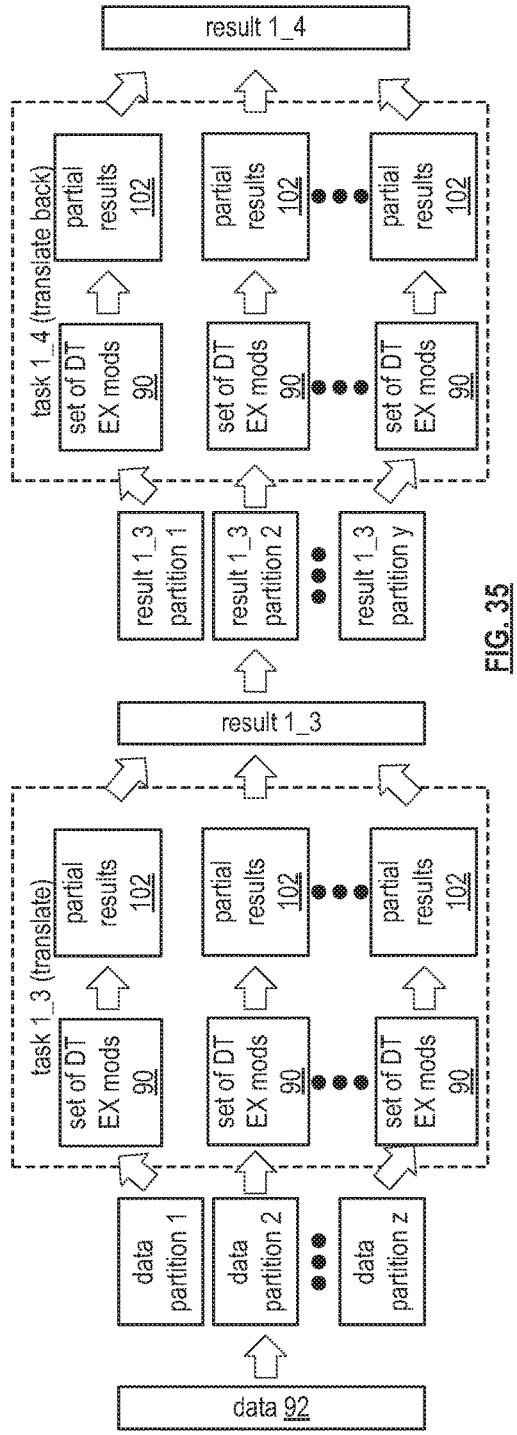
FIG. 35

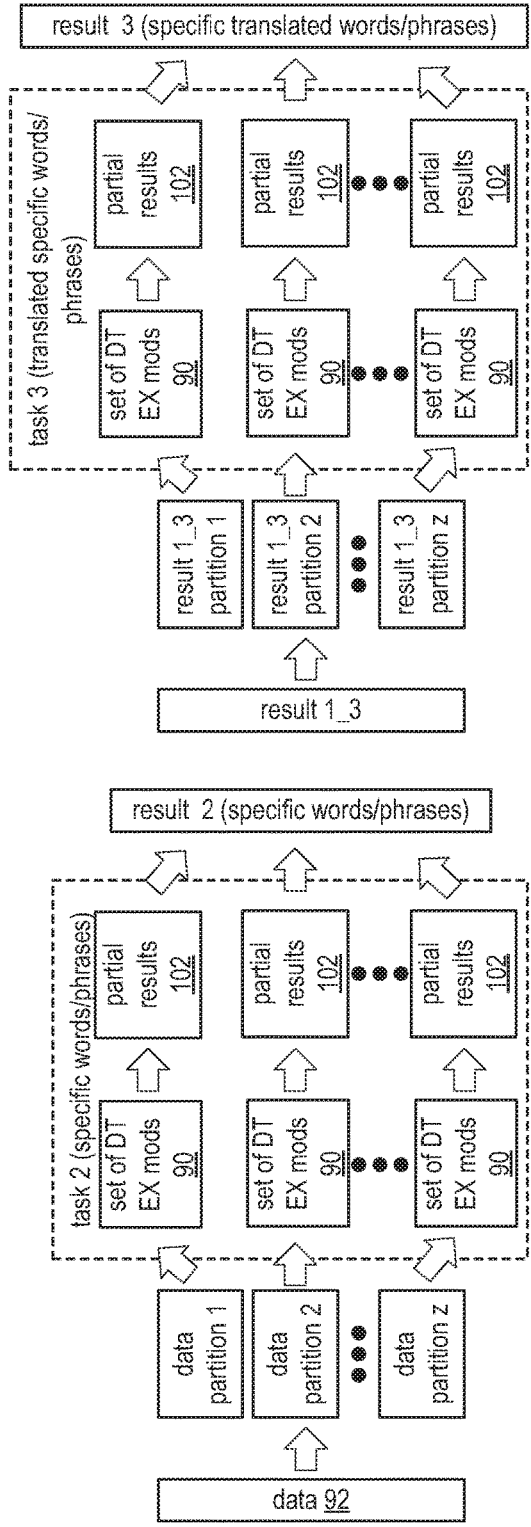
FIG. 38
FIG. 37
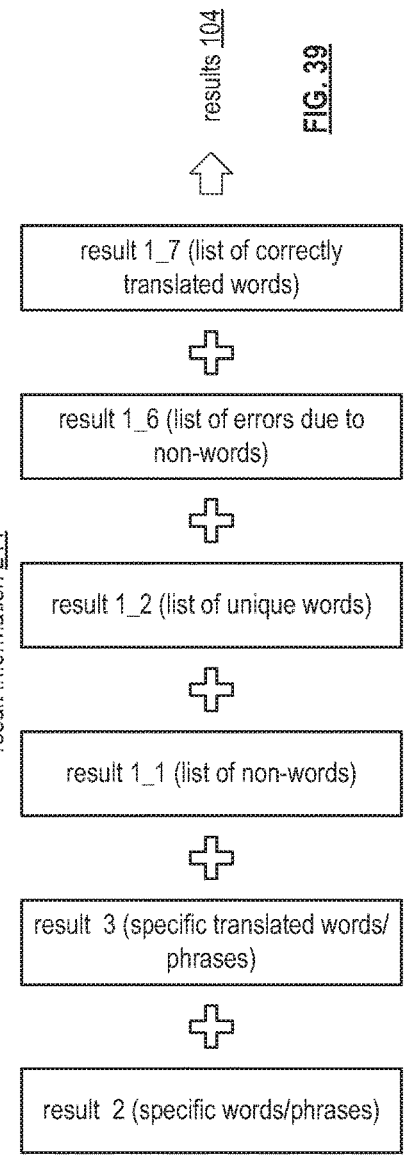
FIG. 39

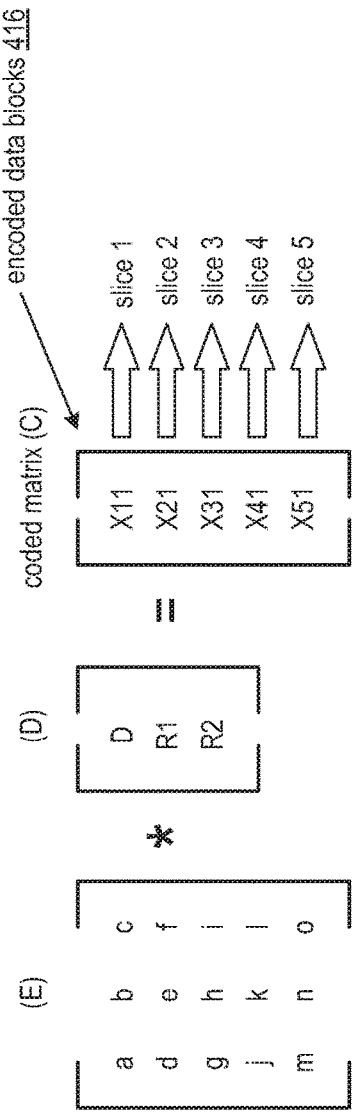
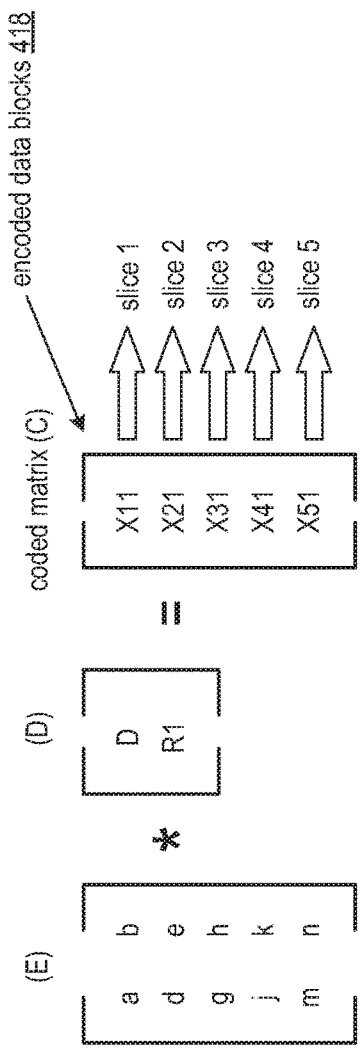
FIG. 41B
FIG. 41C

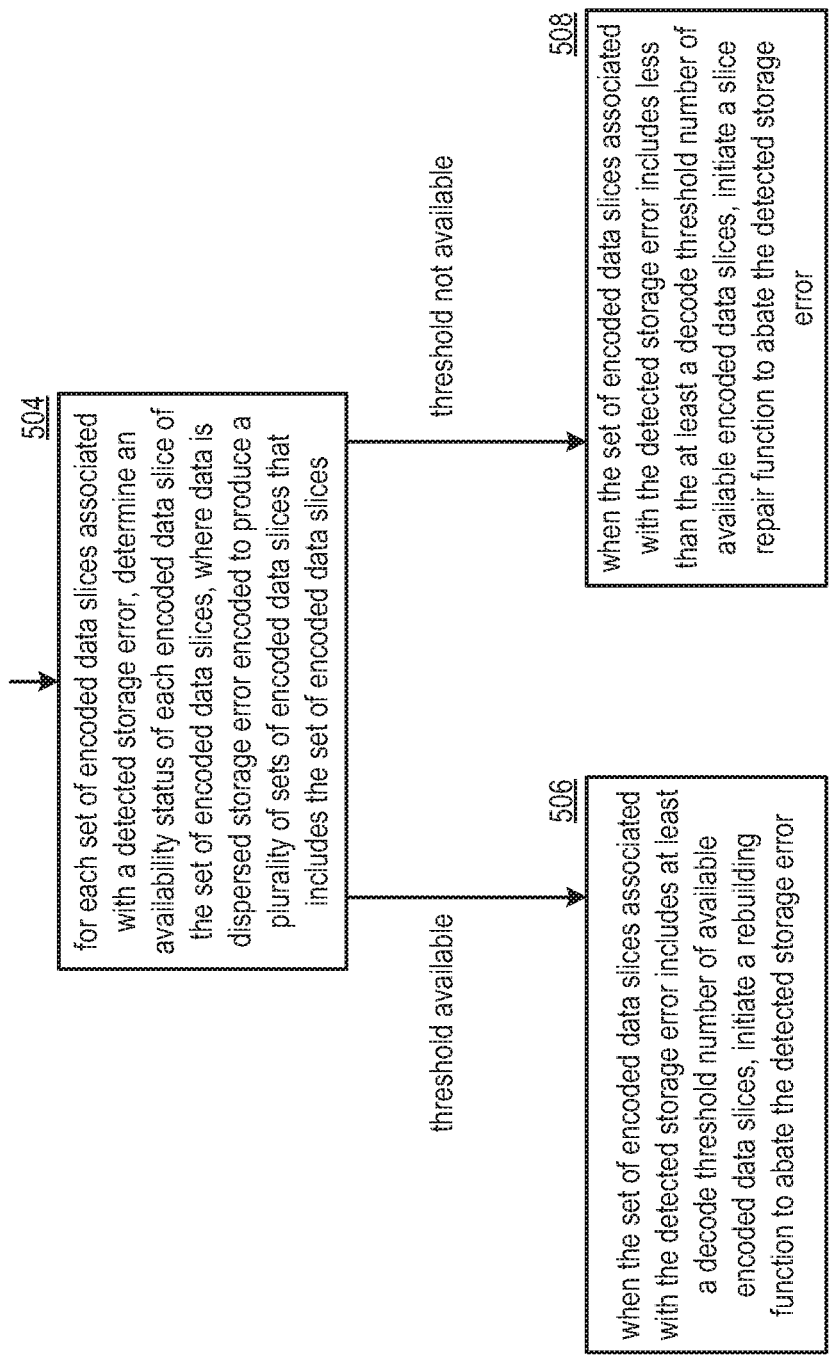

RE-ENCODING DATA IN A DISPERSED STORAGE NETWORK

CROSS REFERENCE TO RELATED PATENTS

The present U.S. Utility patent application claims priority pursuant to 35 U.S.C. § 119(e) to U.S. Provisional Application No. 62/168,114, entitled "RE-ENCODING DATA IN A DISPERSED STORAGE NETWORK," filed May 29, 2015, which is hereby incorporated herein by reference in its entirety and made part of the present U.S. Utility patent application for all purposes.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

Technical Field of the Invention

This invention relates generally to computer networks and more particularly to dispersed storage of data and distributed task processing of data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc., on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 24 is a diagram of an example of a storage operation of a DST execution unit in accordance with the present invention;

FIG. 32 is a diagram of an example of DST allocation information for the example of FIG. 30 in accordance with the present invention;

FIGS. 33-38 are schematic block diagrams of the DSTN module performing the example of FIG. 30 in accordance with the present invention;

FIG. 39 is a diagram of an example of combining result information into final results for the example of FIG. 30 in accordance with the present invention;

FIG. 41B is a diagram illustrating an example of encoding data to produce a set of encoded data slices in accordance with the present invention;

FIG. 41C is a diagram illustrating another example of encoding data to produce a new set of encoded data slices in accordance with the present invention;

FIG. 44B is a flowchart illustrating an example of selecting a storage error abatement function in accordance with the present invention;

DETAILED DESCRIPTION OF THE INVENTION

Figure 1:
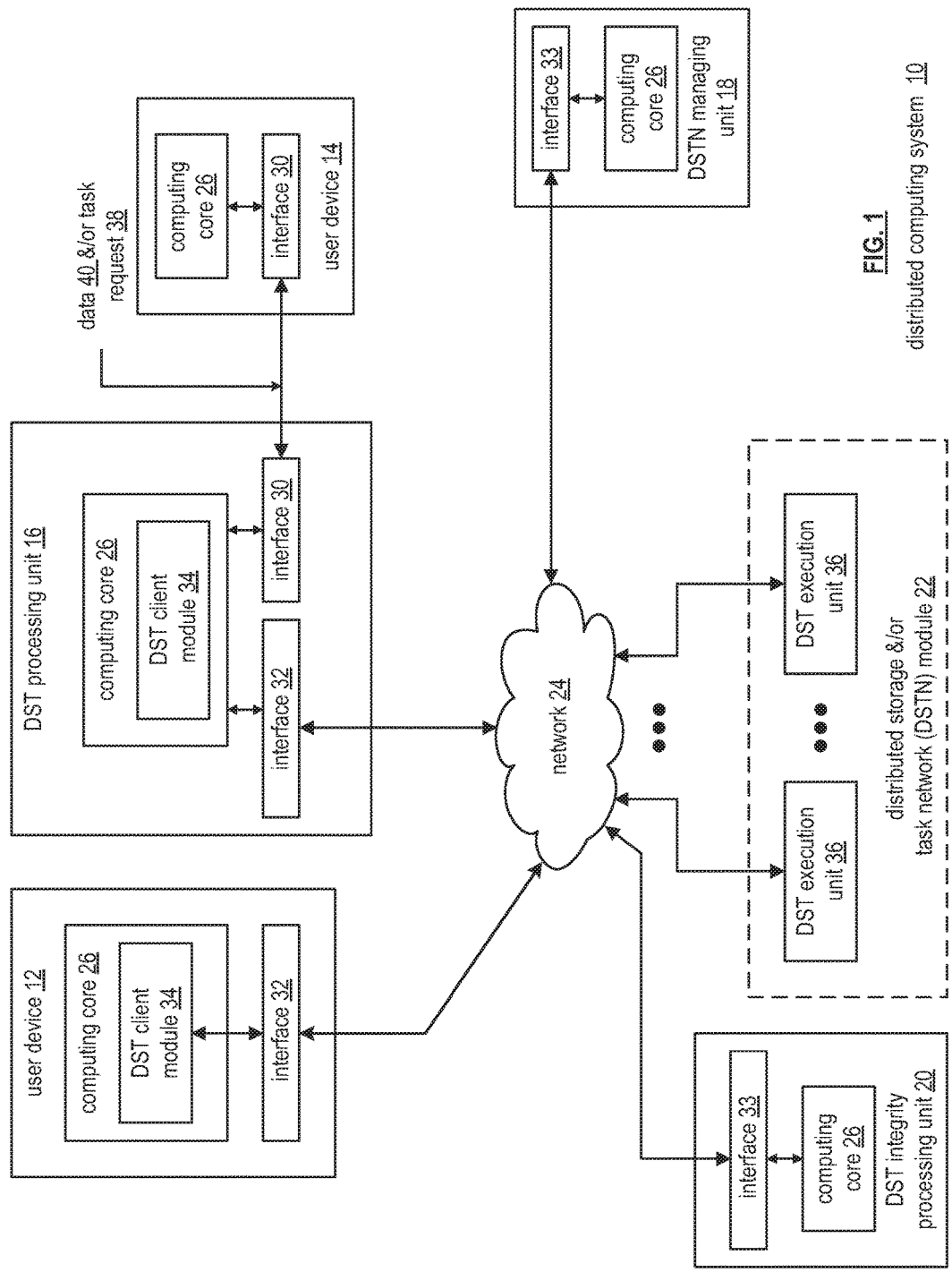
FIG. 1 is a schematic block diagram of an embodiment of a distributed computing system in accordance with the present invention.

FIG. 1 is a schematic block diagram of an embodiment of a distributed computing system 10 that includes a user device 12 and/or a user device 14, a distributed storage and/or task (DST) processing unit 16, a distributed storage and/or task network (DSTN) managing unit 18, a DST integrity processing unit 20, and a distributed storage and/or task network (DSTN) module 22. The components of the distributed computing system 10 are coupled via a network 24, which may include one or more wireless and/or wire lined communication systems; one or more private intranet systems and/or public internet systems; and/or one or more local area networks (LAN) and/or wide area networks (WAN).

The DSTN module 22 includes a plurality of distributed storage and/or task (DST) execution units 36 that may be located at geographically different sites (e.g., one in Chicago, one in Milwaukee, etc.). Each of the DST execution units is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voiceto-text conversion, etc.), multiple simple and/or complex functions, one or more algorithms, one or more applications, etc.

Each of the user devices 12-14, the DST processing unit 16, the DSTN managing unit 18, and the DST integrity processing unit 20 include a computing core 26 and may be a portable computing device and/or a fixed computing device. A portable computing device may be a social networking device, a gaming device, a cell phone, a smart phone, a personal digital assistant, a digital music player, a digital video player, a laptop computer, a handheld computer, a tablet, a video game controller, and/or any other portable device that includes a computing core. A fixed computing device may be a personal computer (PC), a computer server, a cable set-top box, a satellite receiver, a television set, a printer, a fax machine, home entertainment equipment, a video game console, and/or any type of home or office computing equipment. User device 12 and DST processing unit 16 are configured to include a DST client module 34.

With respect to interfaces, each interface 30, 32, and 33 includes software and/or hardware to support one or more communication links via the network 24 indirectly and/or directly. For example, interface 30 supports a communication link (e.g., wired, wireless, direct, via a LAN, via the network 24, etc.) between user device 14 and the DST processing unit 16. As another example, interface 32 supports communication links (e.g., a wired connection, a wireless connection, a LAN connection, and/or any other type of connection to/from the network 24) between user device 12 and the DSTN module 22 and between the DST processing unit 16 and the DSTN module 22. As yet another example, interface 33 supports a communication link for each of the DSTN managing unit 18 and DST integrity processing unit 20 to the network 24.

The distributed computing system 10 is operable to support dispersed storage (DS) error encoded data storage and retrieval, to support distributed task processing on received data, and/or to support distributed task processing on stored data. In general and with respect to DS error encoded data storage and retrieval, the distributed computing system 10 supports three primary operations: storage management, data storage and retrieval (an example of which will be discussed with reference to FIGS. 20-26), and data storage integrity verification. In accordance with these three primary functions, data can be encoded, distributedly stored in physically different locations, and subsequently retrieved in a reliable and secure manner. Such a system is tolerant of a significant number of failures (e.g., up to a failure level, which may be greater than or equal to a pillar width minus a decode threshold minus one) that may result from individual storage device failures and/or network equipment failures without loss of data and without the need for a redundant or backup copy. Further, the system allows the data to be stored for an indefinite period of time without data loss and does so in a secure manner (e.g., the system is very resistant to attempts at hacking the data).

The second primary function (i.e., distributed data storage and retrieval) begins and ends with a user device 12-14. For instance, if a second type of user device 14 has data 40 to store in the DSTN module 22, it sends the data 40 to the DST processing unit 16 via its interface 30. The interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data 40.

To support storage management, the DSTN managing unit 18 performs DS management services. One such DS management service includes the DSTN managing unit 18 establishing distributed data storage parameters (e.g., vault creation, distributed storage parameters, security parameters, billing information, user profile information, etc.) for a user device 12-14 individually or as part of a group of user devices. For example, the DSTN managing unit 18 coordinates creation of a vault (e.g., a virtual memory block) within memory of the DSTN module 22 for a user device, a group of devices, or for public access and establishes per vault dispersed storage (DS) error encoding parameters for a vault. The DSTN managing unit 18 may facilitate storage of DS error encoding parameters for each vault of a plurality of vaults by updating registry information for the distributed computing system 10. The facilitating includes storing updated registry information in one or more of the DSTN module 22, the user device 12, the DST processing unit 16, and the DST integrity processing unit 20.

The DS error encoding parameters (e.g., or dispersed storage error coding parameters) include data segmenting information (e.g., how many segments data (e.g., a file, a group of files, a data block, etc.) is divided into), segment security information (e.g., per segment encryption, compression, integrity checksum, etc.), error coding information (e.g., pillar width, decode threshold, read threshold, write threshold, etc.), slicing information (e.g., the number of encoded data slices that will be created for each data segment); and slice security information (e.g., per encoded data slice encryption, compression, integrity checksum, etc.).

The DSTN managing unit 18 creates and stores user profile information (e.g., an access control list (ACL)) in local memory and/or within memory of the DSTN module 22. The user profile information includes authentication information, permissions, and/or the security parameters. The security parameters may include encryption/decryption scheme, one or more encryption keys, key generation scheme, and/or data encoding/decoding scheme.

The DSTN managing unit 18 creates billing information for a particular user, a user group, a vault access, public vault access, etc. For instance, the DSTN managing unit 18 tracks the number of times a user accesses a private vault and/or public vaults, which can be used to generate a per-access billing information. In another instance, the DSTN managing unit 18 tracks the amount of data stored and/or retrieved by a user device and/or a user group, which can be used to generate a per-data-amount billing information.

Another DS management service includes the DSTN managing unit 18 performing network operations, network administration, and/or network maintenance. Network operations includes authenticating user data allocation requests (e.g., read and/or write requests), managing creation of vaults, establishing authentication credentials for user devices, adding/deleting components (e.g., user devices, DST execution units, and/or DST processing units) from the distributed computing system 10, and/or establishing authentication credentials for DST execution units 36. Network administration includes monitoring devices and/or units for failures, maintaining vault information, determining device and/or unit activation status, determining device and/or unit loading, and/or determining any other system level operation that affects the performance level of the system 10. Network maintenance includes facilitating replacing, upgrading, repairing, and/or expanding a device and/or unit of the system 10.

To support data storage integrity verification within the distributed computing system 10, the DST integrity processing unit 20 performs rebuilding of 'bad' or missing encoded data slices. At a high level, the DST integrity processing unit 20 performs rebuilding by periodically attempting to retrieve/list encoded data slices, and/or slice names of the encoded data slices, from the DSTN module 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in memory of the DSTN module 22. Note that the DST integrity processing unit 20 may be a separate unit as shown, it may be included in the DSTN module 22, it may be included in the DST processing unit 16, and/or distributed among the DST execution units 36.

To support distributed task processing on received data, the distributed computing system 10 has two primary operations: DST (distributed storage and/or task processing) management and DST execution on received data (an example of which will be discussed with reference to FIGS. 3-19). With respect to the storage portion of the DST management, the DSTN managing unit 18 functions as previously described. With respect to the tasking processing of the DST management, the DSTN managing unit 18 performs distributed task processing (DTP) management services. One such DTP management service includes the DSTN managing unit 18 establishing DTP parameters (e.g., user-vault affiliation information, billing information, user-task information, etc.) for a user device 12-14 individually or as part of a group of user devices.

Another DTP management service includes the DSTN managing unit 18 performing DTP network operations, network administration (which is essentially the same as described above), and/or network maintenance (which is essentially the same as described above). Network operations include, but are not limited to, authenticating user task processing requests (e.g., valid request, valid user, etc.), authenticating results and/or partial results, establishing DTP authentication credentials for user devices, adding/deleting components (e.g., user devices, DST execution units, and/or DST processing units) from the distributed computing system, and/or establishing DTP authentication credentials for DST execution units.

To support distributed task processing on stored data, the distributed computing system 10 has two primary operations: DST (distributed storage and/or task) management and DST execution on stored data. With respect to the DST execution on stored data, if the second type of user device 14 has a task request 38 for execution by the DSTN module 22, it sends the task request 38 to the DST processing unit 16 via its interface 30. An example of DST execution on stored data will be discussed in greater detail with reference to FIGS. 27-39. With respect to the DST management, it is substantially similar to the DST management to support distributed task processing on received data.

Figure 2:
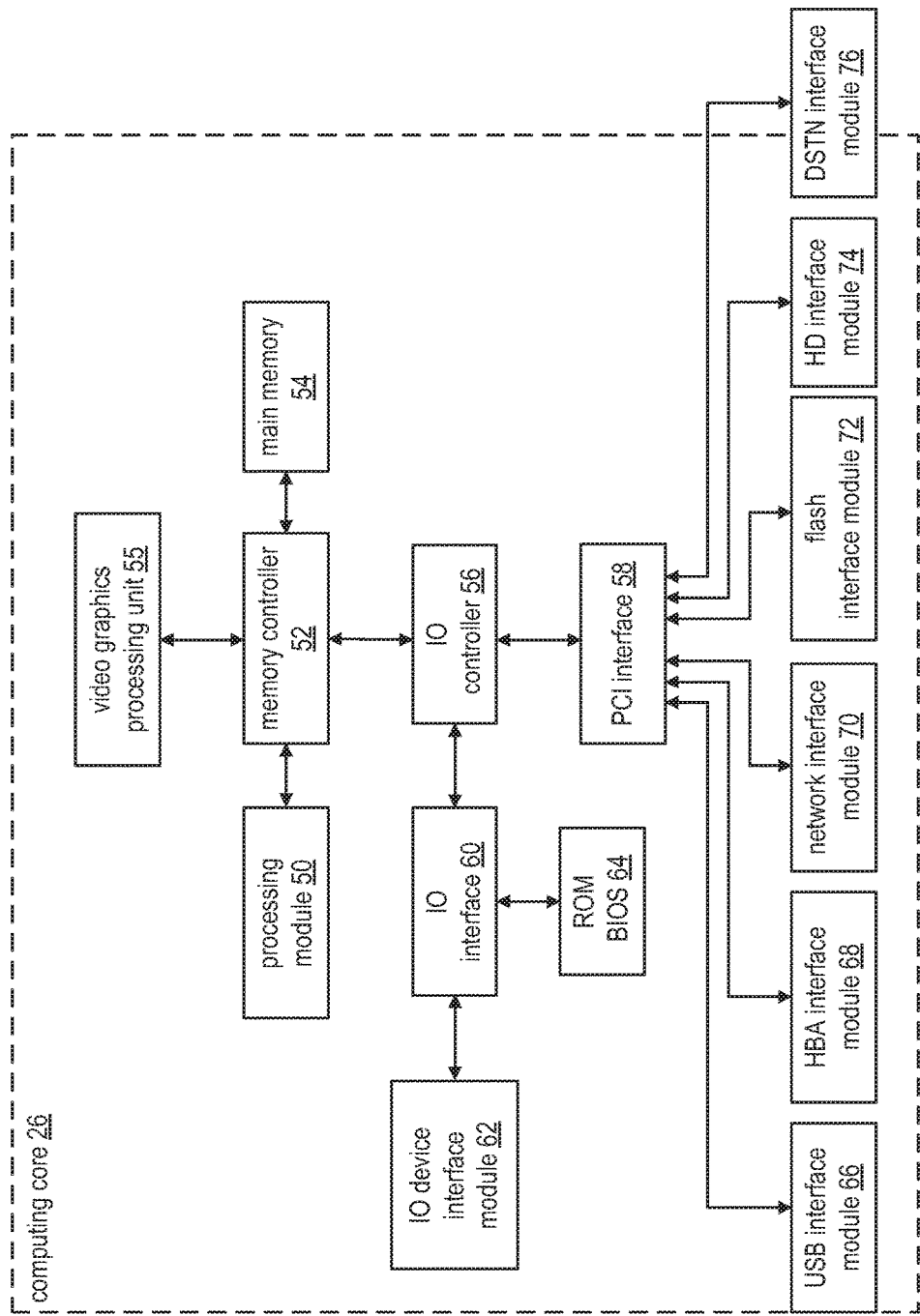
FIG. 2 is a schematic block diagram of an embodiment of a computing core in accordance with the present invention.

FIG. 2 is a schematic block diagram of an embodiment of a computing core 26 that includes a processing module 50, a memory controller 52, main memory 54, a video graphics processing unit 55, an input/output (TO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSTN interface module 76.

The DSTN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSTN interface module 76 and/or the network interface module 70 may function as the interface 30 of the user device 14 of FIG. 1. Further note that the 10 device interface module 62 and/or the memory interface modules may be collectively or individually referred to as 10 ports.

Figure 3:
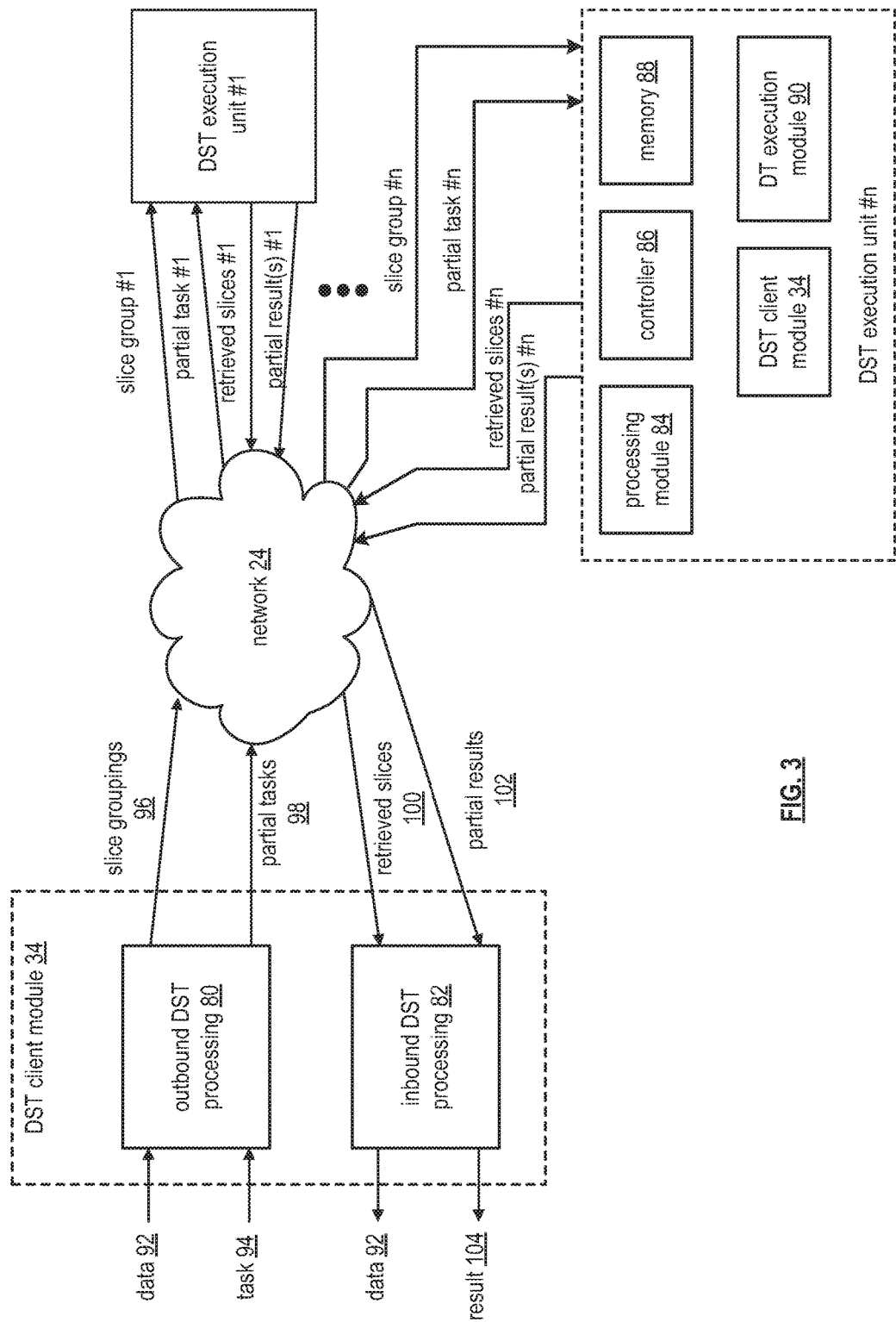
FIG. 3 is a diagram of an example of a distributed storage and task processing in accordance with the present invention.

FIG. 3 is a diagram of an example of the distributed computing system performing a distributed storage and task processing operation. The distributed computing system includes a DST (distributed storage and/or task) client module 34 (which may be in user device 14 and/or in DST processing unit 16 of FIG. 1), a network 24, a plurality of DST execution units 1-n that includes two or more DST execution units 36 of FIG. 1 (which form at least a portion of DSTN module 22 of FIG. 1), a DST managing module (not shown), and a DST integrity verification module (not shown). The DST client module 34 includes an outbound DST processing section 80 and an inbound DST processing section 82. Each of the DST execution units 1-n includes a controller 86, a processing module 84, memory 88, a DT (distributed task) execution module 90, and a DST client module 34.

In an example of operation, the DST client module 34 receives data 92 and one or more tasks 94 to be performed upon the data 92. The data 92 may be of any size and of any content, where, due to the size (e.g., greater than a few Terabytes), the content (e.g., secure data, etc.), and/or task(s) (e.g., MIPS intensive), distributed processing of the task(s) on the data is desired. For example, the data 92 may be one or more digital books, a copy of a company's emails, a large-scale Internet search, a video security file, one or more entertainment video files (e.g., television programs, movies, etc.), data files, and/or any other large amount of data (e.g., greater than a few Terabytes).

Within the DST client module 34, the outbound DST processing section 80 receives the data 92 and the task(s) 94. The outbound DST processing section 80 processes the data 92 to produce slice groupings 96. As an example of such processing, the outbound DST processing section 80 partitions the data 92 into a plurality of data partitions. For each data partition, the outbound DST processing section 80 dispersed storage (DS) error encodes the data partition to produce encoded data slices and groups the encoded data slices into a slice grouping 96. In addition, the outbound DST processing section 80 partitions the task 94 into partial tasks 98, where the number of partial tasks 98 may correspond to the number of slice groupings 96.

The outbound DST processing section 80 then sends, via the network 24, the slice groupings 96 and the partial tasks 98 to the DST execution units 1-n of the DSTN module 22 of FIG. 1. For example, the outbound DST processing section 80 sends slice group 1 and partial task 1 to DST execution unit 1. As another example, the outbound DST processing section 80 sends slice group #n and partial task #n to DST execution unit #n.

Each DST execution unit performs its partial task 98 upon its slice group 96 to produce partial results 102. For example, DST execution unit #1 performs partial task #1 on slice group #1 to produce a partial result #1, for results. As a more specific example, slice group #1 corresponds to a data partition of a series of digital books and the partial task #1 corresponds to searching for specific phrases, recording where the phrase is found, and establishing a phrase count. In this more specific example, the partial result #1 includes information as to where the phrase was found and includes the phrase count.

Upon completion of generating their respective partial results 102, the DST execution units send, via the network 24, their partial results 102 to the inbound DST processing section 82 of the DST client module 34. The inbound DST processing section 82 processes the received partial results 102 to produce a result 104. Continuing with the specific example of the preceding paragraph, the inbound DST processing section 82 combines the phrase count from each of the DST execution units 36 to produce a total phrase count. In addition, the inbound DST processing section 82 combines the 'where the phrase was found' information from each of the DST execution units 36 within their respective data partitions to produce 'where the phrase was found' information for the series of digital books.

In another example of operation, the DST client module 34 requests retrieval of stored data within the memory of the DST execution units 36 (e.g., memory of the DSTN module). In this example, the task 94 is retrieve data stored in the memory of the DSTN module. Accordingly, the outbound DST processing section 80 converts the task 94 into a plurality of partial tasks 98 and sends the partial tasks 98 to the respective DST execution units 1-n.

In response to the partial task 98 of retrieving stored data, a DST execution unit 36 identifies the corresponding encoded data slices 100 and retrieves them. For example, DST execution unit #1 receives partial task #1 and retrieves, in response thereto, retrieved slices #1. The DST execution units 36 send their respective retrieved slices 100 to the inbound DST processing section 82 via the network 24.

The inbound DST processing section 82 converts the retrieved slices 100 into data 92. For example, the inbound DST processing section 82 de-groups the retrieved slices 100 to produce encoded slices per data partition. The inbound DST processing section 82 then DS error decodes the encoded slices per data partition to produce data partitions. The inbound DST processing section 82 de-partitions the data partitions to recapture the data 92.

Figure 4:
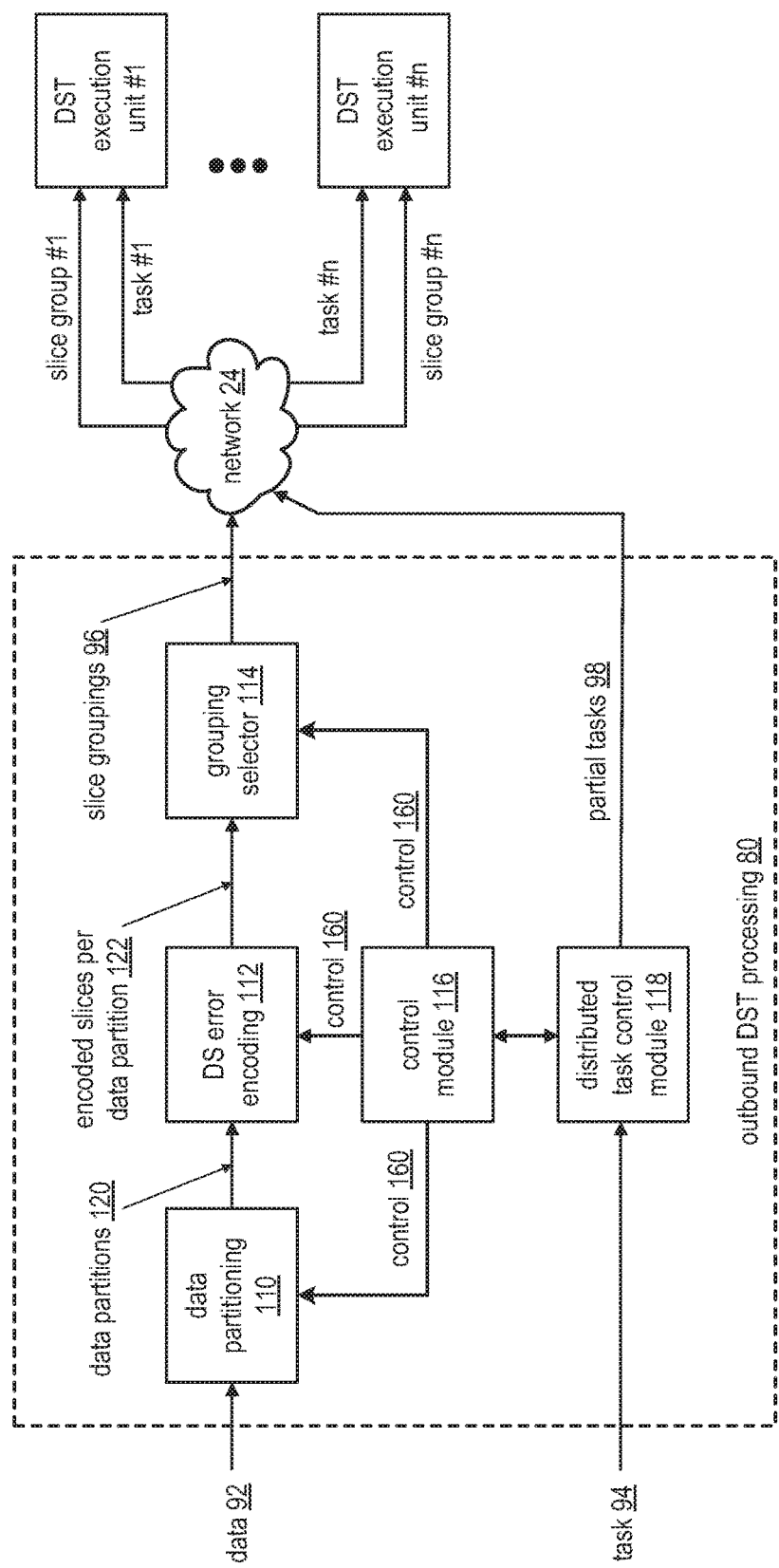
FIG. 4 is a schematic block diagram of an embodiment of an outbound distributed storage and/or task (DST) processing in accordance with the present invention.

FIG. 4 is a schematic block diagram of an embodiment of an outbound distributed storage and/or task (DST) processing section 80 of a DST client module 34 FIG. 1 coupled to a DSTN module 22 of a FIG. 1 (e.g., a plurality of n DST execution units 36) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 partitions data 92 into a plurality of data partitions 120. The number of partitions and the size of the partitions may be selected by the control module 116 via control 160 based on the data 92 (e.g., its size, its content, etc.), a corresponding task 94 to be performed (e.g., simple, complex, single step, multiple steps, etc.), DS encoding parameters (e.g., pillar width, decode threshold, write threshold, segment security parameters, slice security parameters, etc.), capabilities of the DST execution units 36 (e.g., processing resources, availability of processing recourses, etc.), and/or as may be inputted by a user, system administrator, or other operator (human or automated). For example, the data partitioning module 110 partitions the data 92 (e.g., 100 Terabytes) into 100,000 data segments, each being 1 Gigabyte in size. Alternatively, the data partitioning module 110 partitions the data 92 into a plurality of data segments, where some of data segments are of a different size, are of the same size, or a combination thereof.

The DS error encoding module 112 receives the data partitions 120 in a serial manner, a parallel manner, and/or a combination thereof. For each data partition 120, the DS error encoding module 112 DS error encodes the data partition 120 in accordance with control information 160 from the control module 116 to produce encoded data slices 122. The DS error encoding includes segmenting the data partition into data segments, segment security processing (e.g., encryption, compression, watermarking, integrity check (e.g., CRC), etc.), error encoding, slicing, and/or per slice security processing (e.g., encryption, compression, watermarking, integrity check (e.g., CRC), etc.). The control information 160 indicates which steps of the DS error encoding are active for a given data partition and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 122 of a data partition into a set of slice groupings 96. The number of slice groupings corresponds to the number of DST execution units 36 identified for a particular task 94. For example, if five DST execution units 36 are identified for the particular task 94, the grouping selector module groups the encoded slices 122 of a data partition into five slice groupings 96. The grouping selector module 114 outputs the slice groupings 96 to the corresponding DST execution units 36 via the network 24.

The distributed task control module 118 receives the task 94 and converts the task 94 into a set of partial tasks 98. For example, the distributed task control module 118 receives a task to find where in the data (e.g., a series of books) a phrase occurs and a total count of the phrase usage in the data. In this example, the distributed task control module 118 replicates the task 94 for each DST execution unit 36 to produce the partial tasks 98. In another example, the distributed task control module 118 receives a task to find where in the data a first phrase occurs, where in the data a second phrase occurs, and a total count for each phrase usage in the data. In this example, the distributed task control module 118 generates a first set of partial tasks 98 for finding and counting the first phrase and a second set of partial tasks for finding and counting the second phrase. The distributed task control module 118 sends respective first and/or second partial tasks 98 to each DST execution unit 36.

Figure 5:
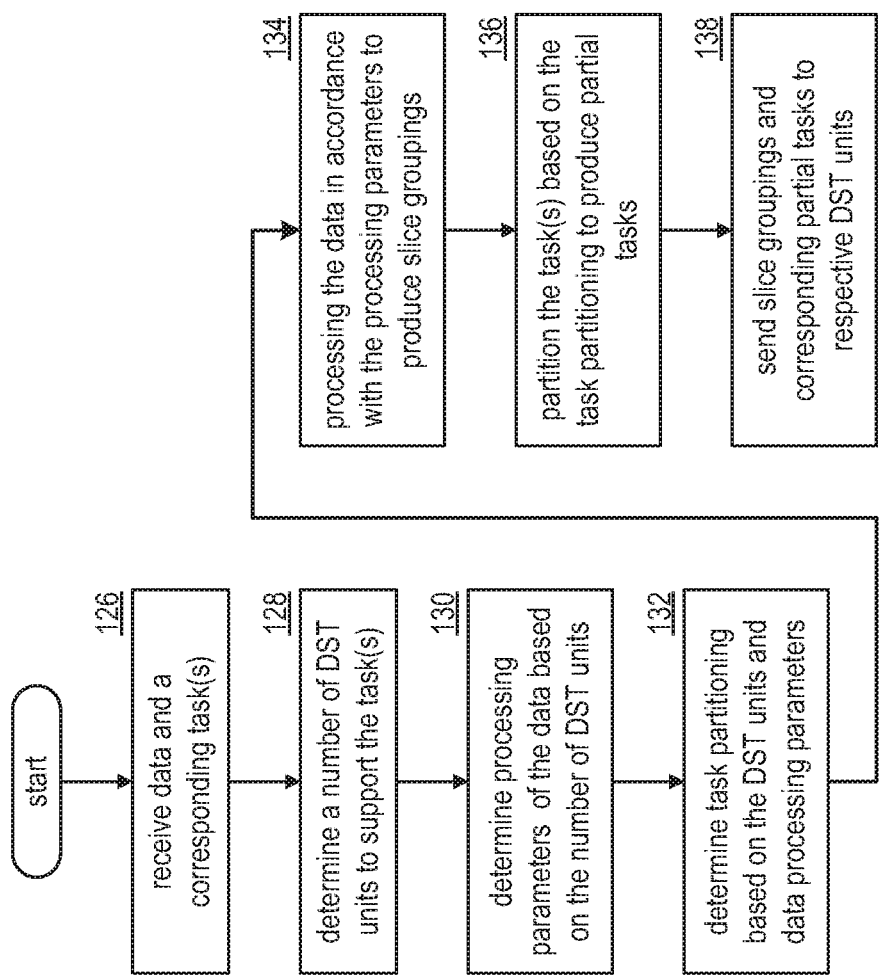
FIG. 5 is a logic diagram of an example of a method for outbound DST processing in accordance with the present invention.

FIG. 5 is a logic diagram of an example of a method for outbound distributed storage and task (DST) processing that begins at step 126 where a DST client module receives data and one or more corresponding tasks. The method continues at step 128 where the DST client module determines a number of DST units to support the task for one or more data partitions. For example, the DST client module may determine the number of DST units to support the task based on the size of the data, the requested task, the content of the data, a predetermined number (e.g., user indicated, system administrator determined, etc.), available DST units, capability of the DST units, and/or any other factor regarding distributed task processing of the data. The DST client module may select the same DST units for each data partition, may select different DST units for the data partitions, or a combination thereof.

The method continues at step 130 where the DST client module determines processing parameters of the data based on the number of DST units selected for distributed task processing. The processing parameters include data partitioning information, DS encoding parameters, and/or slice grouping information. The data partitioning information includes a number of data partitions, size of each data partition, and/or organization of the data partitions (e.g., number of data blocks in a partition, the size of the data blocks, and arrangement of the data blocks). The DS encoding parameters include segmenting information, segment security information, error encoding information (e.g., dispersed storage error encoding function parameters including one or more of pillar width, decode threshold, write threshold, read threshold, generator matrix), slicing information, and/or per slice security information. The slice grouping information includes information regarding how to arrange the encoded data slices into groups for the selected DST units. As a specific example, if the DST client module determines that five DST units are needed to support the task, then it determines that the error encoding parameters include a pillar width of five and a decode threshold of three.

The method continues at step 132 where the DST client module determines task partitioning information (e.g., how to partition the tasks) based on the selected DST units and data processing parameters. The data processing parameters include the processing parameters and DST unit capability information. The DST unit capability information includes the number of DT (distributed task) execution units, execution capabilities of each DT execution unit (e.g., MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.)), and/or any information germane to executing one or more tasks.

The method continues at step 134 where the DST client module processes the data in accordance with the processing parameters to produce slice groupings. The method continues at step 136 where the DST client module partitions the task based on the task partitioning information to produce a set of partial tasks. The method continues at step 138 where the DST client module sends the slice groupings and the corresponding partial tasks to respective DST units.

Figure 6:
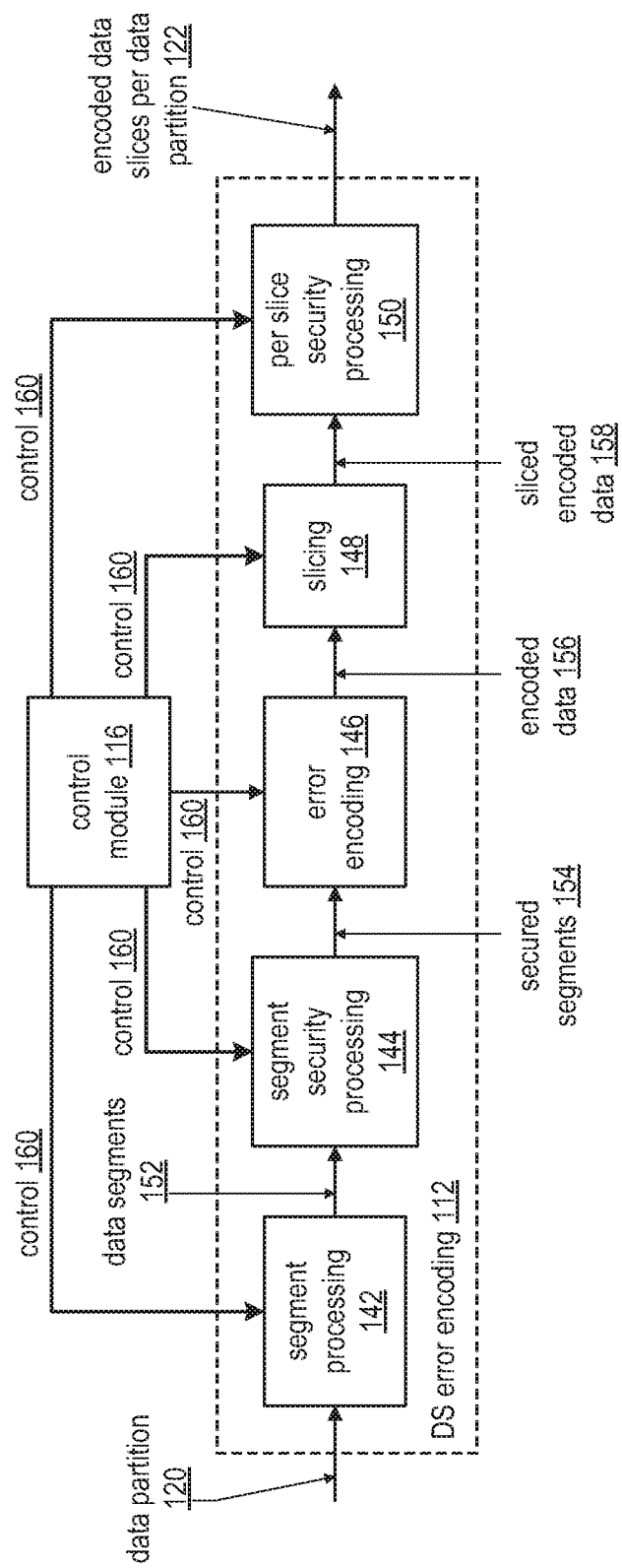
FIG. 6 is a schematic block diagram of an embodiment of a dispersed error encoding in accordance with the present invention.

FIG. 6 is a schematic block diagram of an embodiment of the dispersed storage (DS) error encoding module 112 of an outbound distributed storage and task (DST) processing section. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives a data partition 120 from a data partitioning module and receives segmenting information as the control information 160 from the control module 116. The segmenting information indicates how the segment processing module 142 is to segment the data partition 120. For example, the segmenting information indicates how many rows to segment the data based on a decode threshold of an error encoding scheme, indicates how many columns to segment the data into based on a number and size of data blocks within the data partition 120, and indicates how many columns to include in a data segment 152. The segment processing module 142 segments the data 120 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., cyclic redundancy check (CRC), etc.), and/or any other type of digital security. For example, when the segment security processing module 144 is enabled, it may compress a data segment 152, encrypt the compressed data segment, and generate a CRC value for the encrypted data segment to produce a secure data segment 154. When the segment security processing module 144 is not enabled, it passes the data segments 152 to the error encoding module 146 or is bypassed such that the data segments 152 are provided to the error encoding module 146.

The error encoding module 146 encodes the secure data segments 154 in accordance with error correction encoding parameters received as control information 160 from the control module 116. The error correction encoding parameters (e.g., also referred to as dispersed storage error coding parameters) include identifying an error correction encoding scheme (e.g., forward error correction algorithm, a Reed-Solomon based algorithm, an online coding algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment 154 to produce an encoded data segment 156.

The slicing module 148 slices the encoded data segment 156 in accordance with the pillar width of the error correction encoding parameters received as control information 160. For example, if the pillar width is five, the slicing module 148 slices an encoded data segment 156 into a set of five encoded data slices. As such, for a plurality of encoded data segments 156 for a given data partition, the slicing module outputs a plurality of sets of encoded data slices 158.

The per slice security processing module 150, when enabled by the control module 116, secures each encoded data slice 158 based on slice security information received as control information 160 from the control module 116. The slice security information includes data compression, encryption, watermarking, integrity check (e.g., CRC, etc.), and/or any other type of digital security. For example, when the per slice security processing module 150 is enabled, it compresses an encoded data slice 158, encrypts the compressed encoded data slice, and generates a CRC value for the encrypted encoded data slice to produce a secure encoded data slice 122. When the per slice security processing module 150 is not enabled, it passes the encoded data slices 158 or is bypassed such that the encoded data slices 158 are the output of the DS error encoding module 112. Note that the control module 116 may be omitted and each module stores its own parameters.

Figure 7:
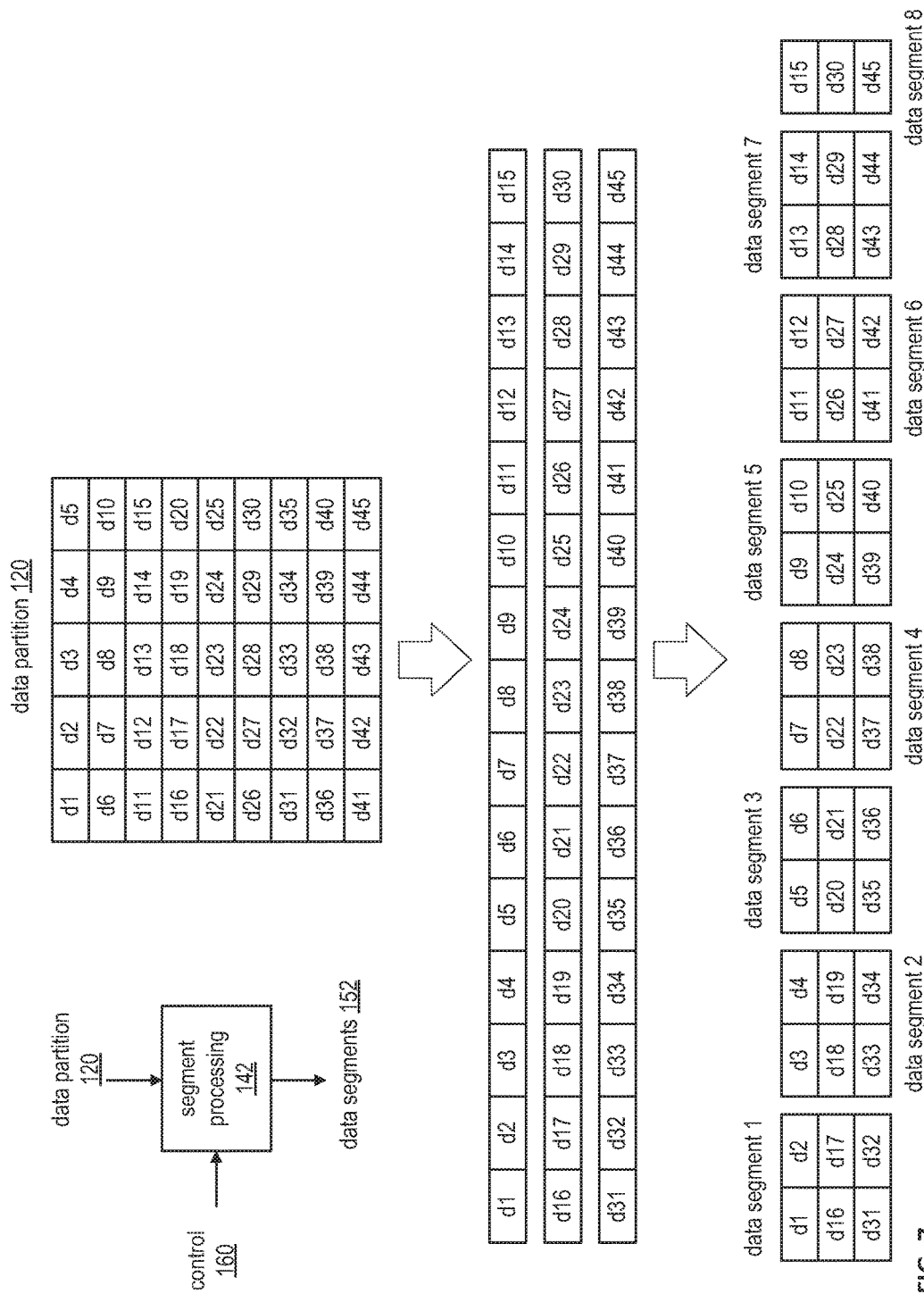
FIG. 7 is a diagram of an example of a segment processing of the dispersed error encoding in accordance with the present invention.

FIG. 7 is a diagram of an example of a segment processing of a dispersed storage (DS) error encoding module. In this example, a segment processing module 142 receives a data partition 120 that includes 45 data blocks (e.g., d1-d45), receives segmenting information (i.e., control information 160) from a control module, and segments the data partition 120 in accordance with the control information 160 to produce data segments 152. Each data block may be of the same size as other data blocks or of a different size. In addition, the size of each data block may be a few bytes to megabytes of data. As previously mentioned, the segmenting information indicates how many rows to segment the data partition into, indicates how many columns to segment the data partition into, and indicates how many columns to include in a data segment.

In this example, the decode threshold of the error encoding scheme is three; as such the number of rows to divide the data partition into is three. The number of columns for each row is set to 15, which is based on the number and size of data blocks. The data blocks of the data partition are arranged in rows and columns in a sequential order (i.e., the first row includes the first 15 data blocks; the second row includes the second 15 data blocks; and the third row includes the last 15 data blocks).

With the data blocks arranged into the desired sequential order, they are divided into data segments based on the segmenting information. In this example, the data partition is divided into 8 data segments; the first 7 include 2 columns of three rows and the last includes 1 column of three rows. Note that the first row of the 8 data segments is in sequential order of the first 15 data blocks; the second row of the 8 data segments in sequential order of the second 15 data blocks; and the third row of the 8 data segments in sequential order of the last 15 data blocks. Note that the number of data blocks, the grouping of the data blocks into segments, and size of the data blocks may vary to accommodate the desired distributed task processing function.

Figure 8:
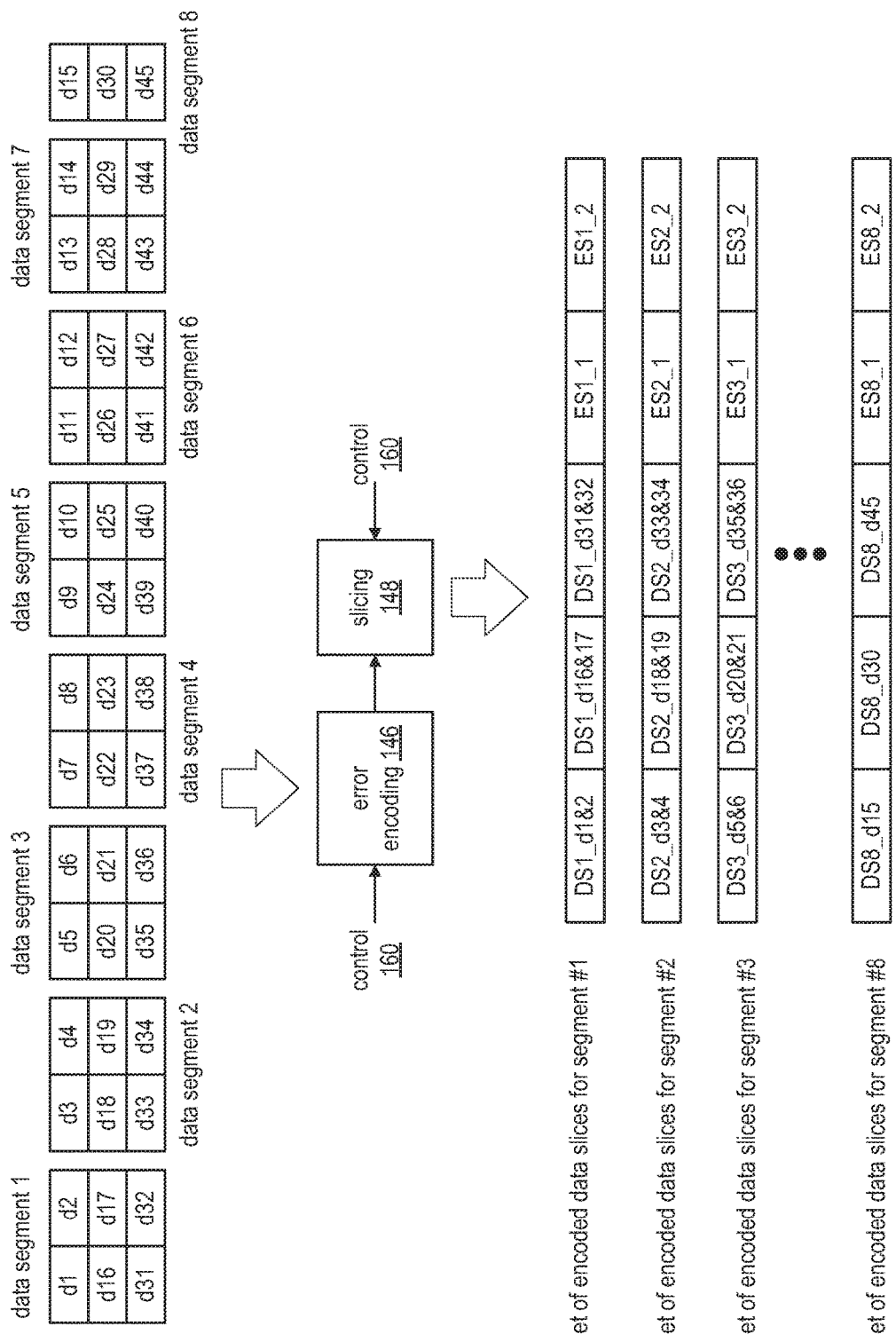
FIG. 8 is a diagram of an example of error encoding and slicing processing of the dispersed error encoding in accordance with the present invention.

FIG. 8 is a diagram of an example of error encoding and slicing processing of the dispersed error encoding processing the data segments of FIG. 7. In this example, data segment 1 includes 3 rows with each row being treated as one word for encoding. As such, data segment 1 includes three words for encoding: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

In operation, an error encoding module 146 and a slicing module 148 convert each data segment into a set of encoded data slices in accordance with error correction encoding parameters as control information 160. More specifically, when the error correction encoding parameters indicate a unity matrix Reed-Solomon based encoding algorithm, 5 pillars, and decode threshold of 3, the first three encoded data slices of the set of encoded data slices for a data segment are substantially similar to the corresponding word of the data segment. For instance, when the unity matrix Reed-Solomon based encoding algorithm is applied to data segment 1, the content of the first encoded data slice (DS1_d1&2) of the first set of encoded data slices (e.g., corresponding to data segment 1) is substantially similar to content of the first word (e.g., d1 & d2); the content of the second encoded data slice (DS1_d16&17) of the first set of encoded data slices is substantially similar to content of the second word (e.g., d16 & d17); and the content of the third encoded data slice (DS1_d31&32) of the first set of encoded data slices is substantially similar to content of the third word (e.g., d31 & d32).

The content of the fourth and fifth encoded data slices (e.g., ES1_1 and ES1_2) of the first set of encoded data slices include error correction data based on the first-third words of the first data segment. With such an encoding and slicing scheme, retrieving any three of the five encoded data slices allows the data segment to be accurately reconstructed.

The encoding and slicing of data segments 2-7 yield sets of encoded data slices similar to the set of encoded data slices of data segment 1. For instance, the content of the first encoded data slice (DS2_d3&4) of the second set of encoded data slices (e.g., corresponding to data segment 2) is substantially similar to content of the first word (e.g., d3 & d4); the content of the second encoded data slice (DS2_d18&19) of the second set of encoded data slices is substantially similar to content of the second word (e.g., d18 & d19); and the content of the third encoded data slice (DS2_d33&34) of the second set of encoded data slices is substantially similar to content of the third word (e.g., d33 & d34). The content of the fourth and fifth encoded data slices (e.g., ES1_1 and ES1_2) of the second set of encoded data slices includes error correction data based on the first-third words of the second data segment.

Figure 9:
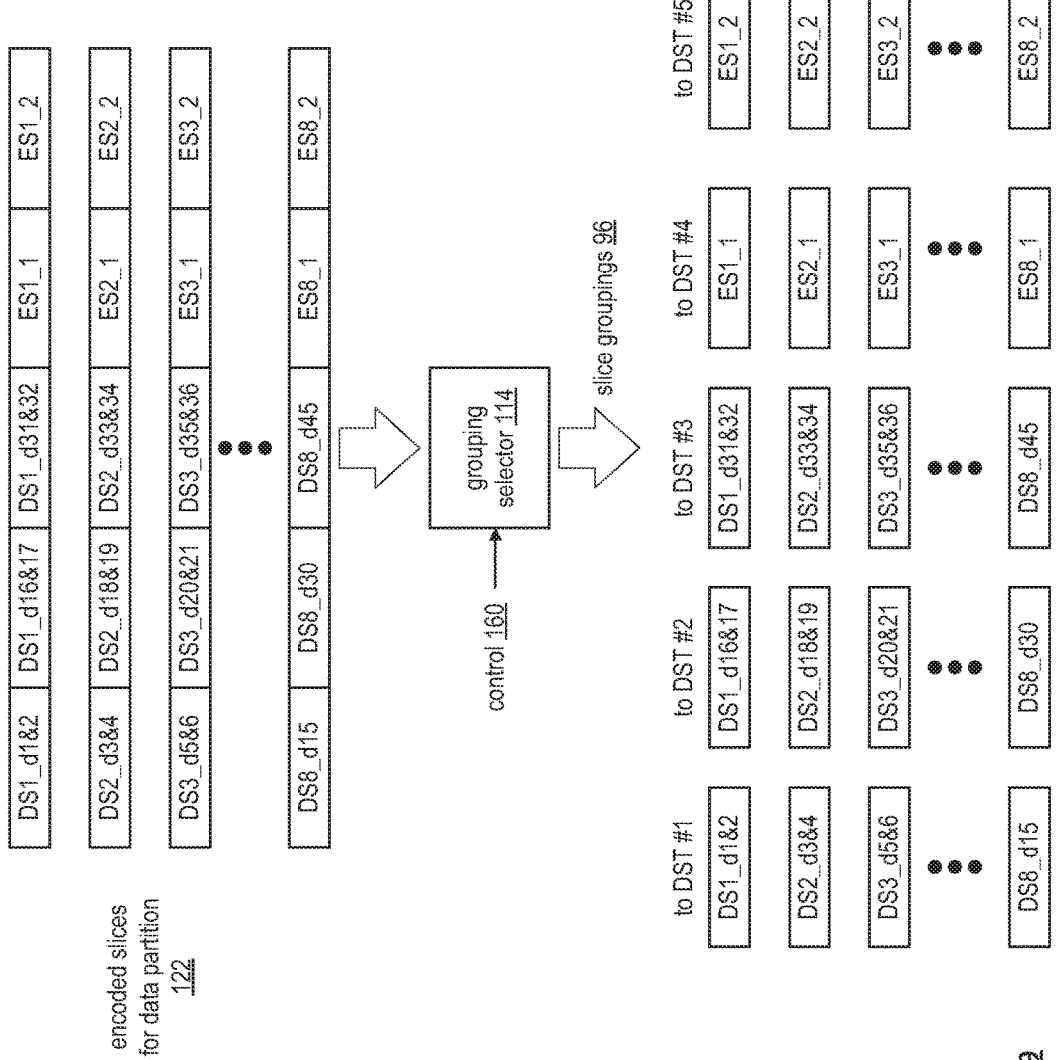
FIG. 9 is a diagram of an example of grouping selection processing of the outbound DST processing in accordance with the present invention.

FIG. 9 is a diagram of an example of grouping selection processing of an outbound distributed storage and task (DST) processing in accordance with grouping selector information as control information 160 from a control module. Encoded slices for data partition 122 are grouped in accordance with the control information 160 to produce slice groupings 96. In this example, a grouping selector module 114 organizes the encoded data slices into five slice groupings (e.g., one for each DST execution unit of a distributed storage and task network (DSTN) module). As a specific example, the grouping selector module 114 creates a first slice grouping for a DST execution unit #1, which includes first encoded slices of each of the sets of encoded slices. As such, the first DST execution unit receives encoded data slices corresponding to data blocks 1-15 (e.g., encoded data slices of contiguous data).

The grouping selector module 114 also creates a second slice grouping for a DST execution unit #2, which includes second encoded slices of each of the sets of encoded slices. As such, the second DST execution unit receives encoded data slices corresponding to data blocks 16-30. The grouping selector module 114 further creates a third slice grouping for DST execution unit #3, which includes third encoded slices of each of the sets of encoded slices. As such, the third DST execution unit receives encoded data slices corresponding to data blocks 31-45.

The grouping selector module 114 creates a fourth slice grouping for DST execution unit #4, which includes fourth encoded slices of each of the sets of encoded slices. As such, the fourth DST execution unit receives encoded data slices corresponding to first error encoding information (e.g., encoded data slices of error coding (EC) data). The grouping selector module 114 further creates a fifth slice grouping for DST execution unit #5, which includes fifth encoded slices of each of the sets of encoded slices. As such, the fifth DST execution unit receives encoded data slices corresponding to second error encoding information.

Figure 10:
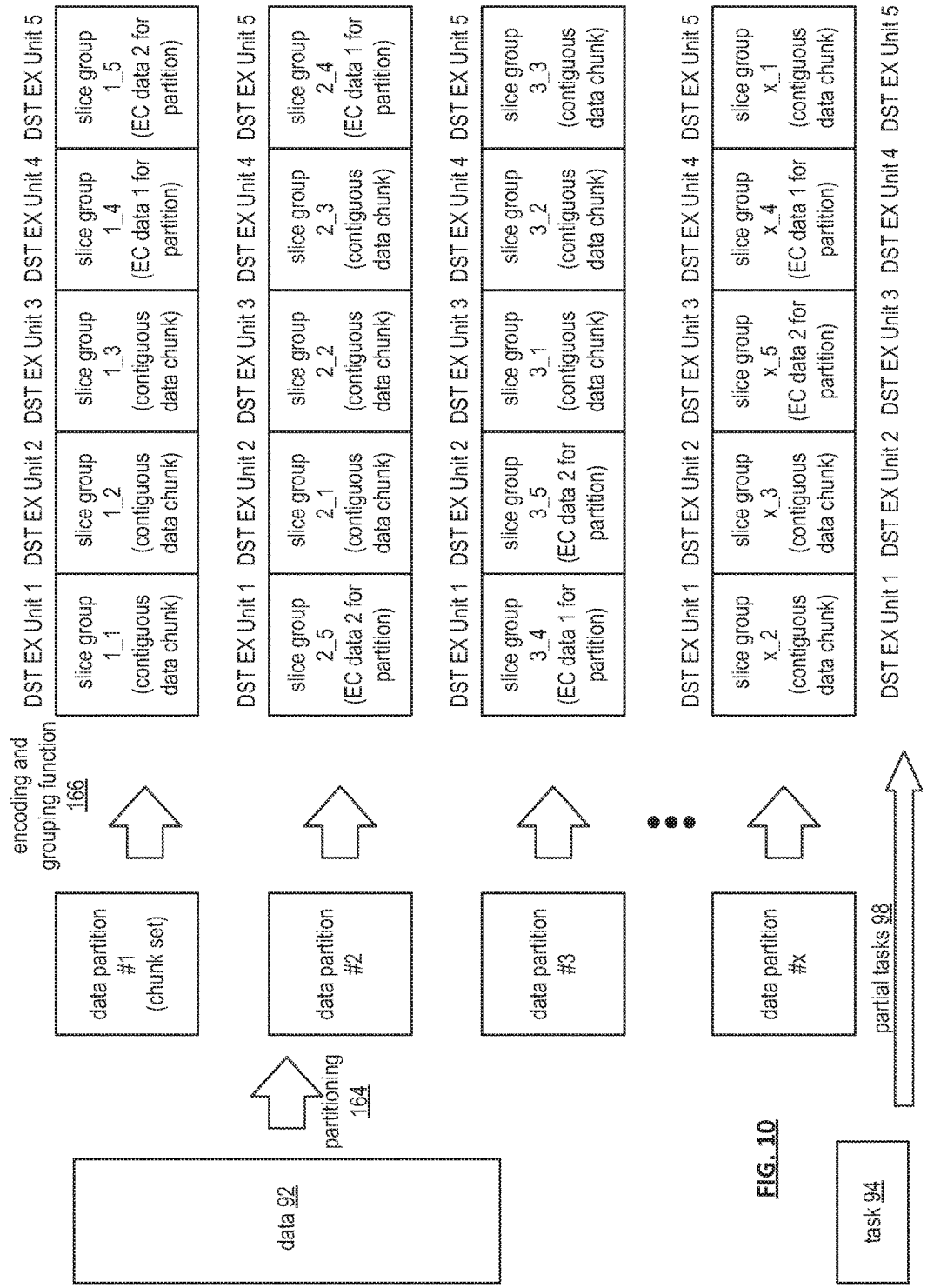
FIG. 10 is a diagram of an example of converting data into slice groups in accordance with the present invention.

FIG. 10 is a diagram of an example of converting data 92 into slice groups that expands on the preceding figures. As shown, the data 92 is partitioned in accordance with a partitioning function 164 into a plurality of data partitions (1-x, where x is an integer greater than 4). Each data partition (or chunkset of data) is encoded and grouped into slice groupings as previously discussed by an encoding and grouping function 166. For a given data partition, the slice groupings are sent to distributed storage and task (DST) execution units. From data partition to data partition, the ordering of the slice groupings to the DST execution units may vary.

For example, the slice groupings of data partition #1 is sent to the DST execution units such that the first DST execution receives first encoded data slices of each of the sets of encoded data slices, which corresponds to a first continuous data chunk of the first data partition (e.g., refer to FIG. 9), a second DST execution receives second encoded data slices of each of the sets of encoded data slices, which corresponds to a second continuous data chunk of the first data partition, etc.

For the second data partition, the slice groupings may be sent to the DST execution units in a different order than it was done for the first data partition. For instance, the first slice grouping of the second data partition (e.g., slice group 2_1) is sent to the second DST execution unit; the second slice grouping of the second data partition (e.g., slice group 2_2) is sent to the third DST execution unit; the third slice grouping of the second data partition (e.g., slice group 2_3) is sent to the fourth DST execution unit; the fourth slice grouping of the second data partition (e.g., slice group 2_4, which includes first error coding information) is sent to the fifth DST execution unit; and the fifth slice grouping of the second data partition (e.g., slice group 2_5, which includes second error coding information) is sent to the first DST execution unit.

The pattern of sending the slice groupings to the set of DST execution units may vary in a predicted pattern, a random pattern, and/or a combination thereof from data partition to data partition. In addition, from data partition to data partition, the set of DST execution units may change. For example, for the first data partition, DST execution units 1-5 may be used; for the second data partition, DST execution units 6-10 may be used; for the third data partition, DST execution units 3-7 may be used; etc. As is also shown, the task is divided into partial tasks that are sent to the DST execution units in conjunction with the slice groupings of the data partitions.

Figure 11:
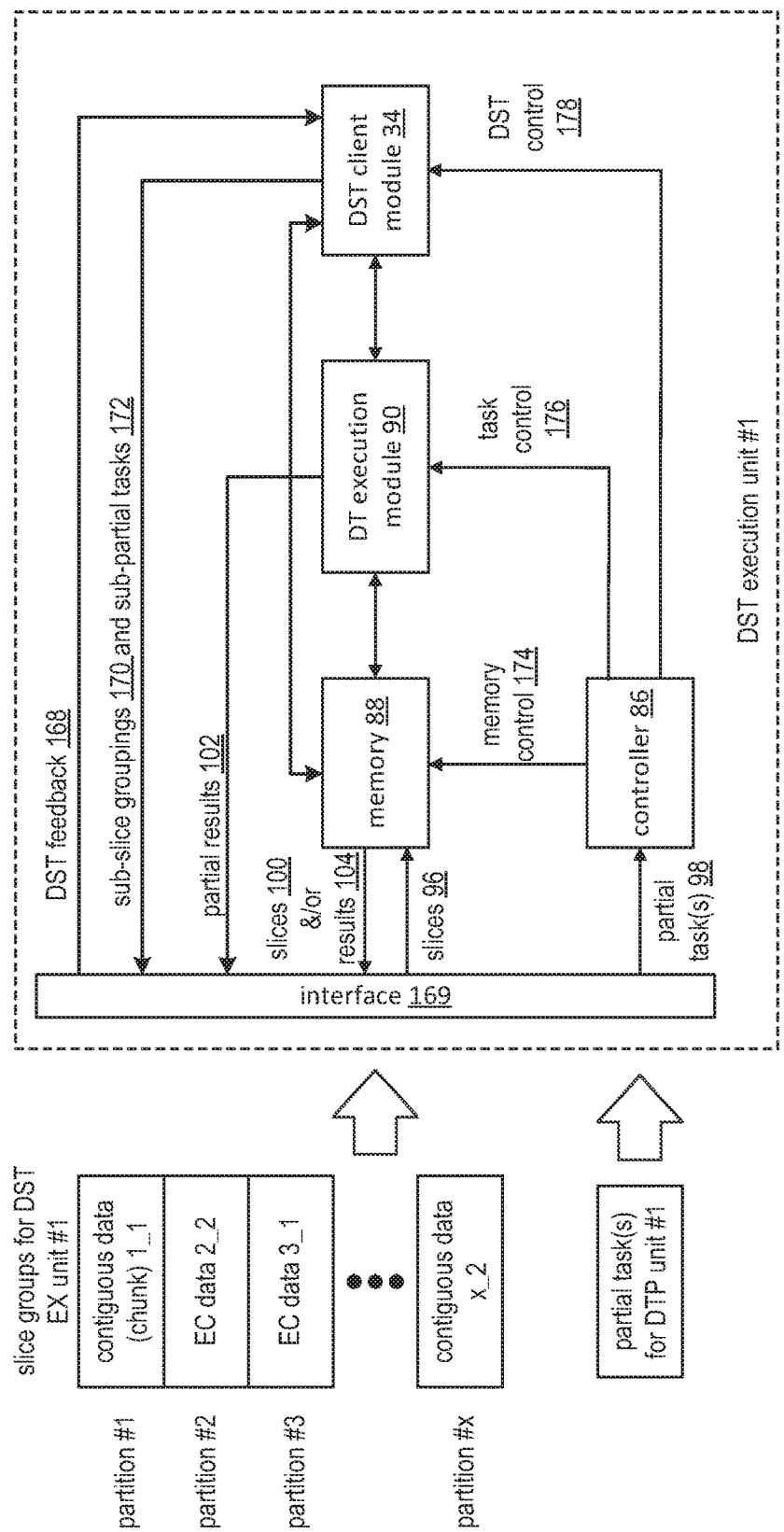
FIG. 11 is a schematic block diagram of an embodiment of a DST execution unit in accordance with the present invention.

FIG. 11 is a schematic block diagram of an embodiment of a DST (distributed storage and/or task) execution unit that includes an interface 169, a controller 86, memory 88, one or more DT (distributed task) execution modules 90, and a DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a slice group, the DST execution module receives a slice grouping 96 (e.g., slice group #1) via interface 169. The slice grouping 96 includes, per partition, encoded data slices of contiguous data or encoded data slices of error coding (EC) data. For slice group #1, the DST execution module receives encoded data slices of contiguous data for partitions #1 and #x (and potentially others between 3 and x) and receives encoded data slices of EC data for partitions #2 and #3 (and potentially others between 3 and x). Examples of encoded data slices of contiguous data and encoded data slices of error coding (EC) data are discussed with reference to FIG. 9. The memory 88 stores the encoded data slices of slice groupings 96 in accordance with memory control information 174 it receives from the controller 86.

The controller 86 (e.g., a processing module, a CPU, etc.) generates the memory control information 174 based on a partial task(s) 98 and distributed computing information (e.g., user information (e.g., user ID, distributed computing permissions, data access permission, etc.), vault information (e.g., virtual memory assigned to user, user group, temporary storage for task processing, etc.), task validation information, etc.). For example, the controller 86 interprets the partial task(s) 98 in light of the distributed computing information to determine whether a requestor is authorized to perform the task 98, is authorized to access the data, and/or is authorized to perform the task on this particular data. When the requestor is authorized, the controller 86 determines, based on the task 98 and/or another input, whether the encoded data slices of the slice grouping 96 are to be temporarily stored or permanently stored. Based on the foregoing, the controller 86 generates the memory control information 174 to write the encoded data slices of the slice grouping 96 into the memory 88 and to indicate whether the slice grouping 96 is permanently stored or temporarily stored.

With the slice grouping 96 stored in the memory 88, the controller 86 facilitates execution of the partial task(s) 98. In an example, the controller 86 interprets the partial task 98 in light of the capabilities of the DT execution module(s) 90. The capabilities include one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, etc. If the controller 86 determines that the DT execution module(s) 90 have sufficient capabilities, it generates task control information 176.

The task control information 176 may be a generic instruction (e.g., perform the task on the stored slice grouping) or a series of operational codes. In the former instance, the DT execution module 90 includes a co-processor function specifically configured (fixed or programmed) to perform the desired task 98. In the latter instance, the DT execution module 90 includes a general processor topology where the controller stores an algorithm corresponding to the particular task 98. In this instance, the controller 86 provides the operational codes (e.g., assembly language, source code of a programming language, object code, etc.) of the algorithm to the DT execution module 90 for execution.

Depending on the nature of the task 98, the DT execution module 90 may generate intermediate partial results 102 that are stored in the memory 88 or in a cache memory (not shown) within the DT execution module 90. In either case, when the DT execution module 90 completes execution of the partial task 98, it outputs one or more partial results 102. The partial results 102 may also be stored in memory 88.

If, when the controller 86 is interpreting whether capabilities of the DT execution module(s) 90 can support the partial task 98, the controller 86 determines that the DT execution module(s) 90 cannot adequately support the task 98 (e.g., does not have the right resources, does not have sufficient available resources, available resources would be too slow, etc.), it then determines whether the partial task 98 should be fully offloaded or partially offloaded.

If the controller 86 determines that the partial task 98 should be fully offloaded, it generates DST control information 178 and provides it to the DST client module 34. The DST control information 178 includes the partial task 98, memory storage information regarding the slice grouping 96, and distribution instructions. The distribution instructions instruct the DST client module 34 to divide the partial task 98 into sub-partial tasks 172, to divide the slice grouping 96 into sub-slice groupings 170, and identify other DST execution units. The DST client module 34 functions in a similar manner as the DST client module 34 of FIGS. 3-10 to produce the sub-partial tasks 172 and the sub-slice groupings 170 in accordance with the distribution instructions.

The DST client module 34 receives DST feedback 168 (e.g., sub-partial results), via the interface 169, from the DST execution units to which the task was offloaded. The DST client module 34 provides the sub-partial results to the DST execution unit, which processes the sub-partial results to produce the partial result(s) 102.

If the controller 86 determines that the partial task 98 should be partially offloaded, it determines what portion of the task 98 and/or slice grouping 96 should be processed locally and what should be offloaded. For the portion that is being locally processed, the controller 86 generates task control information 176 as previously discussed. For the portion that is being offloaded, the controller 86 generates DST control information 178 as previously discussed.

When the DST client module 34 receives DST feedback 168 (e.g., sub-partial results) from the DST executions units to which a portion of the task was offloaded, it provides the sub-partial results to the DT execution module 90. The DT execution module 90 processes the sub-partial results with the sub-partial results it created to produce the partial result(s) 102.

The memory 88 may be further utilized to retrieve one or more of stored slices 100, stored results 104, partial results 102 when the DT execution module 90 stores partial results 102 and/or results 104 in the memory 88. For example, when the partial task 98 includes a retrieval request, the controller 86 outputs the memory control 174 to the memory 88 to facilitate retrieval of slices 100 and/or results 104.

Figure 12:
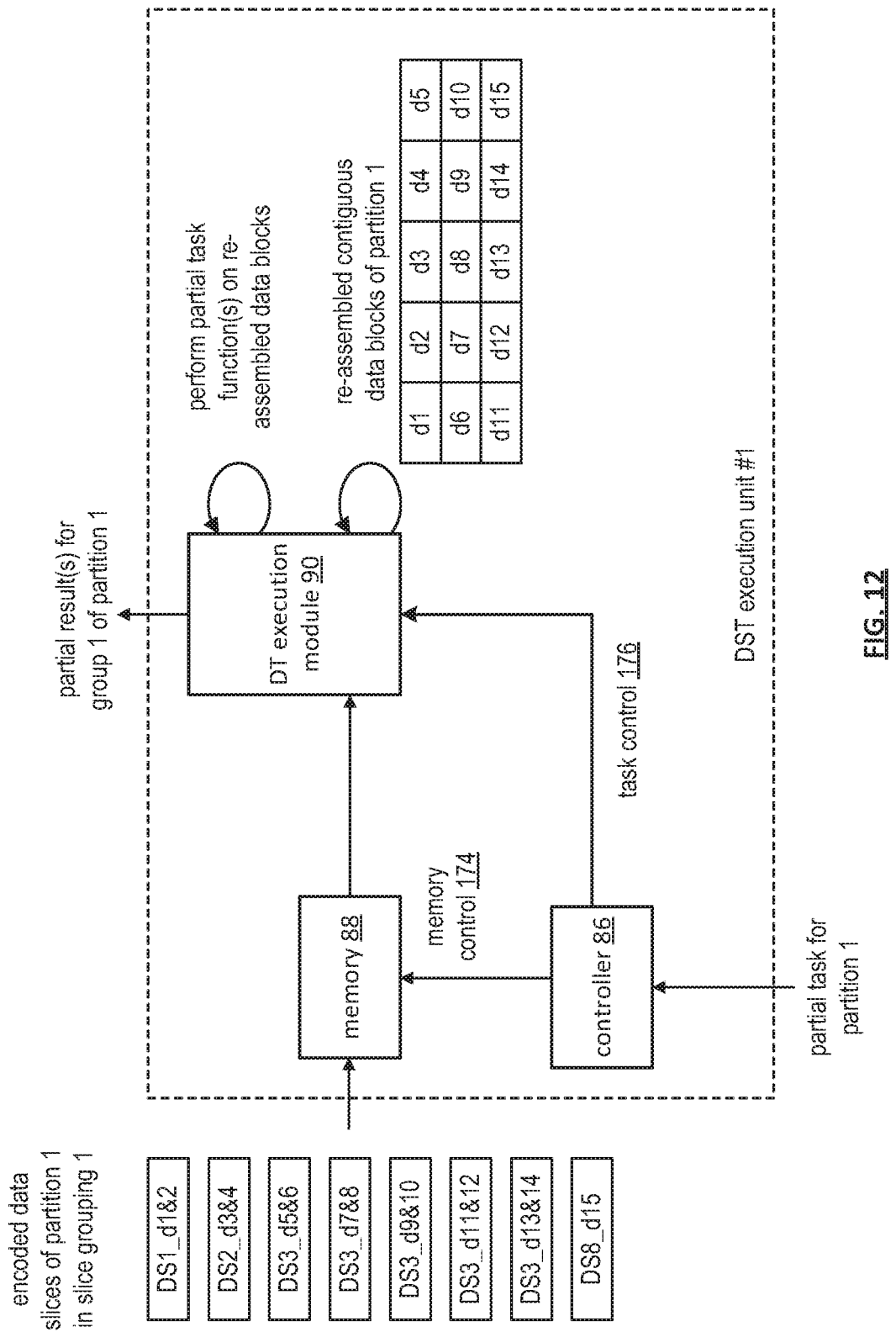
FIG. 12 is a schematic block diagram of an example of operation of a DST execution unit in accordance with the present invention.

FIG. 12 is a schematic block diagram of an example of operation of a distributed storage and task (DST) execution unit storing encoded data slices and executing a task thereon. To store the encoded data slices of a partition 1 of slice grouping 1, a controller 86 generates write commands as memory control information 174 such that the encoded slices are stored in desired locations (e.g., permanent or temporary) within memory 88.

Once the encoded slices are stored, the controller 86 provides task control information 176 to a distributed task (DT) execution module 90. As a first step of executing the task in accordance with the task control information 176, the DT execution module 90 retrieves the encoded slices from memory 88. The DT execution module 90 then reconstructs contiguous data blocks of a data partition. As shown for this example, reconstructed contiguous data blocks of data partition 1 include data blocks 1-15 (e.g., d1-d15).

With the contiguous data blocks reconstructed, the DT execution module 90 performs the task on the reconstructed contiguous data blocks. For example, the task may be to search the reconstructed contiguous data blocks for a particular word or phrase, identify where in the reconstructed contiguous data blocks the particular word or phrase occurred, and/or count the occurrences of the particular word or phrase on the reconstructed contiguous data blocks. The DST execution unit continues in a similar manner for the encoded data slices of other partitions in slice grouping 1. Note that with using the unity matrix error encoding scheme previously discussed, if the encoded data slices of contiguous data are uncorrupted, the decoding of them is a relatively straightforward process of extracting the data.

If, however, an encoded data slice of contiguous data is corrupted (or missing), it can be rebuilt by accessing other DST execution units that are storing the other encoded data slices of the set of encoded data slices of the corrupted encoded data slice. In this instance, the DST execution unit having the corrupted encoded data slices retrieves at least three encoded data slices (of contiguous data and of error coding data) in the set from the other DST execution units (recall for this example, the pillar width is 5 and the decode threshold is 3). The DST execution unit decodes the retrieved data slices using the DS error encoding parameters to recapture the corresponding data segment. The DST execution unit then re-encodes the data segment using the DS error encoding parameters to rebuild the corrupted encoded data slice. Once the encoded data slice is rebuilt, the DST execution unit functions as previously described.

Figure 13:
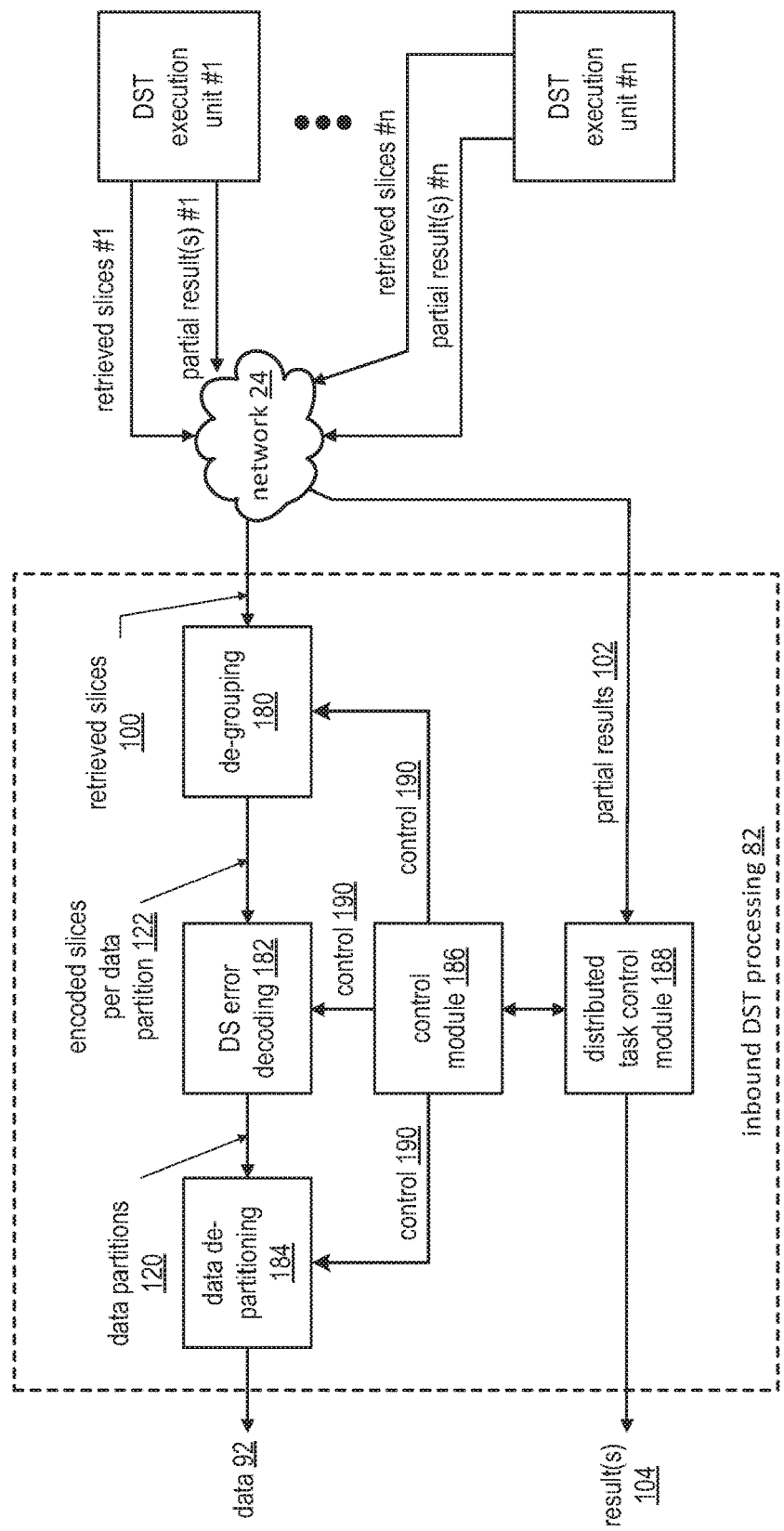
FIG. 13 is a schematic block diagram of an embodiment of an inbound distributed storage and/or task (DST) processing in accordance with the present invention.

FIG. 13 is a schematic block diagram of an embodiment of an inbound distributed storage and/or task (DST) processing section 82 of a DST client module coupled to DST execution units of a distributed storage and task network (DSTN) module via a network 24. The inbound DST processing section 82 includes a de-grouping module 180, a DS (dispersed storage) error decoding module 182, a data de-partitioning module 184, a control module 186, and a distributed task control module 188. Note that the control module 186 and/or the distributed task control module 188 may be separate modules from corresponding ones of outbound DST processing section or may be the same modules.

In an example of operation, the DST execution units have completed execution of corresponding partial tasks on the corresponding slice groupings to produce partial results 102. The inbound DST processing section 82 receives the partial results 102 via the distributed task control module 188. The inbound DST processing section 82 then processes the partial results 102 to produce a final result, or results 104. For example, if the task was to find a specific word or phrase within data, the partial results 102 indicate where in each of the prescribed portions of the data the corresponding DST execution units found the specific word or phrase. The distributed task control module 188 combines the individual partial results 102 for the corresponding portions of the data into a final result 104 for the data as a whole.

In another example of operation, the inbound DST processing section 82 is retrieving stored data from the DST execution units (i.e., the DSTN module). In this example, the DST execution units output encoded data slices 100 corresponding to the data retrieval requests. The de-grouping module 180 receives retrieved slices 100 and de-groups them to produce encoded data slices per data partition 122. The DS error decoding module 182 decodes, in accordance with DS error encoding parameters, the encoded data slices per data partition 122 to produce data partitions 120.

The data de-partitioning module 184 combines the data partitions 120 into the data 92. The control module 186 controls the conversion of retrieved slices 100 into the data 92 using control signals 190 to each of the modules. For instance, the control module 186 provides de-grouping information to the de-grouping module 180, provides the DS error encoding parameters to the DS error decoding module 182, and provides de-partitioning information to the data de-partitioning module 184.

Figure 14:
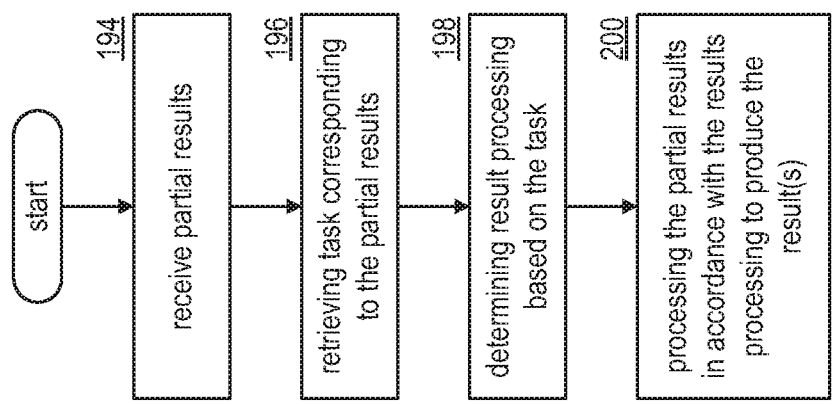
FIG. 14 is a logic diagram of an example of a method for inbound DST processing in accordance with the present invention.

FIG. 14 is a logic diagram of an example of a method that is executable by distributed storage and task (DST) client module regarding inbound DST processing. The method begins at step 194 where the DST client module receives partial results. The method continues at step 196 where the DST client module retrieves the task corresponding to the partial results. For example, the partial results include header information that identifies the requesting entity, which correlates to the requested task.

The method continues at step 198 where the DST client module determines result processing information based on the task. For example, if the task were to identify a particular word or phrase within the data, the result processing information would indicate to aggregate the partial results for the corresponding portions of the data to produce the final result. As another example, if the task were to count the occurrences of a particular word or phrase within the data, results of processing the information would indicate to add the partial results to produce the final results. The method continues at step 200 where the DST client module processes the partial results in accordance with the result processing information to produce the final result or results.

Figure 15:
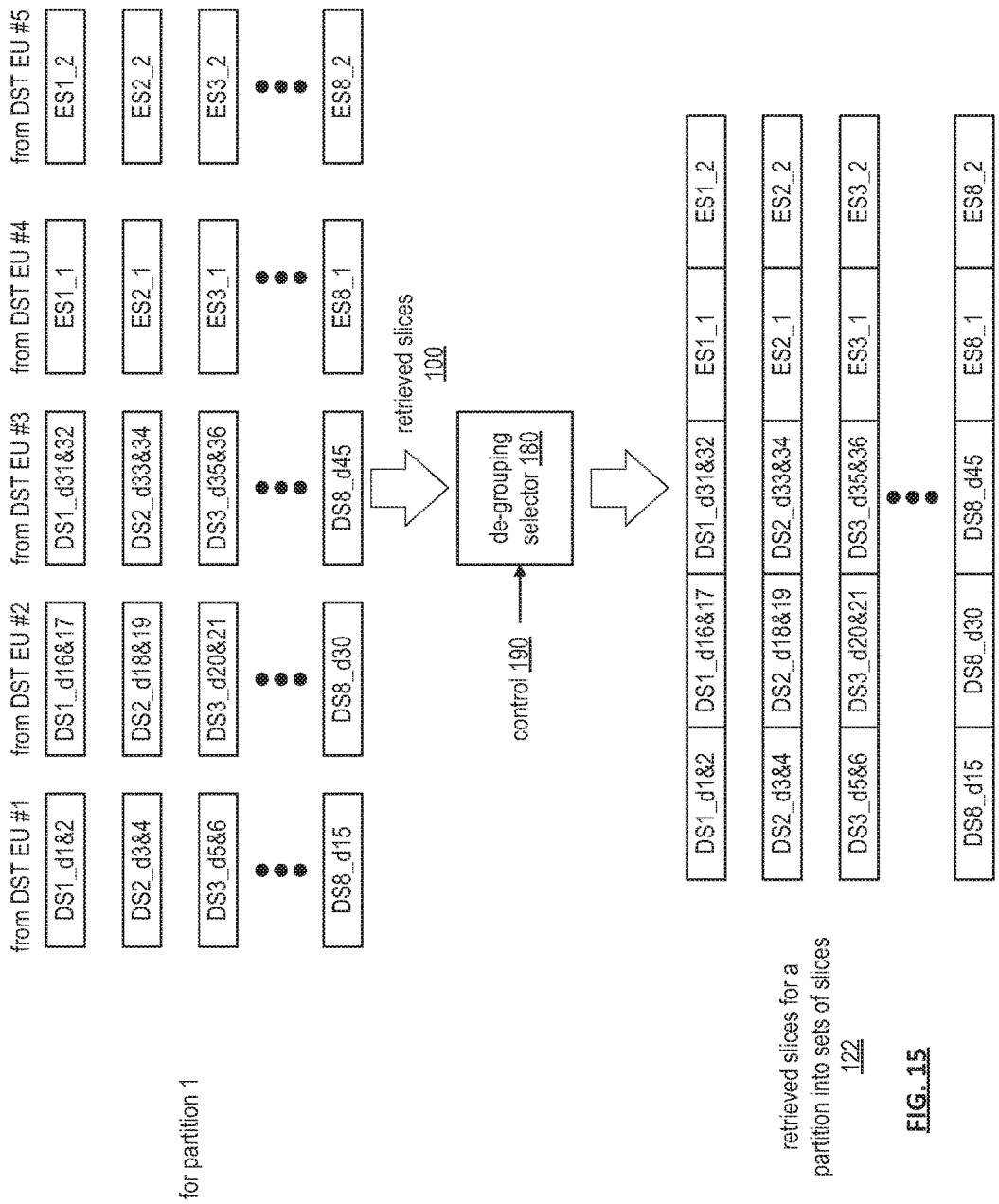
FIG. 15 is a diagram of an example of de-grouping selection processing of the inbound DST processing in accordance with the present invention.

FIG. 15 is a diagram of an example of de-grouping selection processing of an inbound distributed storage and task (DST) processing section of a DST client module. In general, this is an inverse process of the grouping module of the outbound DST processing section of FIG. 9. Accordingly, for each data partition (e.g., partition #1), the de-grouping module retrieves the corresponding slice grouping from the DST execution units (EU) (e.g., DST 1-5).

As shown, DST execution unit #1 provides a first slice grouping, which includes the first encoded slices of each of the sets of encoded slices (e.g., encoded data slices of contiguous data of data blocks 1-15); DST execution unit #2 provides a second slice grouping, which includes the second encoded slices of each of the sets of encoded slices (e.g., encoded data slices of contiguous data of data blocks 16-30); DST execution unit #3 provides a third slice grouping, which includes the third encoded slices of each of the sets of encoded slices (e.g., encoded data slices of contiguous data of data blocks 31-45); DST execution unit #4 provides a fourth slice grouping, which includes the fourth encoded slices of each of the sets of encoded slices (e.g., first encoded data slices of error coding (EC) data); and DST execution unit #5 provides a fifth slice grouping, which includes the fifth encoded slices of each of the sets of encoded slices (e.g., first encoded data slices of error coding (EC) data).

The de-grouping module de-groups the slice groupings (e.g., received slices 100) using a de-grouping selector 180 controlled by a control signal 190 as shown in the example to produce a plurality of sets of encoded data slices (e.g., retrieved slices for a partition into sets of slices 122). Each set corresponding to a data segment of the data partition.

Figure 16:
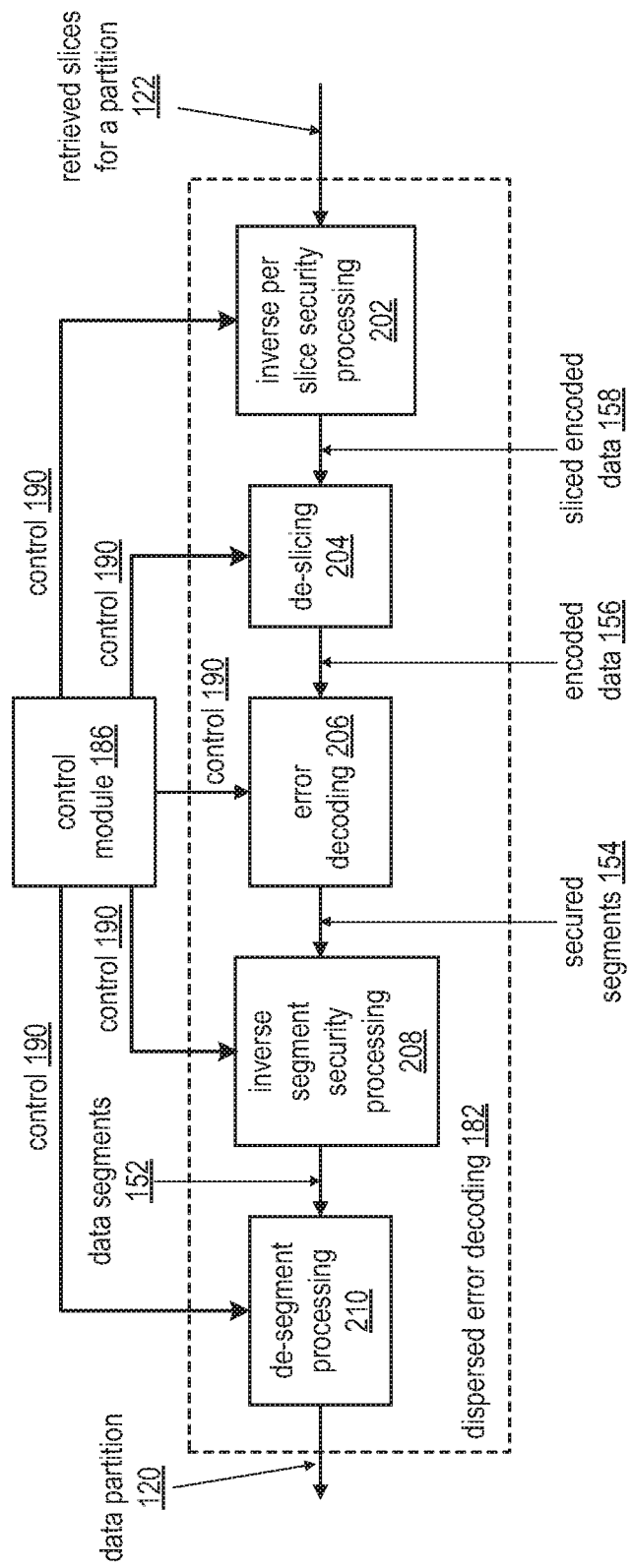
FIG. 16 is a schematic block diagram of an embodiment of a dispersed error decoding in accordance with the present invention.

FIG. 16 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, a de-segmenting processing module 210, and a control module 186.

In an example of operation, the inverse per slice security processing module 202, when enabled by the control module 186, unsecures each encoded data slice 122 based on slice de-security information received as control information 190 (e.g., the compliment of the slice security information discussed with reference to FIG. 6) received from the control module 186. The slice security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 122, it decrypts each verified encoded data slice, and decompresses each decrypted encoded data slice to produce slice encoded data 158. When the inverse per slice security processing module 202 is not enabled, it passes the encoded data slices 122 as the sliced encoded data 158 or is bypassed such that the retrieved encoded data slices 122 are provided as the sliced encoded data 158.

The de-slicing module 204 de-slices the sliced encoded data 158 into encoded data segments 156 in accordance with a pillar width of the error correction encoding parameters received as control information 190 from the control module 186. For example, if the pillar width is five, the de-slicing module 204 de-slices a set of five encoded data slices into an encoded data segment 156. The error decoding module 206 decodes the encoded data segments 156 in accordance with error correction decoding parameters received as control information 190 from the control module 186 to produce secure data segments 154. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments 154 based on segment security information received as control information 190 from the control module 186. The segment security information includes data decompression, decryption, de-watermarking, integrity check (e.g., CRC, etc.) verification, and/or any other type of digital security. For example, when the inverse segment security processing module 208 is enabled, it verifies integrity information (e.g., a CRC value) of each secure data segment 154, it decrypts each verified secured data segment, and decompresses each decrypted secure data segment to produce a data segment 152. When the inverse segment security processing module 208 is not enabled, it passes the decoded data segment 154 as the data segment 152 or is bypassed.

The de-segment processing module 210 receives the data segments 152 and receives de-segmenting information as control information 190 from the control module 186. The de-segmenting information indicates how the de-segment processing module 210 is to de-segment the data segments 152 into a data partition 120. For example, the de-segmenting information indicates how the rows and columns of data segments are to be rearranged to yield the data partition 120.

Figure 17:
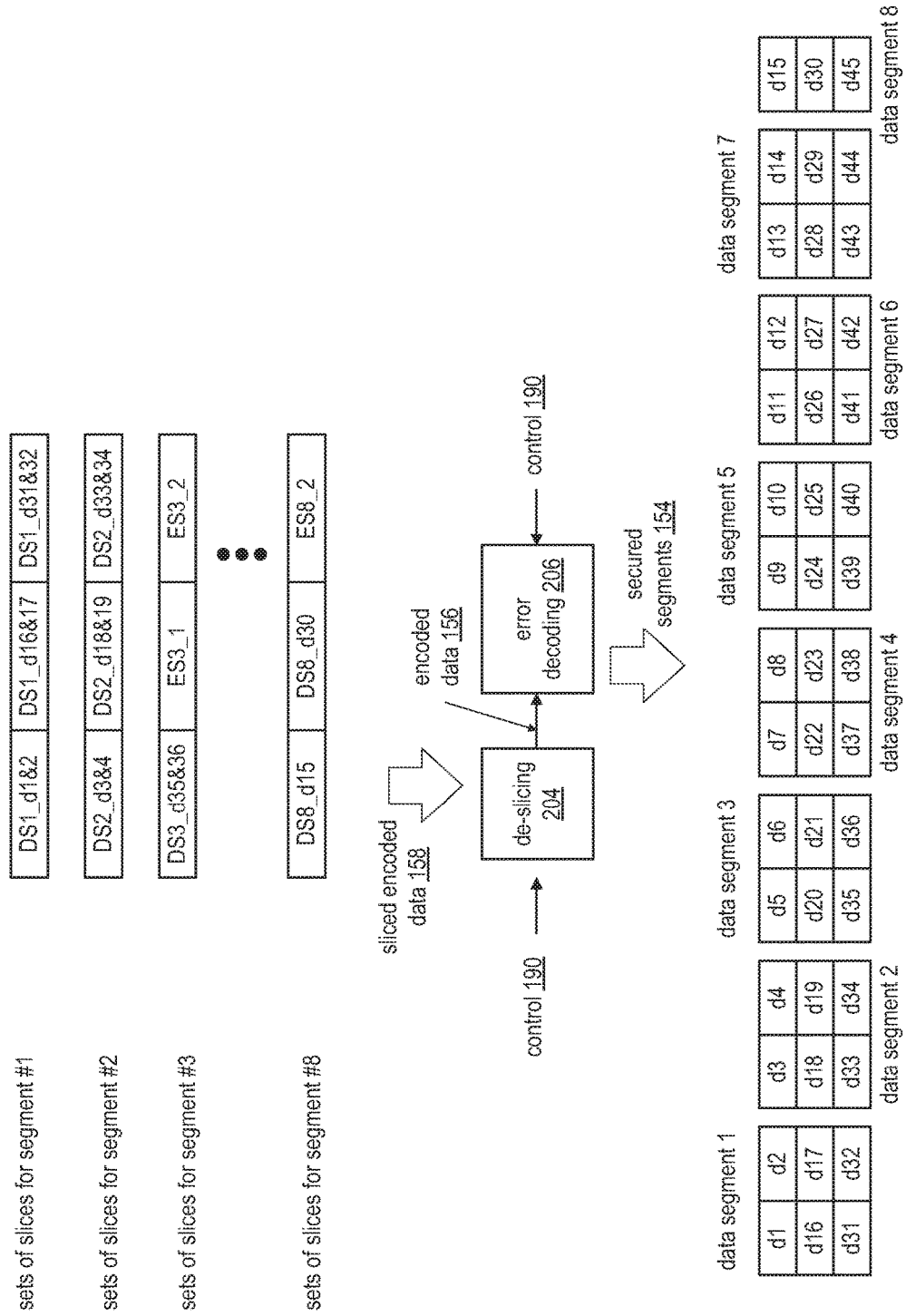
FIG. 17 is a diagram of an example of de-slicing and error decoding processing of the dispersed error decoding in accordance with the present invention.

FIG. 17 is a diagram of an example of de-slicing and error decoding processing of a dispersed error decoding module. A de-slicing module 204 receives at least a decode threshold number of encoded data slices 158 for each data segment in accordance with control information 190 and provides encoded data 156. In this example, a decode threshold is three. As such, each set of encoded data slices 158 is shown to have three encoded data slices per data segment. The de-slicing module 204 may receive three encoded data slices per data segment because an associated distributed storage and task (DST) client module requested retrieving only three encoded data slices per segment or selected three of the retrieved encoded data slices per data segment. As shown, which is based on the unity matrix encoding previously discussed with reference to FIG. 8, an encoded data slice may be a data-based encoded data slice (e.g., DS1_d1&d2) or an error code based encoded data slice (e.g., ES3_1).

An error decoding module 206 decodes the encoded data 156 of each data segment in accordance with the error correction decoding parameters of control information 190 to produce secured segments 154. In this example, data segment 1 includes 3 rows with each row being treated as one word for encoding. As such, data segment 1 includes three words: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

Figure 18:
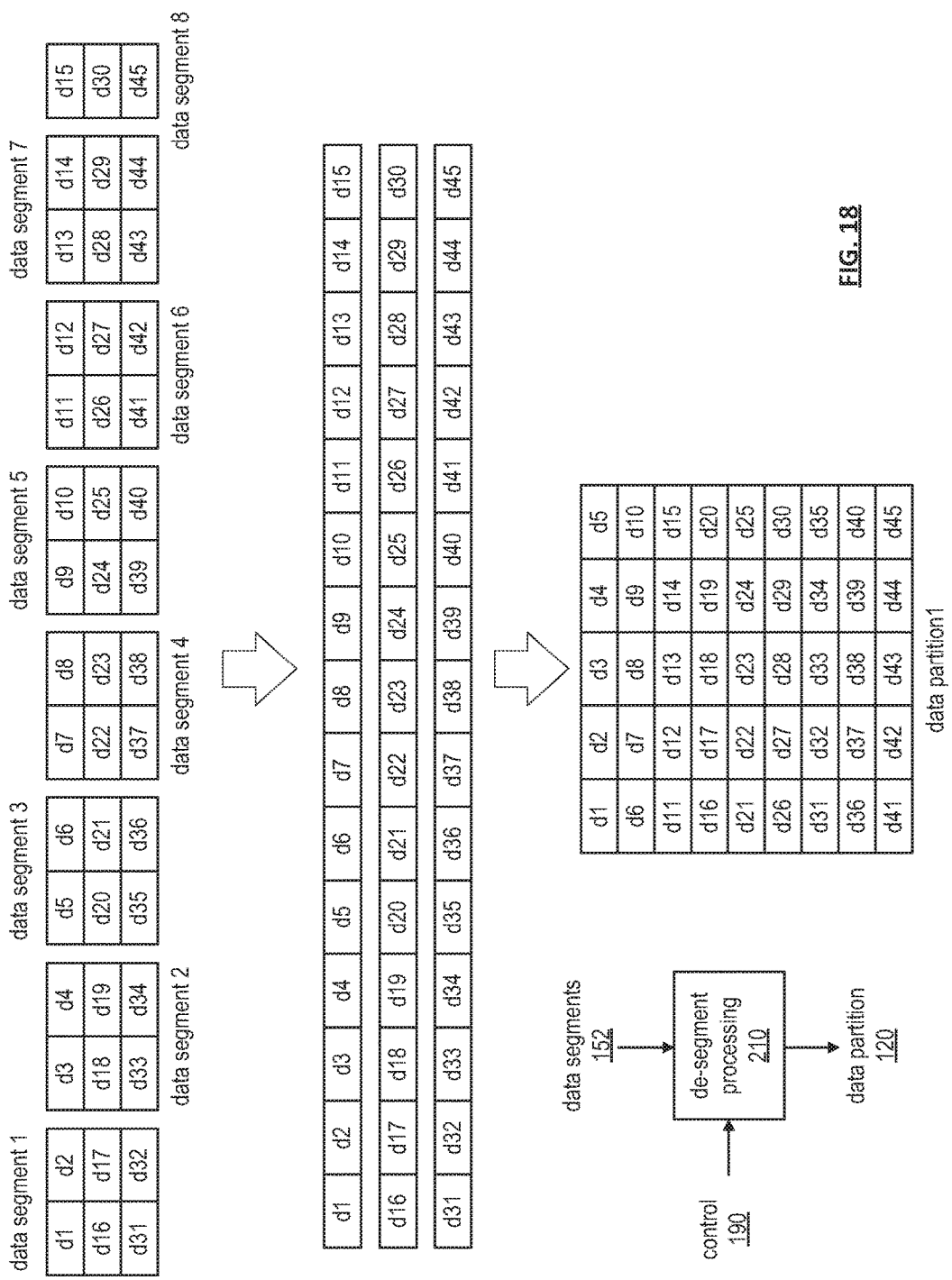
FIG. 18 is a diagram of an example of a de-segment processing of the dispersed error decoding in accordance with the present invention.

FIG. 18 is a diagram of an example of de-segment processing of an inbound distributed storage and task (DST) processing. In this example, a de-segment processing module 210 receives data segments 152 (e.g., 1-8) and rearranges the data blocks of the data segments into rows and columns in accordance with de-segmenting information of control information 190 to produce a data partition 120. Note that the number of rows is based on the decode threshold (e.g., 3 in this specific example) and the number of columns is based on the number and size of the data blocks.

The de-segmenting module 210 converts the rows and columns of data blocks into the data partition 120. Note that each data block may be of the same size as other data blocks or of a different size. In addition, the size of each data block may be a few bytes to megabytes of data.

Figure 19:
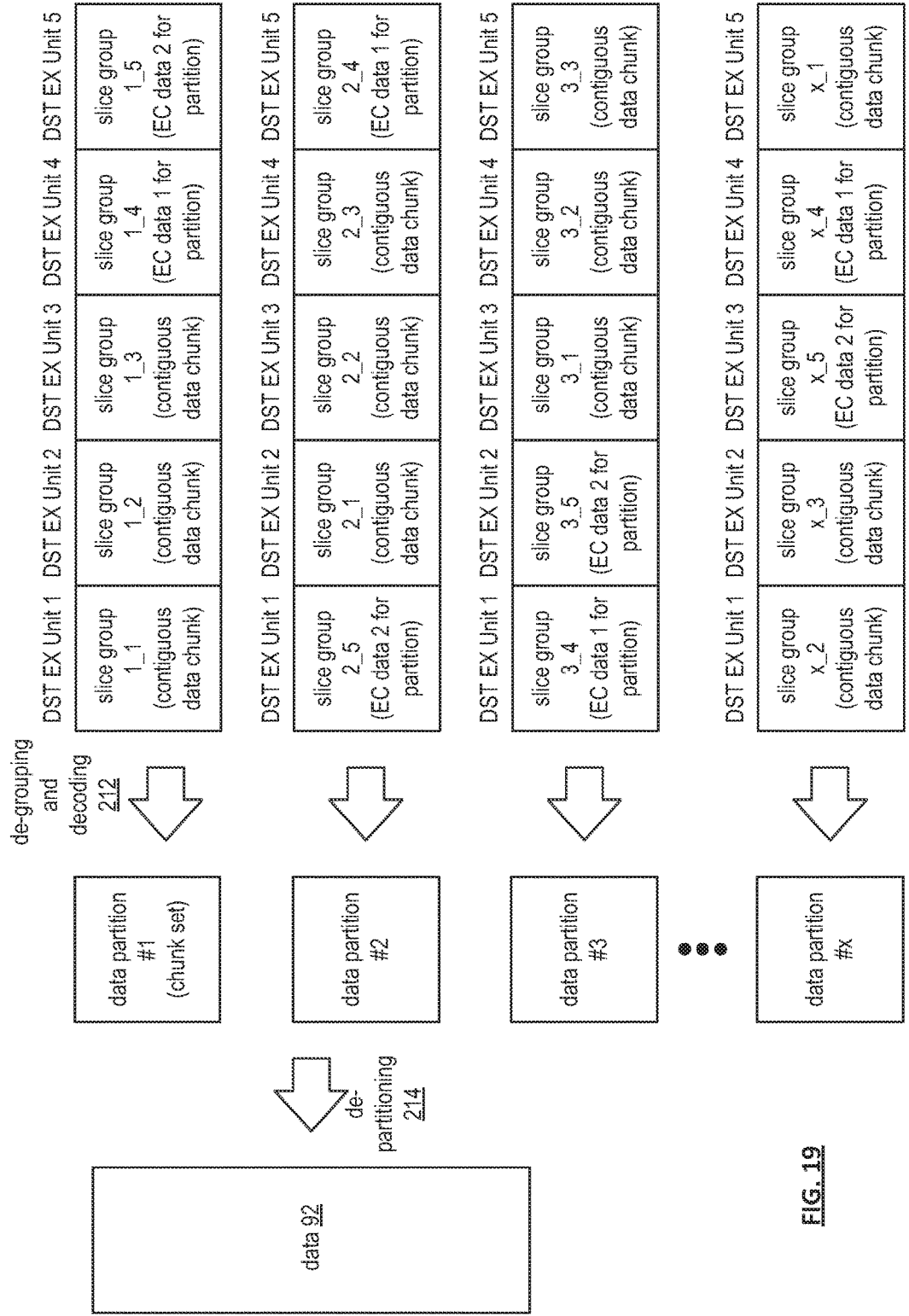
FIG. 19 is a diagram of an example of converting slice groups into data in accordance with the present invention.

FIG. 19 is a diagram of an example of converting slice groups into data 92 within an inbound distributed storage and task (DST) processing section. As shown, the data 92 is reconstructed from a plurality of data partitions (1-x, where x is an integer greater than 4). Each data partition (or chunk set of data) is decoded and re-grouped using a de-grouping and decoding function 212 and a de-partition function 214 from slice groupings as previously discussed. For a given data partition, the slice groupings (e.g., at least a decode threshold per data segment of encoded data slices) are received from DST execution units. From data partition to data partition, the ordering of the slice groupings received from the DST execution units may vary as discussed with reference to FIG. 10.

Figure 20:
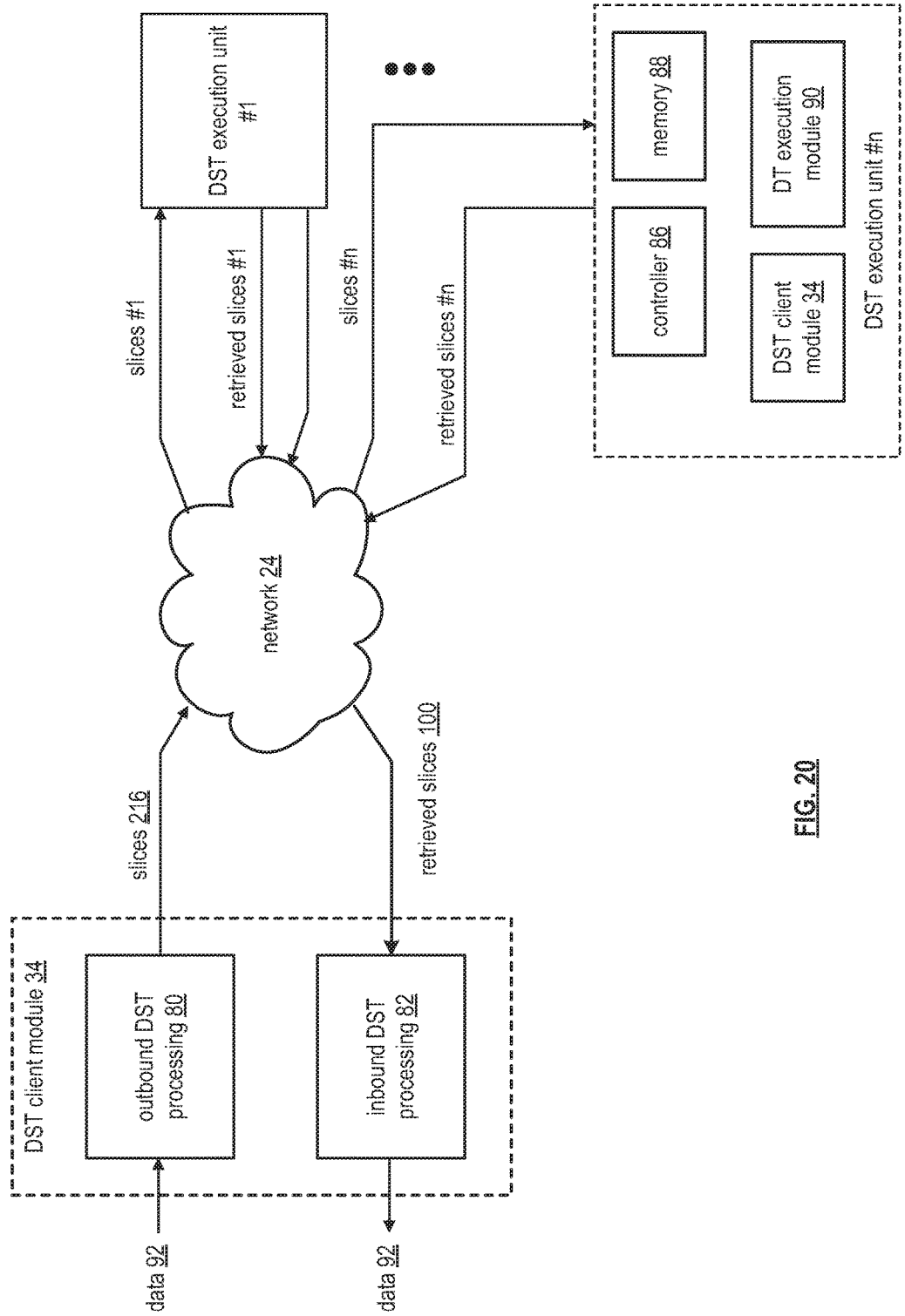
FIG. 20 is a diagram of an example of a distributed storage within the distributed computing system in accordance with the present invention.

FIG. 20 is a diagram of an example of a distributed storage and/or retrieval within the distributed computing system. The distributed computing system includes a plurality of distributed storage and/or task (DST) processing client modules 34 (one shown) coupled to a distributed storage and/or task processing network (DSTN) module, or multiple DSTN modules, via a network 24. The DST client module 34 includes an outbound DST processing section 80 and an inbound DST processing section 82. The DSTN module includes a plurality of DST execution units. Each DST execution unit includes a controller 86, memory 88, one or more distributed task (DT) execution modules 90, and a DST client module 34.

In an example of data storage, the DST client module 34 has data 92 that it desires to store in the DSTN module. The data 92 may be a file (e.g., video, audio, text, graphics, etc.), a data object, a data block, an update to a file, an update to a data block, etc. In this instance, the outbound DST processing module 80 converts the data 92 into encoded data slices 216 as will be further described with reference to FIGS. 21-23. The outbound DST processing module 80 sends, via the network 24, to the DST execution units for storage as further described with reference to FIG. 24.

In an example of data retrieval, the DST client module 34 issues a retrieve request to the DST execution units for the desired data 92. The retrieve request may address each DST executions units storing encoded data slices of the desired data, address a decode threshold number of DST execution units, address a read threshold number of DST execution units, or address some other number of DST execution units. In response to the request, each addressed DST execution unit retrieves its encoded data slices 100 of the desired data and sends them to the inbound DST processing section 82, via the network 24.

When, for each data segment, the inbound DST processing section 82 receives at least a decode threshold number of encoded data slices 100, it converts the encoded data slices 100 into a data segment. The inbound DST processing section 82 aggregates the data segments to produce the retrieved data 92.

Figure 21:
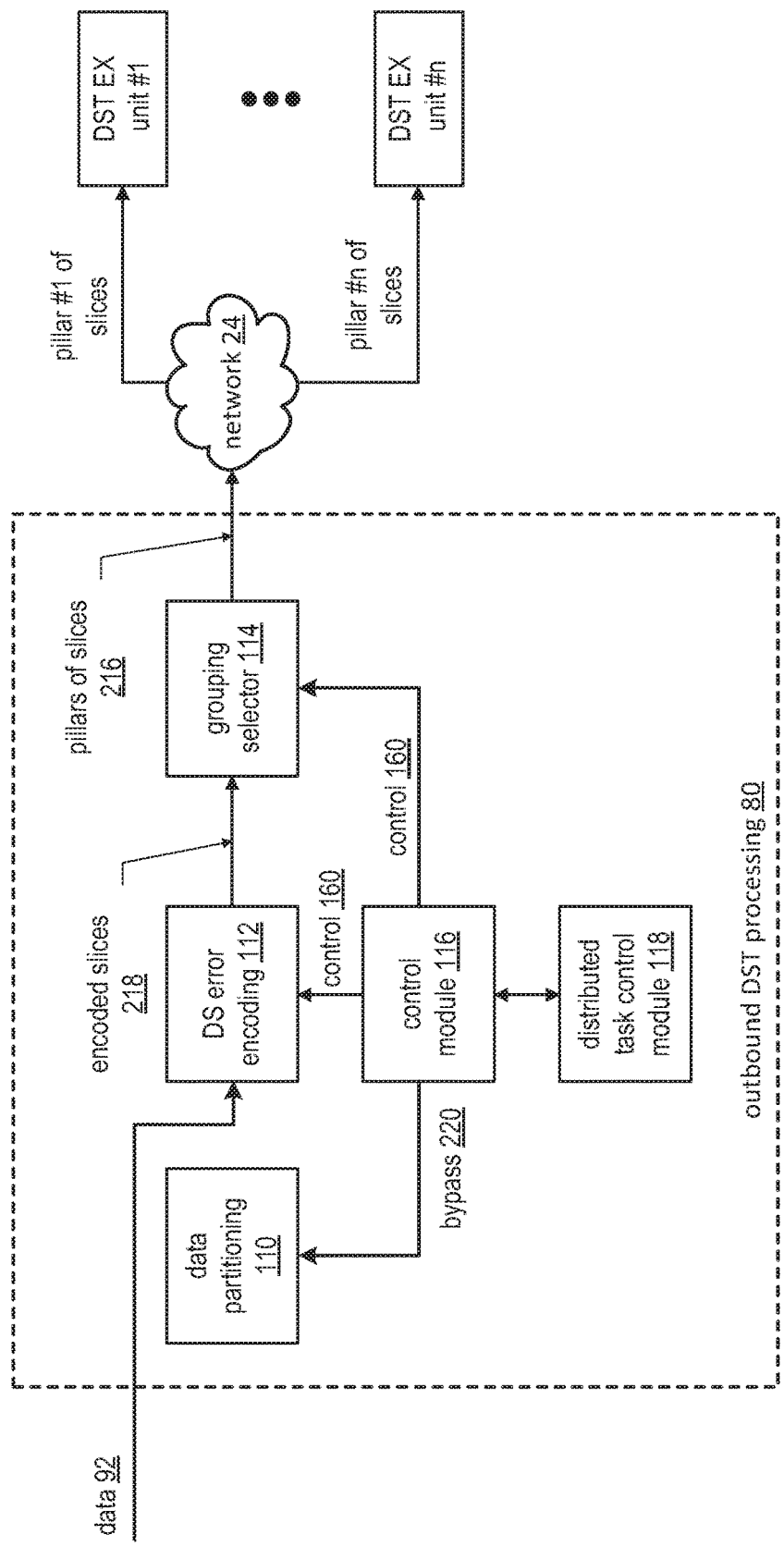
FIG. 21 is a schematic block diagram of an example of operation of outbound distributed storage and/or task (DST) processing for storing data in accordance with the present invention.

FIG. 21 is a schematic block diagram of an embodiment of an outbound distributed storage and/or task (DST) processing section 80 of a DST client module coupled to a distributed storage and task network (DSTN) module (e.g., a plurality of DST execution units) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 is by-passed such that data 92 is provided directly to the DS error encoding module 112. The control module 116 coordinates the by-passing of the data partitioning module 110 by outputting a bypass 220 message to the data partitioning module 110.

The DS error encoding module 112 receives the data 92 in a serial manner, a parallel manner, and/or a combination thereof. The DS error encoding module 112 DS error encodes the data in accordance with control information 160 from the control module 116 to produce encoded data slices 218. The DS error encoding includes segmenting the data 92 into data segments, segment security processing (e.g., encryption, compression, watermarking, integrity check (e.g., CRC, etc.)), error encoding, slicing, and/or per slice security processing (e.g., encryption, compression, watermarking, integrity check (e.g., CRC, etc.)). The control information 160 indicates which steps of the DS error encoding are active for the data 92 and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 218 of the data segments into pillars of slices 216. The number of pillars corresponds to the pillar width of the DS error encoding parameters. In this example, the distributed task control module 118 facilitates the storage request.

Figure 22:
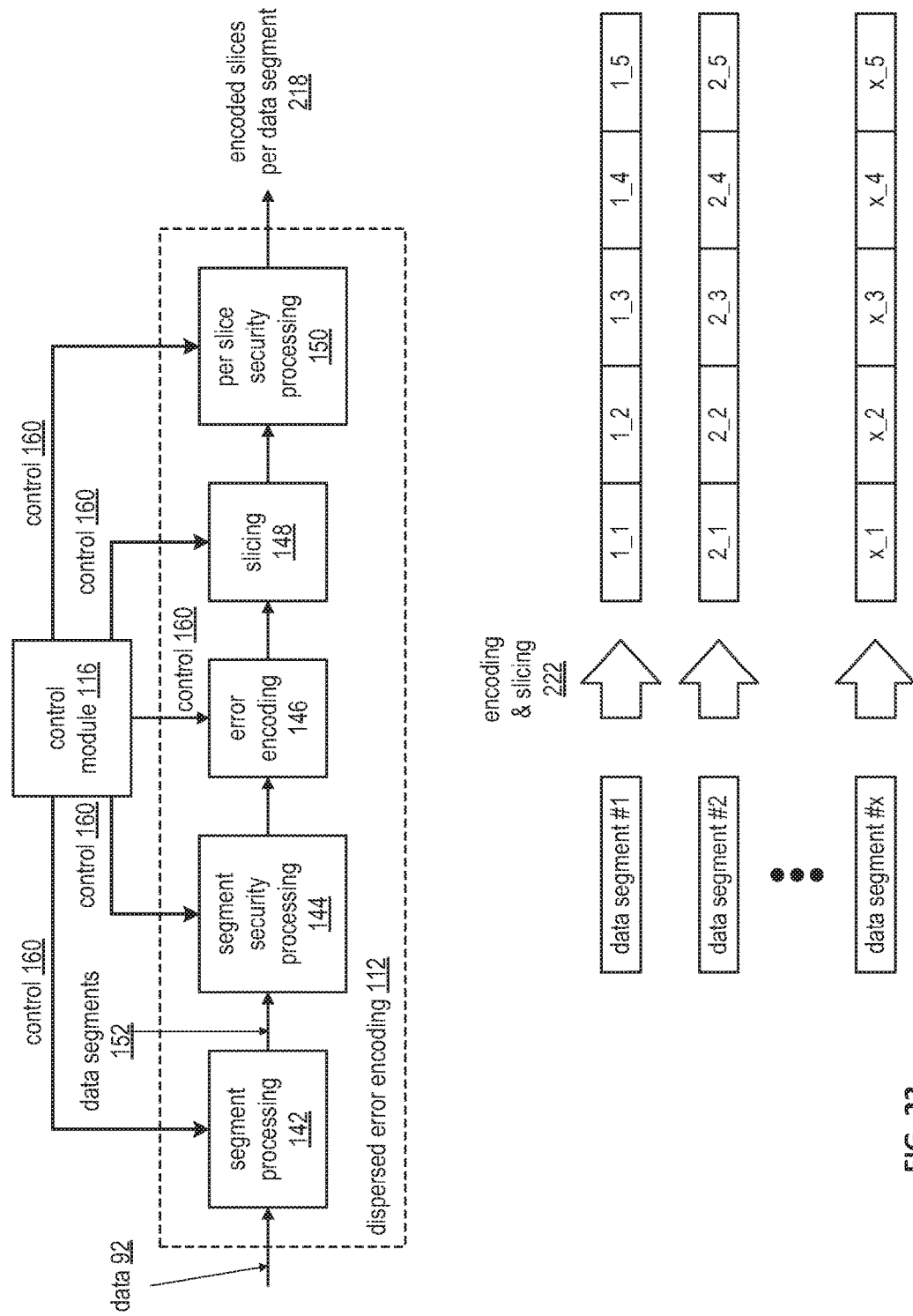
FIG. 22 is a schematic block diagram of an example of a dispersed error encoding for the example of FIG. 21 in accordance with the present invention.

FIG. 22 is a schematic block diagram of an example of a dispersed storage (DS) error encoding module 112 for the example of FIG. 21. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives data 92 and receives segmenting information as control information 160 from the control module 116. The segmenting information indicates how the segment processing module is to segment the data. For example, the segmenting information indicates the size of each data segment. The segment processing module 142 segments the data 92 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., CRC, etc.), and/or any other type of digital security. For example, when the segment security processing module 144 is enabled, it compresses a data segment 152, encrypts the compressed data segment, and generates a CRC value for the encrypted data segment to produce a secure data segment. When the segment security processing module 144 is not enabled, it passes the data segments 152 to the error encoding module 146 or is bypassed such that the data segments 152 are provided to the error encoding module 146.

The error encoding module 146 encodes the secure data segments in accordance with error correction encoding parameters received as control information 160 from the control module 116. The error correction encoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment to produce an encoded data segment.

The slicing module 148 slices the encoded data segment in accordance with a pillar width of the error correction encoding parameters. For example, if the pillar width is five, the slicing module slices an encoded data segment into a set of five encoded data slices. As such, for a plurality of data segments, the slicing module 148 outputs a plurality of sets of encoded data slices as shown within encoding and slicing function 222 as described.

The per slice security processing module 150, when enabled by the control module 116, secures each encoded data slice based on slice security information received as control information 160 from the control module 116. The slice security information includes data compression, encryption, watermarking, integrity check (e.g., CRC, etc.), and/or any other type of digital security. For example, when the per slice security processing module 150 is enabled, it may compress an encoded data slice, encrypt the compressed encoded data slice, and generate a CRC value for the encrypted encoded data slice to produce a secure encoded data slice tweaking. When the per slice security processing module 150 is not enabled, it passes the encoded data slices or is bypassed such that the encoded data slices 218 are the output of the DS error encoding module 112.

Figure 23:
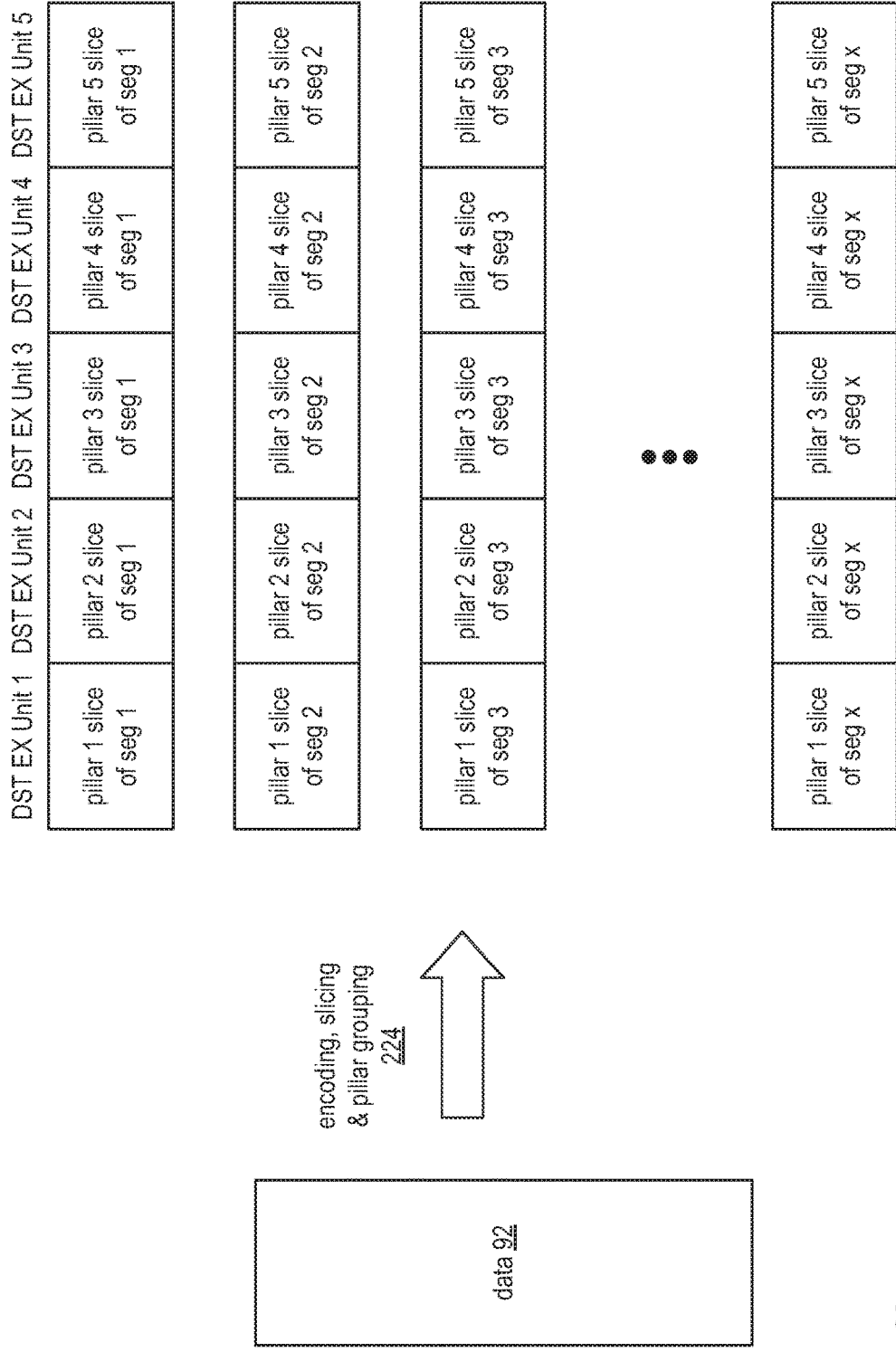
FIG. 23 is a diagram of an example of converting data into pillar slice groups for storage in accordance with the present invention.

FIG. 23 is a diagram of an example of converting data 92 into pillar slice groups utilizing encoding, slicing and pillar grouping function 224 for storage in memory of a distributed storage and task network (DSTN) module. As previously discussed the data 92 is encoded and sliced into a plurality of sets of encoded data slices; one set per data segment. The grouping selector module organizes the sets of encoded data slices into pillars of data slices. In this example, the DS error encoding parameters include a pillar width of 5 and a decode threshold of 3. As such, for each data segment, 5 encoded data slices are created.

The grouping selector module takes the first encoded data slice of each of the sets and forms a first pillar, which may be sent to the first DST execution unit. Similarly, the grouping selector module creates the second pillar from the second slices of the sets; the third pillar from the third slices of the sets; the fourth pillar from the fourth slices of the sets; and the fifth pillar from the fifth slices of the set.

FIG. 24 is a schematic block diagram of an embodiment of a distributed storage and/or task (DST) execution unit that includes an interface 169, a controller 86, memory 88, one or more distributed task (DT) execution modules 90, and a DST client module 34. A computing core 26 may be utilized to implement the one or more DT execution modules 90 and the DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a pillar of slices 216, the DST execution unit receives, via interface 169, a pillar of slices 216 (e.g., pillar #1 slices). The memory 88 stores the encoded data slices 216 of the pillar of slices in accordance with memory control information 174 it receives from the controller 86. The controller 86 (e.g., a processing module, a CPU, etc.) generates the memory control information 174 based on distributed storage information (e.g., user information (e.g., user ID, distributed storage permissions, data access permission, etc.), vault information (e.g., virtual memory assigned to user, user group, etc.), etc.). Similarly, when retrieving slices, the DST execution unit receives, via interface 169, a slice retrieval request. The memory 88 retrieves the slice in accordance with memory control information 174 it receives from the controller 86. The memory 88 outputs the slice 100, via the interface 169, to a requesting entity.

Figure 25:
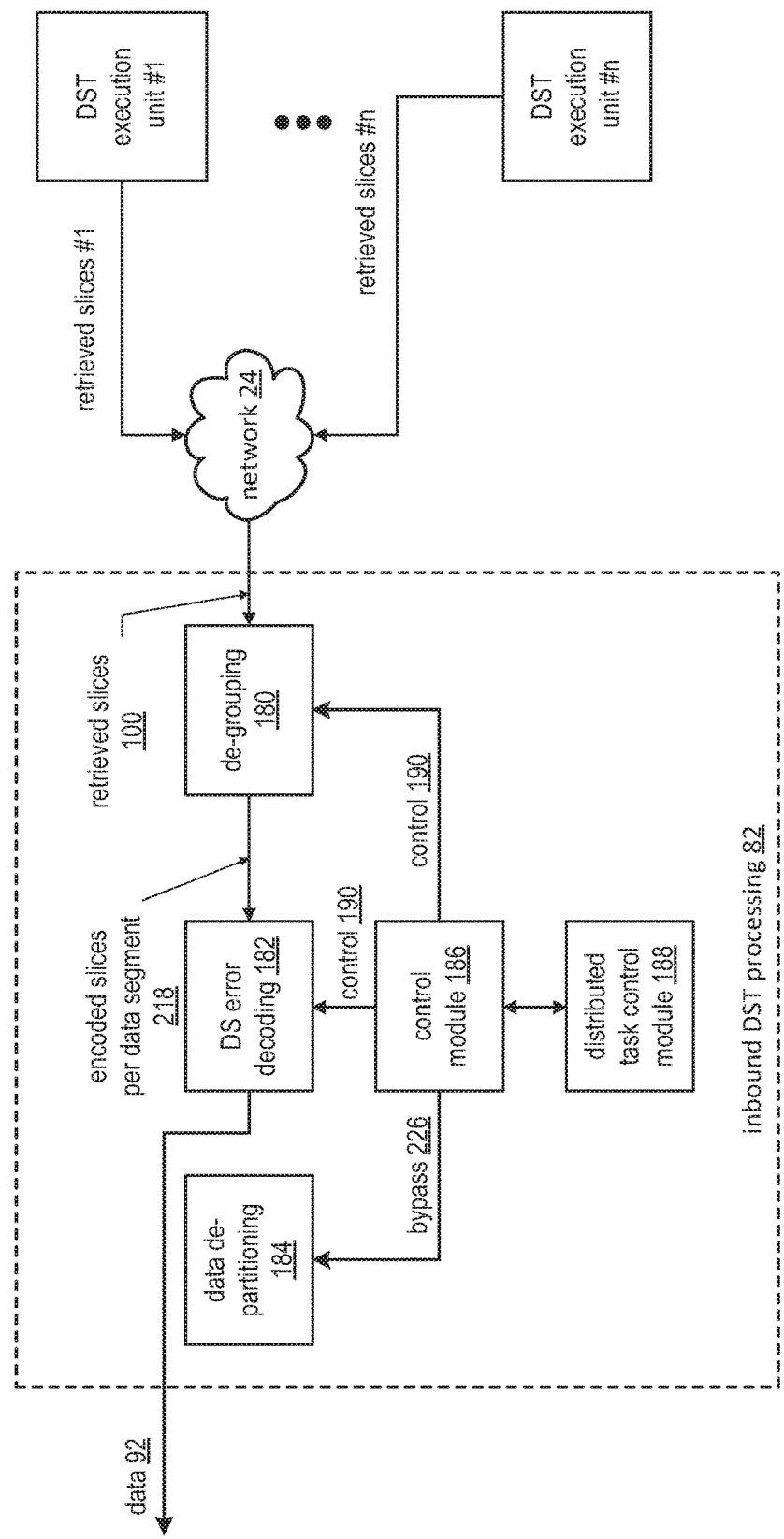
FIG. 25 is a schematic block diagram of an example of operation of inbound distributed storage and/or task (DST) processing for retrieving dispersed error encoded data in accordance with the present invention.

FIG. 25 is a schematic block diagram of an example of operation of an inbound distributed storage and/or task (DST) processing section 82 for retrieving dispersed error encoded data 92. The inbound DST processing section 82 includes a de-grouping module 180, a dispersed storage (DS) error decoding module 182, a data de-partitioning module 184, a control module 186, and a distributed task control module 188. Note that the control module 186 and/or the distributed task control module 188 may be separate modules from corresponding ones of an outbound DST processing section or may be the same modules.

In an example of operation, the inbound DST processing section 82 is retrieving stored data 92 from the DST execution units (i.e., the DSTN module). In this example, the DST execution units output encoded data slices corresponding to data retrieval requests from the distributed task control module 188. The de-grouping module 180 receives pillars of slices 100 and de-groups them in accordance with control information 190 from the control module 186 to produce sets of encoded data slices 218. The DS error decoding module 182 decodes, in accordance with the DS error encoding parameters received as control information 190 from the control module 186, each set of encoded data slices 218 to produce data segments, which are aggregated into retrieved data 92. The data de-partitioning module 184 is by-passed in this operational mode via a bypass signal 226 of control information 190 from the control module 186.

Figure 26:
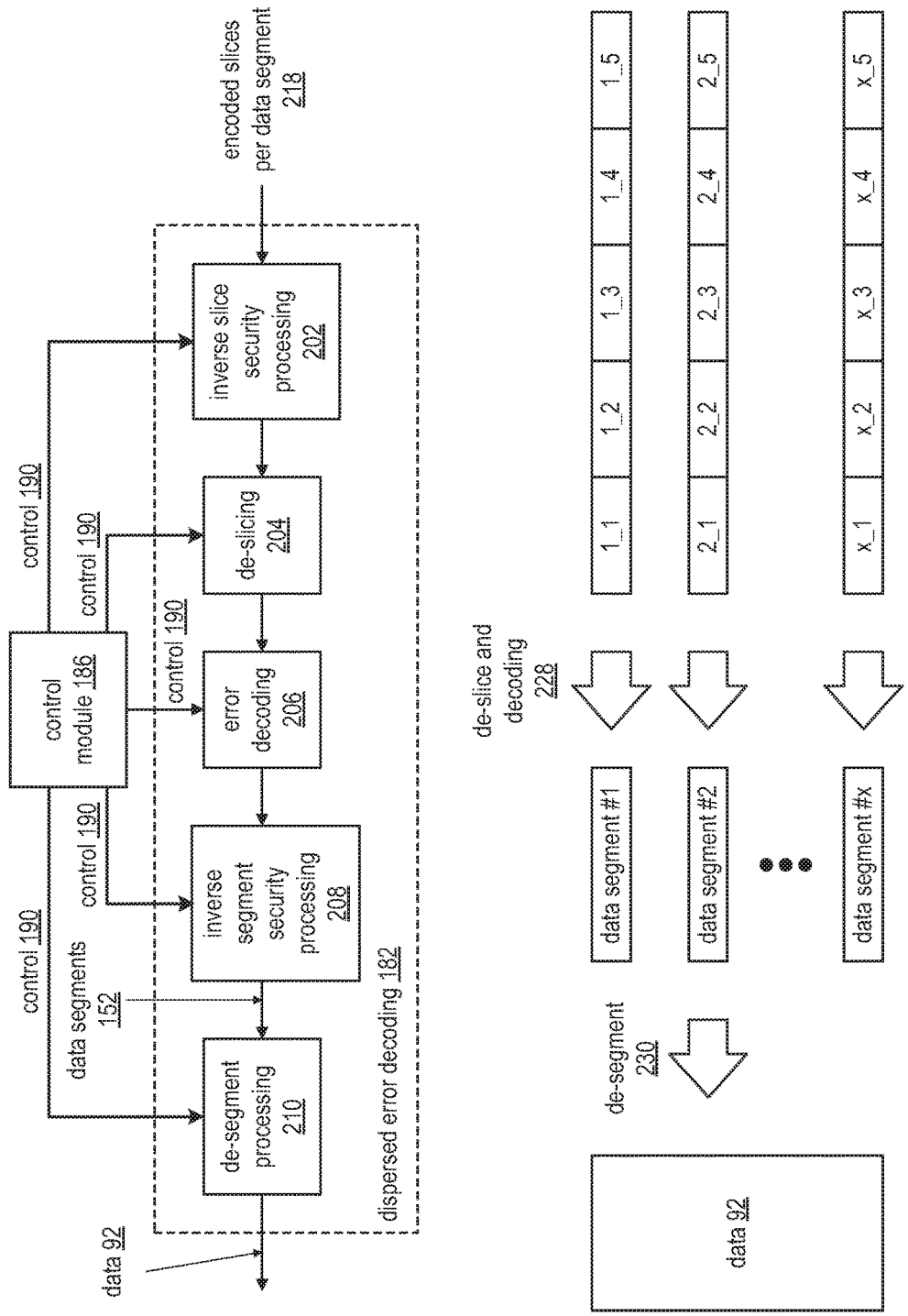
FIG. 26 is a schematic block diagram of an example of a dispersed error decoding for the example of FIG. 25 in accordance with the present invention.

FIG. 26 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, and a de-segmenting processing module 210. The dispersed error decoding module 182 is operable to de-slice and decode encoded slices per data segment 218 utilizing a de-slicing and decoding function 228 to produce a plurality of data segments that are de-segmented utilizing a de-segment function 230 to recover data 92.

In an example of operation, the inverse per slice security processing module 202, when enabled by the control module 186 via control information 190, unsecures each encoded data slice 218 based on slice de-security information (e.g., the compliment of the slice security information discussed with reference to FIG. 6) received as control information 190 from the control module 186. The slice de-security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 218, it decrypts each verified encoded data slice, and decompresses each decrypted encoded data slice to produce slice encoded data. When the inverse per slice security processing module 202 is not enabled, it passes the encoded data slices 218 as the sliced encoded data or is bypassed such that the retrieved encoded data slices 218 are provided as the sliced encoded data.

The de-slicing module 204 de-slices the sliced encoded data into encoded data segments in accordance with a pillar width of the error correction encoding parameters received as control information 190 from a control module 186. For example, if the pillar width is five, the de-slicing module de-slices a set of five encoded data slices into an encoded data segment. Alternatively, the encoded data segment may include just three encoded data slices (e.g., when the decode threshold is 3).

The error decoding module 206 decodes the encoded data segments in accordance with error correction decoding parameters received as control information 190 from the control module 186 to produce secure data segments. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments based on segment security information received as control information 190 from the control module 186. The segment security information includes data decompression, decryption, de-watermarking, integrity check (e.g., CRC, etc.) verification, and/or any other type of digital security. For example, when the inverse segment security processing module is enabled, it verifies integrity information (e.g., a CRC value) of each secure data segment, it decrypts each verified secured data segment, and decompresses each decrypted secure data segment to produce a data segment 152. When the inverse segment security processing module 208 is not enabled, it passes the decoded data segment 152 as the data segment or is bypassed. The de-segmenting processing module 210 aggregates the data segments 152 into the data 92 in accordance with control information 190 from the control module 186.

Figure 27:
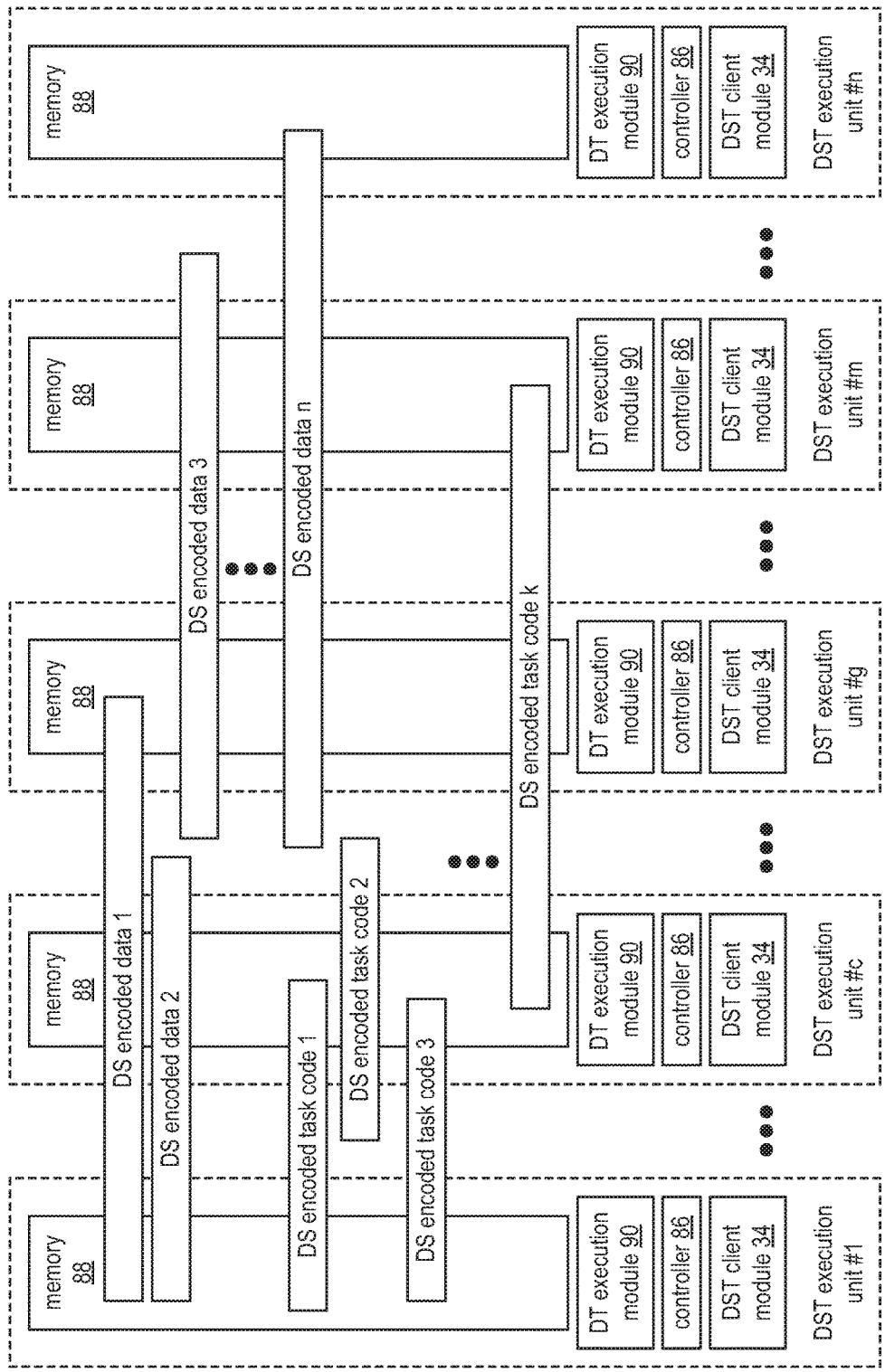
FIG. 27 is a schematic block diagram of an example of a distributed storage and task processing network (DSTN) module storing a plurality of data and a plurality of task codes in accordance with the present invention.

FIG. 27 is a schematic block diagram of an example of a distributed storage and task processing network (DSTN) module that includes a plurality of distributed storage and task (DST) execution units (#1 through #n, where, for example, n is an integer greater than or equal to three). Each of the DST execution units includes a DST client module 34, a controller 86, one or more DT (distributed task) execution modules 90, and memory 88.

In this example, the DSTN module stores, in the memory of the DST execution units, a plurality of DS (dispersed storage) encoded data (e.g., 1 through n, where n is an integer greater than or equal to two) and stores a plurality of DS encoded task codes (e.g., 1 through k, where k is an integer greater than or equal to two). The DS encoded data may be encoded in accordance with one or more examples described with reference to FIGS. 3-19 (e.g., organized in slice groupings) or encoded in accordance with one or more examples described with reference to FIGS. 20-26 (e.g., organized in pillar groups). The data that is encoded into the DS encoded data may be of any size and/or of any content. For example, the data may be one or more digital books, a copy of a company's emails, a large-scale Internet search, a video security file, one or more entertainment video files (e.g., television programs, movies, etc.), data files, and/or any other large amount of data (e.g., greater than a few Terabytes).

The tasks that are encoded into the DS encoded task code may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. The tasks may be encoded into the DS encoded task code in accordance with one or more examples described with reference to FIGS. 3-19 (e.g., organized in slice groupings) or encoded in accordance with one or more examples described with reference to FIGS. 20-26 (e.g., organized in pillar groups).

In an example of operation, a DST client module of a user device or of a DST processing unit issues a DST request to the DSTN module. The DST request may include a request to retrieve stored data, or a portion thereof, may include a request to store data that is included with the DST request, may include a request to perform one or more tasks on stored data, may include a request to perform one or more tasks on data included with the DST request, etc. In the cases where the DST request includes a request to store data or to retrieve data, the client module and/or the DSTN module processes the request as previously discussed with reference to one or more of FIGS. 3-19 (e.g., slice groupings) and/or 20-26 (e.g., pillar groupings). In the case where the DST request includes a request to perform one or more tasks on data included with the DST request, the DST client module and/or the DSTN module process the DST request as previously discussed with reference to one or more of FIGS. 3-19.

In the case where the DST request includes a request to perform one or more tasks on stored data, the DST client module and/or the DSTN module processes the DST request as will be described with reference to one or more of FIGS. 28-39. In general, the DST client module identifies data and one or more tasks for the DSTN module to execute upon the identified data. The DST request may be for a one-time execution of the task or for an on-going execution of the task. As an example of the latter, as a company generates daily emails, the DST request may be to daily search new emails for inappropriate content and, if found, record the content, the email sender(s), the email recipient(s), email routing information, notify human resources of the identified email, etc.

Figure 28:
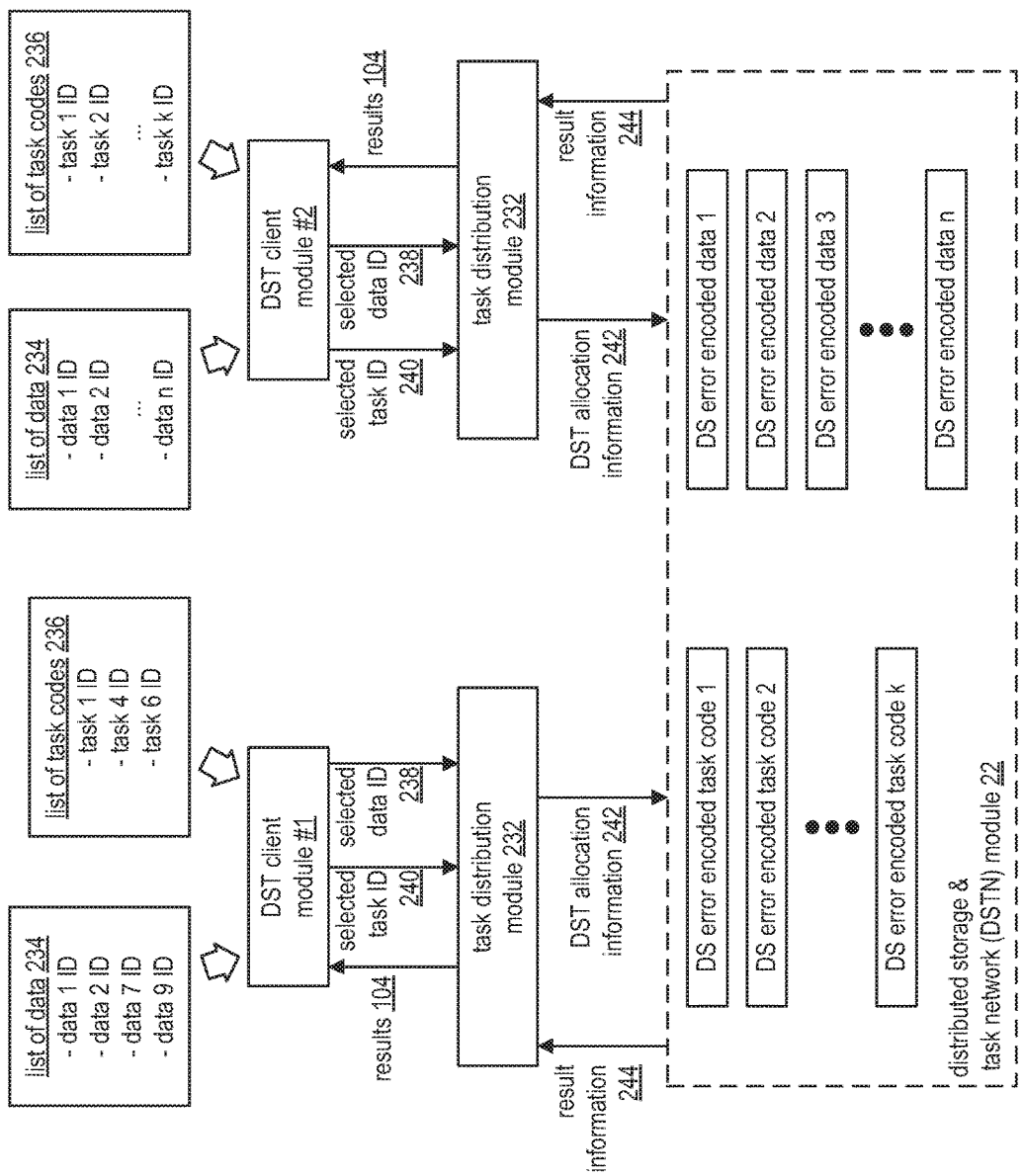
FIG. 28 is a schematic block diagram of an example of the distributed computing system performing tasks on stored data in accordance with the present invention.

FIG. 28 is a schematic block diagram of an example of a distributed computing system performing tasks on stored data. In this example, two distributed storage and task (DST) client modules 1-2 are shown: the first may be associated with a user device and the second may be associated with a DST processing unit or a high priority user device (e.g., high priority clearance user, system administrator, etc.). Each DST client module includes a list of stored data 234 and a list of tasks codes 236. The list of stored data 234 includes one or more entries of data identifying information, where each entry identifies data stored in the DSTN module 22. The data identifying information (e.g., data ID) includes one or more of a data file name, a data file directory listing, DSTN addressing information of the data, a data object identifier, etc. The list of tasks 236 includes one or more entries of task code identifying information, when each entry identifies task codes stored in the DSTN module 22. The task code identifying information (e.g., task ID) includes one or more of a task file name, a task file directory listing, DSTN addressing information of the task, another type of identifier to identify the task, etc.

As shown, the list of data 234 and the list of tasks 236 are each smaller in number of entries for the first DST client module than the corresponding lists of the second DST client module. This may occur because the user device associated with the first DST client module has fewer privileges in the distributed computing system than the device associated with the second DST client module. Alternatively, this may occur because the user device associated with the first DST client module serves fewer users than the device associated with the second DST client module and is restricted by the distributed computing system accordingly. As yet another alternative, this may occur through no restraints by the distributed computing system, it just occurred because the operator of the user device associated with the first DST client module has selected fewer data and/or fewer tasks than the operator of the device associated with the second DST client module.

In an example of operation, the first DST client module selects one or more data entries 238 and one or more tasks 240 from its respective lists (e.g., selected data ID and selected task ID). The first DST client module sends its selections to a task distribution module 232. The task distribution module 232 may be within a stand-alone device of the distributed computing system, may be within the user device that contains the first DST client module, or may be within the DSTN module 22.

Regardless of the task distribution module's location, it generates DST allocation information 242 from the selected task ID 240 and the selected data ID 238. The DST allocation information 242 includes data partitioning information, task execution information, and/or intermediate result information. The task distribution module 232 sends the DST allocation information 242 to the DSTN module 22. Note that one or more examples of the DST allocation information will be discussed with reference to one or more of FIGS. 29-39.

The DSTN module 22 interprets the DST allocation information 242 to identify the stored DS encoded data (e.g., DS error encoded data 2) and to identify the stored DS error encoded task code (e.g., DS error encoded task code 1). In addition, the DSTN module 22 interprets the DST allocation information 242 to determine how the data is to be partitioned and how the task is to be partitioned. The DSTN module 22 also determines whether the selected DS error encoded data 238 needs to be converted from pillar grouping to slice grouping. If so, the DSTN module 22 converts the selected DS error encoded data into slice groupings and stores the slice grouping DS error encoded data by overwriting the pillar grouping DS error encoded data or by storing it in a different location in the memory of the DSTN module 22 (i.e., does not overwrite the pillar grouping DS encoded data).

The DSTN module 22 partitions the data and the task as indicated in the DST allocation information 242 and sends the portions to selected DST execution units of the DSTN module 22. Each of the selected DST execution units performs its partial task(s) on its slice groupings to produce partial results. The DSTN module 22 collects the partial results from the selected DST execution units and provides them, as result information 244, to the task distribution module. The result information 244 may be the collected partial results, one or more final results as produced by the DSTN module 22 from processing the partial results in accordance with the DST allocation information 242, or one or more intermediate results as produced by the DSTN module 22 from processing the partial results in accordance with the DST allocation information 242.

The task distribution module 232 receives the result information 244 and provides one or more final results 104 therefrom to the first DST client module. The final result(s) 104 may be result information 244 or a result(s) of the task distribution module's processing of the result information 244.

In concurrence with processing the selected task of the first DST client module, the distributed computing system may process the selected task(s) of the second DST client module on the selected data(s) of the second DST client module. Alternatively, the distributed computing system may process the second DST client module's request subsequent to, or preceding, that of the first DST client module. Regardless of the ordering and/or parallel processing of the DST client module requests, the second DST client module provides its selected data 238 and selected task 240 to a task distribution module 232. If the task distribution module 232 is a separate device of the distributed computing system or within the DSTN module, the task distribution modules 232 coupled to the first and second DST client modules may be the same module. The task distribution module 232 processes the request of the second DST client module in a similar manner as it processed the request of the first DST client module.

Figure 29:
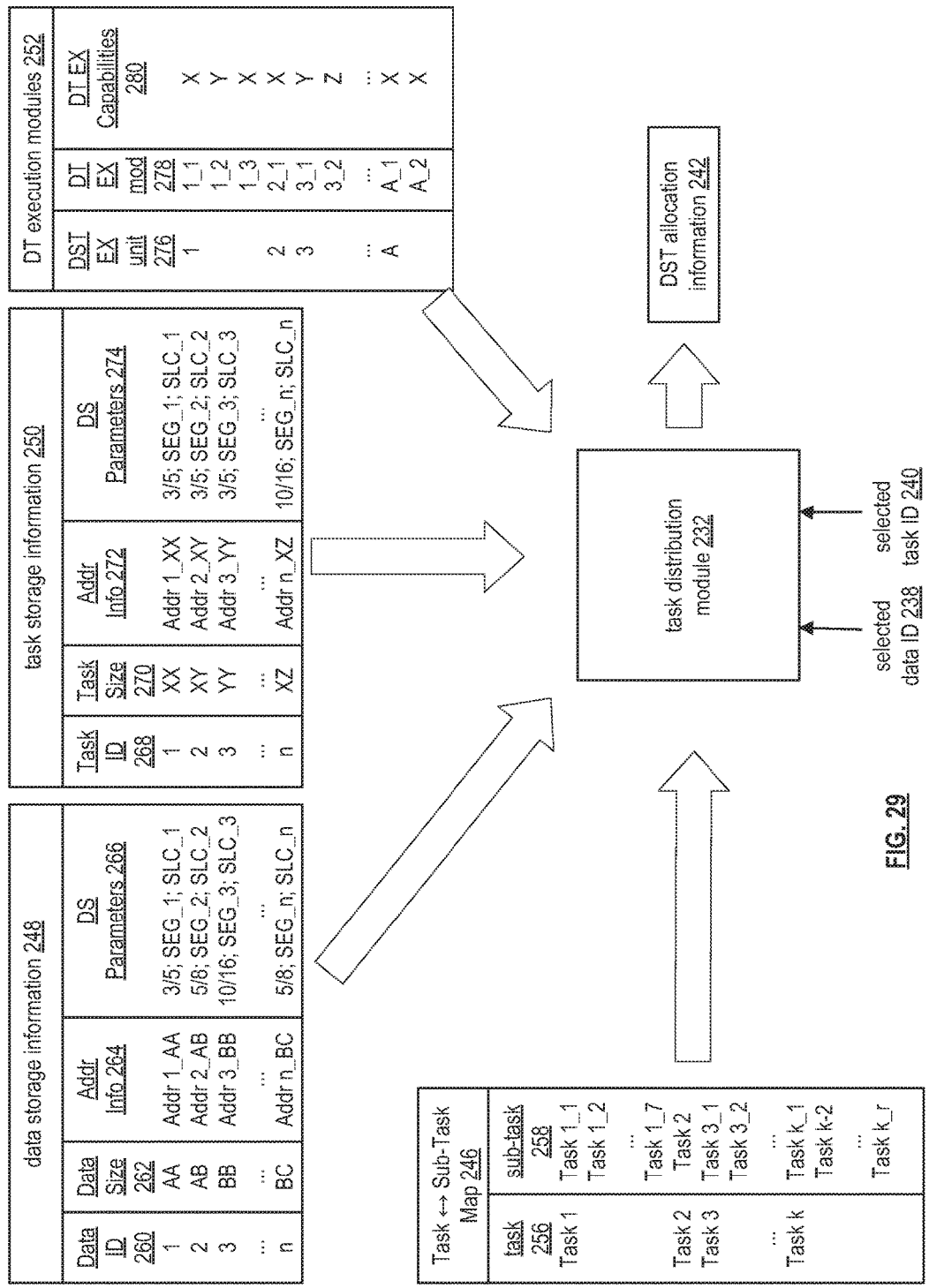
FIG. 29 is a schematic block diagram of an embodiment of a task distribution module facilitating the example of FIG. 28 in accordance with the present invention.

FIG. 29 is a schematic block diagram of an embodiment of a task distribution module 232 facilitating the example of FIG. 28. The task distribution module 232 includes a plurality of tables it uses to generate distributed storage and task (DST) allocation information 242 for selected data and selected tasks received from a DST client module. The tables include data storage information 248, task storage information 250, distributed task (DT) execution module information 252, and task ⇔ sub-task mapping information 246.

The data storage information table 248 includes a data identification (ID) field 260, a data size field 262, an addressing information field 264, distributed storage (DS) information 266, and may further include other information regarding the data, how it is stored, and/or how it can be processed. For example, DS encoded data #1 has a data ID of 1, a data size of AA (e.g., a byte size of a few Terabytes or more), addressing information of Addr_1_AA, and DS parameters of 3/5; SEG_1; and SLC_1. In this example, the addressing information may be a virtual address corresponding to the virtual address of the first storage word (e.g., one or more bytes) of the data and information on how to calculate the other addresses, may be a range of virtual addresses for the storage words of the data, physical addresses of the first storage word or the storage words of the data, may be a list of slice names of the encoded data slices of the data, etc. The DS parameters may include identity of an error encoding scheme, decode threshold/pillar width (e.g., 3/5 for the first data entry), segment security information (e.g., SEG_1), per slice security information (e.g., SLC_1), and/or any other information regarding how the data was encoded into data slices.

The task storage information table 250 includes a task identification (ID) field 268, a task size field 270, an addressing information field 272, distributed storage (DS) information 274, and may further include other information regarding the task, how it is stored, and/or how it can be used to process data. For example, DS encoded task #2 has a task ID of 2, a task size of XY, addressing information of Addr_2_XY, and DS parameters of 3/5; SEG_2; and SLC_2. In this example, the addressing information may be a virtual address corresponding to the virtual address of the first storage word (e.g., one or more bytes) of the task and information on how to calculate the other addresses, may be a range of virtual addresses for the storage words of the task, physical addresses of the first storage word or the storage words of the task, may be a list of slices names of the encoded slices of the task code, etc. The DS parameters may include identity of an error encoding scheme, decode threshold/pillar width (e.g., 3/5 for the first data entry), segment security information (e.g., SEG_2), per slice security information (e.g., SLC_2), and/or any other information regarding how the task was encoded into encoded task slices. Note that the segment and/or the per-slice security information include a type of encryption (if enabled), a type of compression (if enabled), watermarking information (if enabled), and/or an integrity check scheme (if enabled).

The task ⇔ sub-task mapping information table 246 includes a task field 256 and a sub-task field 258. The task field 256 identifies a task stored in the memory of a distributed storage and task network (DSTN) module and the corresponding sub-task fields 258 indicates whether the task includes sub-tasks and, if so, how many and if any of the sub-tasks are ordered. In this example, the task ⇔ sub-task mapping information table 246 includes an entry for each task stored in memory of the DSTN module (e.g., task 1 through task k). In particular, this example indicates that task 1 includes 7 sub-tasks; task 2 does not include sub-tasks, and task k includes r number of sub-tasks (where r is an integer greater than or equal to two).

The DT execution module table 252 includes a DST execution unit ID field 276, a DT execution module ID field 278, and a DT execution module capabilities field 280. The DST execution unit ID field 276 includes the identity of DST units in the DSTN module. The DT execution module ID field 278 includes the identity of each DT execution unit in each DST unit. For example, DST unit 1 includes three DT executions modules (e.g., 1_1, 1_2, and 1_3). The DT execution capabilities field 280 includes identity of the capabilities of the corresponding DT execution unit. For example, DT execution module 1_1 includes capabilities X, where X includes one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.), and/or any information germane to executing one or more tasks.

From these tables, the task distribution module 232 generates the DST allocation information 242 to indicate where the data is stored, how to partition the data, where the task is stored, how to partition the task, which DT execution units should perform which partial task on which data partitions, where and how intermediate results are to be stored, etc. If multiple tasks are being performed on the same data or different data, the task distribution module factors such information into its generation of the DST allocation information.

Figure 30:
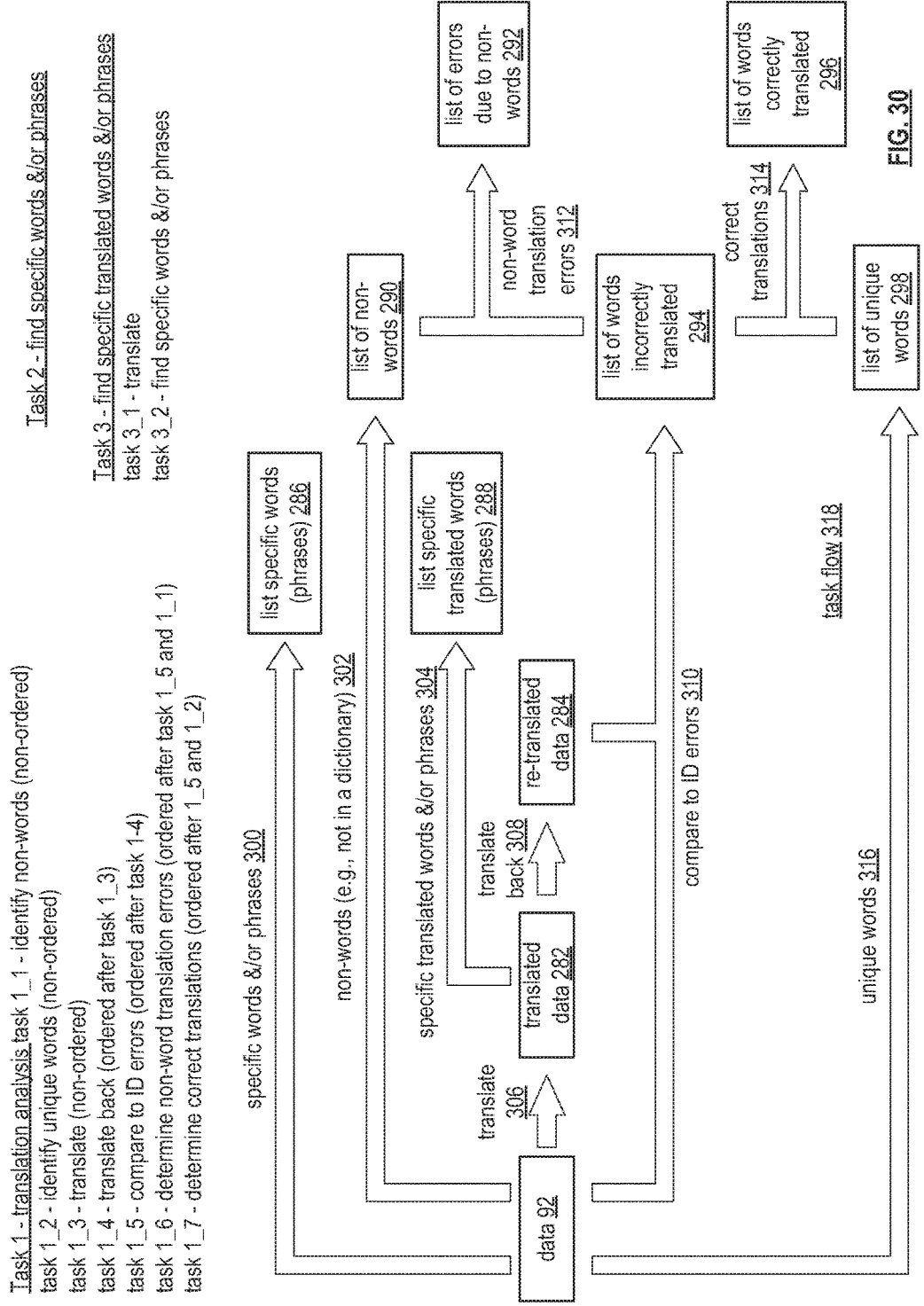
FIG. 30 is a diagram of a specific example of the distributed computing system performing tasks on stored data in accordance with the present invention.

FIG. 30 is a diagram of a specific example of a distributed computing system performing tasks on stored data as a task flow 318. In this example, selected data 92 is data 2 and selected tasks are tasks 1, 2, and 3. Task 1 corresponds to analyzing translation of data from one language to another (e.g., human language or computer language); task 2 corresponds to finding specific words and/or phrases in the data; and task 3 corresponds to finding specific translated words and/or phrases in translated data.

In this example, task 1 includes 7 sub-tasks: task 1_1—identify non-words (non-ordered); task 1_2—identify unique words (non-ordered); task 1_3—translate (non-ordered); task 1_4—translate back (ordered after task 1_3); task 1_5—compare to ID errors (ordered after task 1-4); task 1_6—determine non-word translation errors (ordered after task 1_5 and 1_1); and task 1_7—determine correct translations (ordered after 1_5 and 1_2). The sub-task further indicates whether they are an ordered task (i.e., are dependent on the outcome of another task) or non-order (i.e., are independent of the outcome of another task). Task 2 does not include sub-tasks and task 3 includes two sub-tasks: task 3_1 translate; and task 3_2 find specific word or phrase in translated data.

In general, the three tasks collectively are selected to analyze data for translation accuracies, translation errors, translation anomalies, occurrence of specific words or phrases in the data, and occurrence of specific words or phrases on the translated data. Graphically, the data 92 is translated 306 into translated data 282; is analyzed for specific words and/or phrases 300 to produce a list of specific words and/or phrases 286; is analyzed for non-words 302 (e.g., not in a reference dictionary) to produce a list of non-words 290; and is analyzed for unique words 316 included in the data 92 (i.e., how many different words are included in the data) to produce a list of unique words 298. Each of these tasks is independent of each other and can therefore be processed in parallel if desired.

The translated data 282 is analyzed (e.g., sub-task 3_2) for specific translated words and/or phrases 304 to produce a list of specific translated words and/or phrases 288. The translated data 282 is translated back 308 (e.g., sub-task 1_4) into the language of the original data to produce re-translated data 284. These two tasks are dependent on the translate task (e.g., task 1_3) and thus must be ordered after the translation task, which may be in a pipelined ordering or a serial ordering. The re-translated data 284 is then compared 310 with the original data 92 to find words and/or phrases that did not translate (one way and/or the other) properly to produce a list of incorrectly translated words 294. As such, the comparing task (e.g., sub-task 1_5) 310 is ordered after the translation 306 and re-translation tasks 308 (e.g., sub-tasks 1_3 and 1_4).

The list of words incorrectly translated 294 is compared 312 to the list of non-words 290 to identify words that were not properly translated because the words are non-words to produce a list of errors due to non-words 292. In addition, the list of words incorrectly translated 294 is compared 314 to the list of unique words 298 to identify unique words that were properly translated to produce a list of correctly translated words 296. The comparison may also identify unique words that were not properly translated to produce a list of unique words that were not properly translated. Note that each list of words (e.g., specific words and/or phrases, non-words, unique words, translated words and/or phrases, etc.,) may include the word and/or phrase, how many times it is used, where in the data it is used, and/or any other information requested regarding a word and/or phrase.

Figure 31:
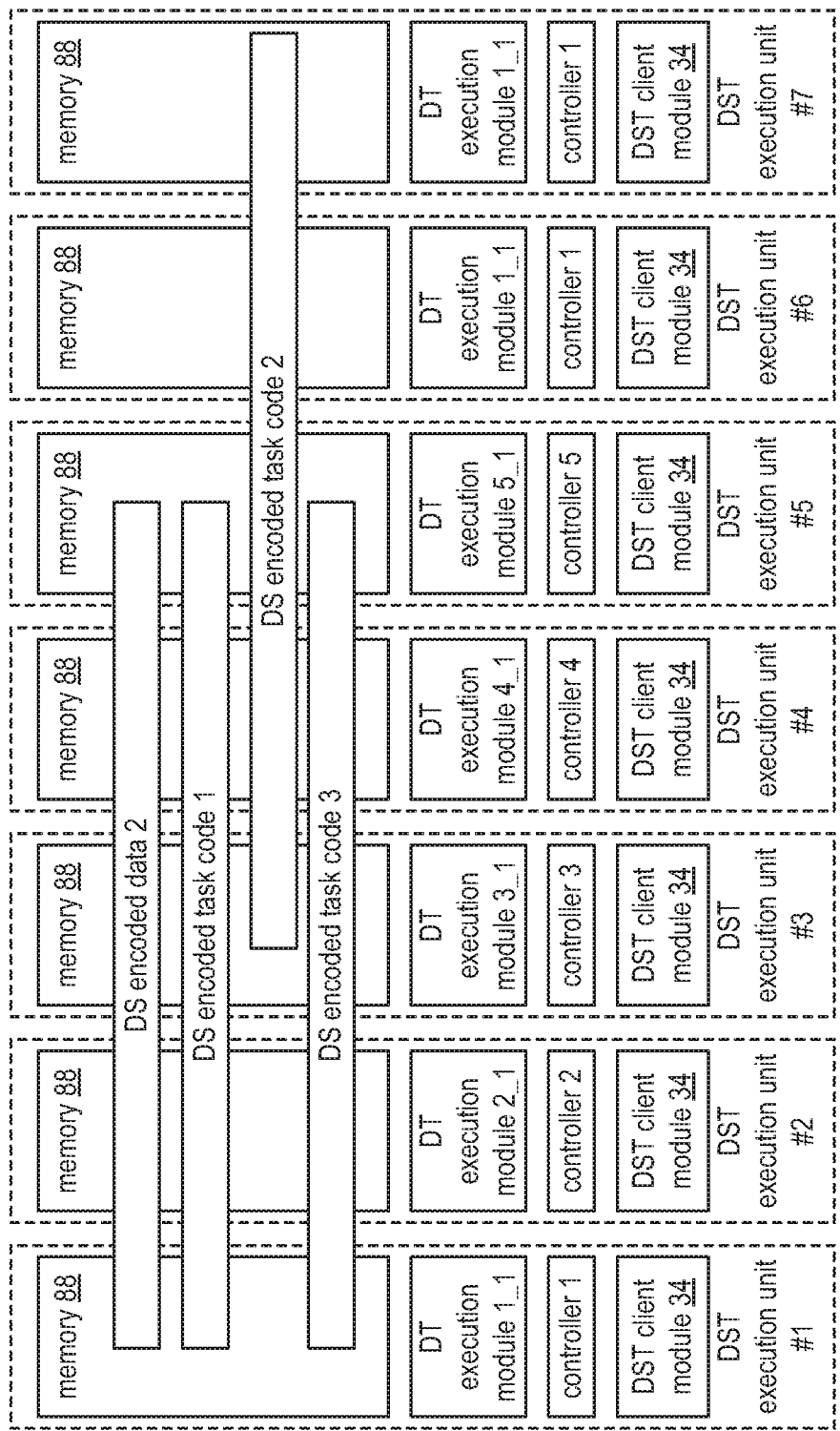
FIG. 31 is a schematic block diagram of an example of a distributed storage and task processing network (DSTN) module storing data and task codes for the example of FIG. 30 in accordance with the present invention.

FIG. 31 is a schematic block diagram of an example of a distributed storage and task processing network (DSTN) module storing data and task codes for the example of FIG. 30. As shown, DS encoded data 2 is stored as encoded data slices across the memory (e.g., stored in memories 88) of DST execution units 1-5; the DS encoded task code 1 (of task 1) and DS encoded task 3 are stored as encoded task slices across the memory of DST execution units 1-5; and DS encoded task code 2 (of task 2) is stored as encoded task slices across the memory of DST execution units 3-7. As indicated in the data storage information table and the task storage information table of FIG. 29, the respective data/task has DS parameters of 3/5 for their decode threshold/pillar width; hence spanning the memory of five DST execution units.

FIG. 32 is a diagram of an example of distributed storage and task (DST) allocation information 242 for the example of FIG. 30. The DST allocation information 242 includes data partitioning information 320, task execution information 322, and intermediate result information 324. The data partitioning information 320 includes the data identifier (ID), the number of partitions to split the data into, address information for each data partition, and whether the DS encoded data has to be transformed from pillar grouping to slice grouping. The task execution information 322 includes tabular information having a task identification field 326, a task ordering field 328, a data partition field ID 330, and a set of DT execution modules 332 to use for the distributed task processing per data partition. The intermediate result information 324 includes tabular information having a name ID field 334, an ID of the DST execution unit assigned to process the corresponding intermediate result 336, a scratch pad storage field 338, and an intermediate result storage field 340.

Continuing with the example of FIG. 30, where tasks 1-3 are to be distributedly performed on data 2, the data partitioning information includes the ID of data 2. In addition, the task distribution module determines whether the DS encoded data 2 is in the proper format for distributed computing (e.g., was stored as slice groupings). If not, the task distribution module indicates that the DS encoded data 2 format needs to be changed from the pillar grouping format to the slice grouping format, which will be done by the DSTN module. In addition, the task distribution module determines the number of partitions to divide the data into (e.g., 2_1 through 2_z) and addressing information for each partition.

The task distribution module generates an entry in the task execution information section for each sub-task to be performed. For example, task 1_1 (e.g., identify non-words on the data) has no task ordering (i.e., is independent of the results of other sub-tasks), is to be performed on data partitions 2_1 through 2_z by DT execution modules 1_1, 2_1, 3_1, 4_1, and 5_1. For instance, DT execution modules 1_1, 2_1, 3_1, 4_1, and 5_1 search for non-words in data partitions 2_1 through 2_z to produce task 1_1 intermediate results (R1-1, which is a list of non-words). Task 1_2 (e.g., identify unique words) has similar task execution information as task 1_1 to produce task 1_2 intermediate results (R1-2, which is the list of unique words). Task 1_3 (e.g., translate) includes task execution information as being non-ordered (i.e., is independent), having DT execution modules 1_1, 2_1, 3_1, 4_1, and 5_1 translate data partitions 2_1 through 2_4 and having DT execution modules 1_2, 2_2, 3_2, 4_2, and 5_2 translate data partitions 2_5 through 2_z to produce task 1_3 intermediate results (R1-3, which is the translated data). In this example, the data partitions are grouped, where different sets of DT execution modules perform a distributed sub-task (or task) on each data partition group, which allows for further parallel processing.

Task 1_4 (e.g., translate back) is ordered after task 1_3 and is to be executed on task 1_3's intermediate result (e.g., R1-3_1) (e.g., the translated data). DT execution modules 1_1, 2_1, 3_1, 4_1, and 5_1 are allocated to translate back task 1_3 intermediate result partitions R1-3_1 through R1-3_4 and DT execution modules 1_2, 2_2, 6_1, 7_1, and 7_2 are allocated to translate back task 1_3 intermediate result partitions R1-3_5 through R1-3_z to produce task 1-4 intermediate results (R1-4, which is the translated back data).

Task 1_5 (e.g., compare data and translated data to identify translation errors) is ordered after task 1_4 and is to be executed on task 1_4's intermediate results (R4-1) and on the data. DT execution modules 1_1, 2_1, 3_1, 4_1, and 5_1 are allocated to compare the data partitions (2_1 through 2_z) with partitions of task 1-4 intermediate results partitions R1-4_1 through R1-4_z to produce task 1_5 intermediate results (R1-5, which is the list words translated incorrectly).

Task 1_6 (e.g., determine non-word translation errors) is ordered after tasks 1_1 and 1_5 and is to be executed on tasks 1_1's and 1_5's intermediate results (R1-1 and R1-5). DT execution modules 1_1, 2_1, 3_1, 4_1, and 5_1 are allocated to compare the partitions of task 1_1 intermediate results (R1-1_1 through R1-1_z) with partitions of task 1-5 intermediate results partitions (R1-5_1 through R1-5_z) to produce task 1_6 intermediate results (R1-6, which is the list translation errors due to non-words).

Task 1_7 (e.g., determine words correctly translated) is ordered after tasks 1_2 and 1_5 and is to be executed on tasks 1_2's and 1_5's intermediate results (R1-1 and R1-5). DT execution modules 1_2, 2_2, 3_2, 4_2, and 5_2 are allocated to compare the partitions of task 1_2 intermediate results (R1-2_1 through R1-2_z) with partitions of task 1-5 intermediate results partitions (R1-5_1 through R1-5_z) to produce task 1_7 intermediate results (R1-7, which is the list of correctly translated words).

Task 2 (e.g., find specific words and/or phrases) has no task ordering (i.e., is independent of the results of other sub-tasks), is to be performed on data partitions 2_1 through 2_z by DT execution modules 3_1, 4_1, 5_1, 6_1, and 7_1. For instance, DT execution modules 3_1, 4_1, 5_1, 6_1, and 7_1 search for specific words and/or phrases in data partitions 2_1 through 2_z to produce task 2 intermediate results (R2, which is a list of specific words and/or phrases).

Task 3_2 (e.g., find specific translated words and/or phrases) is ordered after task 1_3 (e.g., translate) is to be performed on partitions R1-3_1 through R1-3_z by DT execution modules 1_2, 2_2, 3_2, 4_2, and 5_2. For instance, DT execution modules 1_2, 2_2, 3_2, 4_2, and 5_2 search for specific translated words and/or phrases in the partitions of the translated data (R1-3_1 through R1-3_z) to produce task 3_2 intermediate results (R3-2, which is a list of specific translated words and/or phrases).

For each task, the intermediate result information indicates which DST unit is responsible for overseeing execution of the task and, if needed, processing the partial results generated by the set of allocated DT execution units. In addition, the intermediate result information indicates a scratch pad memory for the task and where the corresponding intermediate results are to be stored. For example, for intermediate result R1-1 (the intermediate result of task 1_1), DST unit 1 is responsible for overseeing execution of the task 1_1 and coordinates storage of the intermediate result as encoded intermediate result slices stored in memory of DST execution units 1-5. In general, the scratch pad is for storing non-DS encoded intermediate results and the intermediate result storage is for storing DS encoded intermediate results.

FIGS. 33-38 are schematic block diagrams of the distributed storage and task network (DSTN) module performing the example of FIG. 30. In FIG. 33, the DSTN module accesses the data 92 and partitions it into a plurality of partitions 1-z in accordance with distributed storage and task network (DST) allocation information. For each data partition, the DSTN identifies a set of its DT (distributed task) execution modules 90 to perform the task (e.g., identify non-words (i.e., not in a reference dictionary) within the data partition) in accordance with the DST allocation information. From data partition to data partition, the set of DT execution modules 90 may be the same, different, or a combination thereof (e.g., some data partitions use the same set while other data partitions use different sets).

For the first data partition, the first set of DT execution modules (e.g., 1_1, 2_1, 3_1, 4_1, and 5_1 per the DST allocation information of FIG. 32) executes task 1_1 to produce a first partial result 102 of non-words found in the first data partition. The second set of DT execution modules (e.g., 1_1, 2_1, 3_1, 4_1, and 5_1 per the DST allocation information of FIG. 32) executes task 1_1 to produce a second partial result 102 of non-words found in the second data partition. The sets of DT execution modules (as per the DST allocation information) perform task 1_1 on the data partitions until the "z" set of DT execution modules performs task 1_1 on the "zth" data partition to produce a "zth" partial result 102 of non-words found in the "zth" data partition.

As indicated in the DST allocation information of FIG. 32, DST execution unit 1 is assigned to process the first through "zth" partial results to produce the first intermediate result (R1-1), which is a list of non-words found in the data. For instance, each set of DT execution modules 90 stores its respective partial result in the scratchpad memory of DST execution unit 1 (which is identified in the DST allocation or may be determined by DST execution unit 1). A processing module of DST execution 1 is engaged to aggregate the first through "zth" partial results to produce the first intermediate result (e.g., R1_1). The processing module stores the first intermediate result as non-DS error encoded data in the scratchpad memory or in another section of memory of DST execution unit 1.

DST execution unit 1 engages its DST client module to slice grouping based DS error encode the first intermediate result (e.g., the list of non-words). To begin the encoding, the DST client module determines whether the list of non-words is of a sufficient size to partition (e.g., greater than a Terabyte). If yes, it partitions the first intermediate result (R1-1) into a plurality of partitions (e.g., R1-1_1 through R1-1_m). If the first intermediate result is not of sufficient size to partition, it is not partitioned.

For each partition of the first intermediate result, or for the first intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

In FIG. 34, the DSTN module is performing task 1_2 (e.g., find unique words) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_2 in accordance with the DST allocation information. From data partition to data partition, the set of DT execution modules may be the same, different, or a combination thereof. For the data partitions, the allocated set of DT execution modules executes task 1_2 to produce a partial results (e.g., $1^{st}$ through "zth") of unique words found in the data partitions.

As indicated in the DST allocation information of FIG. 32, DST execution unit 1 is assigned to process the first through "zth" partial results 102 of task 1_2 to produce the second intermediate result (R1-2), which is a list of unique words found in the data 92. The processing module of DST execution 1 is engaged to aggregate the first through "zth" partial results of unique words to produce the second intermediate result. The processing module stores the second intermediate result as non-DS error encoded data in the scratchpad memory or in another section of memory of DST execution unit 1.

DST execution unit 1 engages its DST client module to slice grouping based DS error encode the second intermediate result (e.g., the list of non-words). To begin encoding, the DST client module determines whether the list of unique words is of a sufficient size to partition (e.g., greater than a Terabyte). If yes, it partitions the second intermediate result (R1-2) into a plurality of partitions (e.g., R1-2_1 through R1-2_m). If the second intermediate result is not of sufficient size to partition, it is not partitioned.

For each partition of the second intermediate result, or for the second intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

In FIG. 35, the DSTN module is performing task 1_3 (e.g., translate) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_3 in accordance with the DST allocation information (e.g., DT execution modules 1_1, 2_1, 3_1, 4_1, and 5_1 translate data partitions 2_1 through 2_4 and DT execution modules 1_2, 2_2, 3_2, 4_2, and 5_2 translate data partitions 2_5 through 2_z). For the data partitions, the allocated set of DT execution modules 90 executes task 1_3 to produce partial results 102 (e.g., $1^{st}$ through "zth") of translated data.

As indicated in the DST allocation information of FIG. 32, DST execution unit 2 is assigned to process the first through "zth" partial results of task 1_3 to produce the third intermediate result (R1-3), which is translated data. The processing module of DST execution 2 is engaged to aggregate the first through "zth" partial results of translated data to produce the third intermediate result. The processing module stores the third intermediate result as non-DS error encoded data in the scratchpad memory or in another section of memory of DST execution unit 2.

DST execution unit 2 engages its DST client module to slice grouping based DS error encode the third intermediate result (e.g., translated data). To begin the encoding, the DST client module partitions the third intermediate result (R1-3) into a plurality of partitions (e.g., R1-3_1 through R1-3_y). For each partition of the third intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is further shown in FIG. 35, the DSTN module is performing task 1_4 (e.g., retranslate) on the translated data of the third intermediate result. To begin, the DSTN module accesses the translated data (from the scratchpad memory or from the intermediate result memory and decodes it) and partitions it into a plurality of partitions in accordance with the DST allocation information. For each partition of the third intermediate result, the DSTN identifies a set of its DT execution modules 90 to perform task 1_4 in accordance with the DST allocation information (e.g., DT execution modules 1_1, 2_1, 3_1, 4_1, and 5_1 are allocated to translate back partitions R1-3_1 through R1-3_4 and DT execution modules 1_2, 2_2, 6_1, 7_1, and 7_2 are allocated to translate back partitions R1-3_5 through R1-3_z). For the partitions, the allocated set of DT execution modules executes task 1_4 to produce partial results 102 (e.g., $1^{st}$ through "zth") of re-translated data.

As indicated in the DST allocation information of FIG. 32, DST execution unit 3 is assigned to process the first through "zth" partial results of task 1_4 to produce the fourth intermediate result (R1-4), which is retranslated data. The processing module of DST execution 3 is engaged to aggregate the first through "zth" partial results of retranslated data to produce the fourth intermediate result. The processing module stores the fourth intermediate result as non-DS error encoded data in the scratchpad memory or in another section of memory of DST execution unit 3.

DST execution unit 3 engages its DST client module to slice grouping based DS error encode the fourth intermediate result (e.g., retranslated data). To begin the encoding, the DST client module partitions the fourth intermediate result (R1-4) into a plurality of partitions (e.g., R1-4_1 through R1-4_z). For each partition of the fourth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

Figure 36:
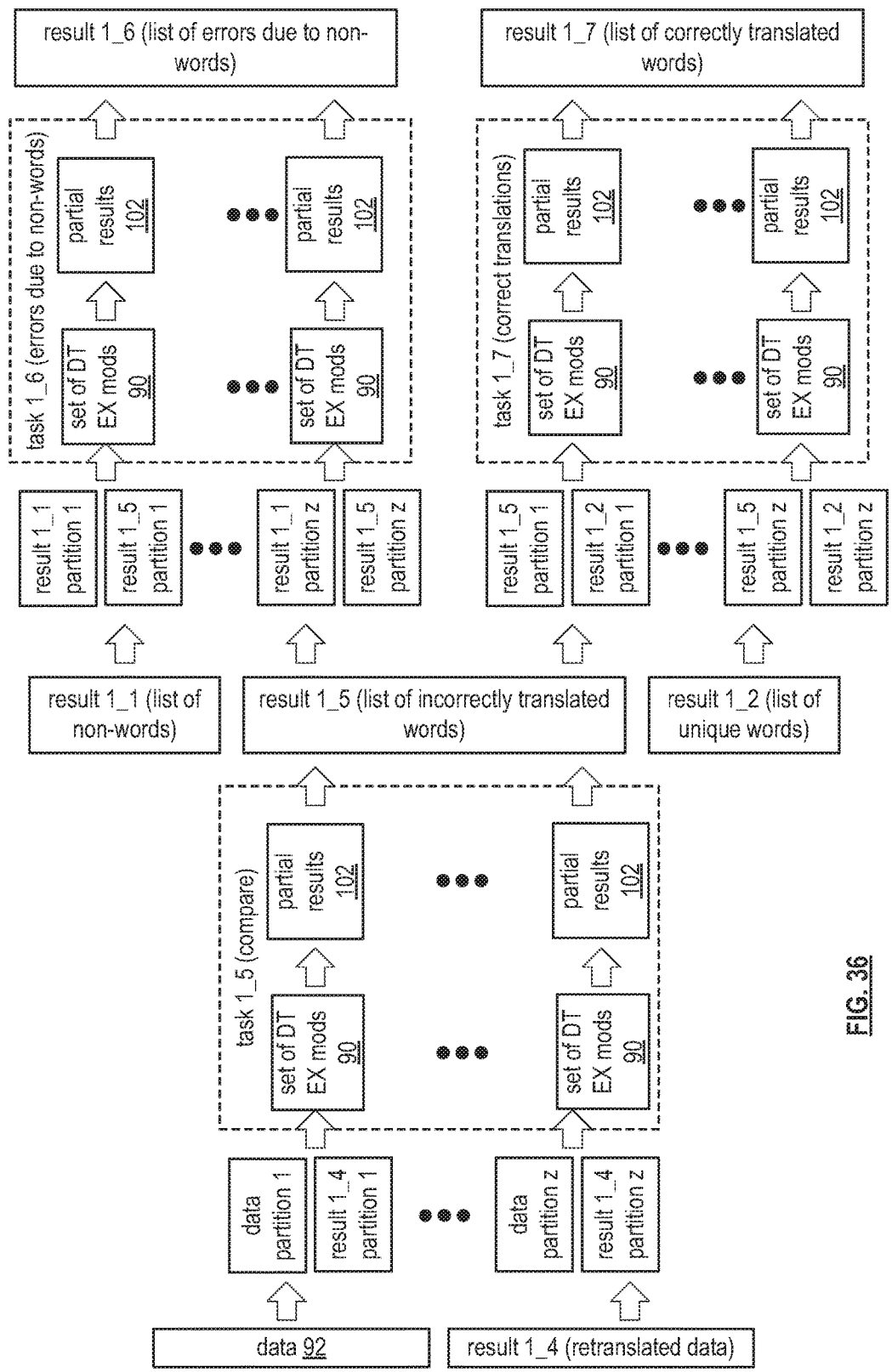

In FIG. 36, a distributed storage and task network (DSTN) module is performing task 1_5 (e.g., compare) on data 92 and retranslated data of FIG. 35. To begin, the DSTN module accesses the data 92 and partitions it into a plurality of partitions in accordance with the DST allocation information or it may use the data partitions of task 1_1 if the partitioning is the same. The DSTN module also accesses the retranslated data from the scratchpad memory, or from the intermediate result memory and decodes it, and partitions it into a plurality of partitions in accordance with the DST allocation information. The number of partitions of the retranslated data corresponds to the number of partitions of the data.

For each pair of partitions (e.g., data partition 1 and retranslated data partition 1), the DSTN identifies a set of its DT execution modules 90 to perform task 1_5 in accordance with the DST allocation information (e.g., DT execution modules 1_1, 2_1, 3_1, 4_1, and 5_1). For each pair of partitions, the allocated set of DT execution modules executes task 1_5 to produce partial results 102 (e.g., $1^{st}$ through "zth") of a list of incorrectly translated words and/or phrases.

As indicated in the DST allocation information of FIG. 32, DST execution unit 1 is assigned to process the first through "zth" partial results of task 1_5 to produce the fifth intermediate result (R1-5), which is the list of incorrectly translated words and/or phrases. In particular, the processing module of DST execution 1 is engaged to aggregate the first through "zth" partial results of the list of incorrectly translated words and/or phrases to produce the fifth intermediate result. The processing module stores the fifth intermediate result as non-DS error encoded data in the scratchpad memory or in another section of memory of DST execution unit 1.

DST execution unit 1 engages its DST client module to slice grouping based DS error encode the fifth intermediate result. To begin the encoding, the DST client module partitions the fifth intermediate result (R1-5) into a plurality of partitions (e.g., R1-5_1 through R1-5_z). For each partition of the fifth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5 per the DST allocation information).

As is further shown in FIG. 36, the DSTN module is performing task 1_6 (e.g., translation errors due to non-words) on the list of incorrectly translated words and/or phrases (e.g., the fifth intermediate result R1-5) and the list of non-words (e.g., the first intermediate result R1-1). To begin, the DSTN module accesses the lists and partitions them into a corresponding number of partitions.

For each pair of partitions (e.g., partition R1-1_1 and partition R1-5_1), the DSTN identifies a set of its DT execution modules 90 to perform task 1_6 in accordance with the DST allocation information (e.g., DT execution modules 1_1, 2_1, 3_1, 4_1, and 5_1). For each pair of partitions, the allocated set of DT execution modules executes task 1_6 to produce partial results 102 (e.g., $1^{st}$ through "zth") of a list of incorrectly translated words and/or phrases due to non-words.

As indicated in the DST allocation information of FIG. 32, DST execution unit 2 is assigned to process the first through "zth" partial results of task 1_6 to produce the sixth intermediate result (R1-6), which is the list of incorrectly translated words and/or phrases due to non-words. In particular, the processing module of DST execution 2 is engaged to aggregate the first through "zth" partial results of the list of incorrectly translated words and/or phrases due to non-words to produce the sixth intermediate result. The processing module stores the sixth intermediate result as non-DS error encoded data in the scratchpad memory or in another section of memory of DST execution unit 2.

DST execution unit 2 engages its DST client module to slice grouping based DS error encode the sixth intermediate result. To begin the encoding, the DST client module partitions the sixth intermediate result (R1-6) into a plurality of partitions (e.g., R1-6_1 through R1-6_z). For each partition of the sixth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is still further shown in FIG. 36, the DSTN module is performing task 1_7 (e.g., correctly translated words and/or phrases) on the list of incorrectly translated words and/or phrases (e.g., the fifth intermediate result R1-5) and the list of unique words (e.g., the second intermediate result R1-2). To begin, the DSTN module accesses the lists and partitions them into a corresponding number of partitions.

For each pair of partitions (e.g., partition R1-2_1 and partition R1-5_1), the DSTN identifies a set of its DT execution modules 90 to perform task 1_7 in accordance with the DST allocation information (e.g., DT execution modules 1_2, 2_2, 3_2, 4_2, and 5_2). For each pair of partitions, the allocated set of DT execution modules executes task 1_7 to produce partial results 102 (e.g., $1^{st}$ through "zth") of a list of correctly translated words and/or phrases.

As indicated in the DST allocation information of FIG. 32, DST execution unit 3 is assigned to process the first through "zth" partial results of task 1_7 to produce the seventh intermediate result (R1-7), which is the list of correctly translated words and/or phrases. In particular, the processing module of DST execution 3 is engaged to aggregate the first through "zth" partial results of the list of correctly translated words and/or phrases to produce the seventh intermediate result. The processing module stores the seventh intermediate result as non-DS error encoded data in the scratchpad memory or in another section of memory of DST execution unit 3.

DST execution unit 3 engages its DST client module to slice grouping based DS error encode the seventh intermediate result. To begin the encoding, the DST client module partitions the seventh intermediate result (R1-7) into a plurality of partitions (e.g., R1-7_1 through R1-7_z). For each partition of the seventh intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

In FIG. 37, the distributed storage and task network (DSTN) module is performing task 2 (e.g., find specific words and/or phrases) on the data 92. To begin, the DSTN module accesses the data and partitions it into a plurality of partitions 1-z in accordance with the DST allocation information or it may use the data partitions of task 1_1 if the partitioning is the same. For each data partition, the DSTN identifies a set of its DT execution modules 90 to perform task 2 in accordance with the DST allocation information. From data partition to data partition, the set of DT execution modules may be the same, different, or a combination thereof. For the data partitions, the allocated set of DT execution modules executes task 2 to produce partial results 102 (e.g., $1^{st}$ through "zth") of specific words and/or phrases found in the data partitions.

As indicated in the DST allocation information of FIG. 32, DST execution unit 7 is assigned to process the first through "zth" partial results of task 2 to produce task 2 intermediate result (R2), which is a list of specific words and/or phrases found in the data. The processing module of DST execution 7 is engaged to aggregate the first through "zth" partial results of specific words and/or phrases to produce the task 2 intermediate result. The processing module stores the task 2 intermediate result as non-DS error encoded data in the scratchpad memory or in another section of memory of DST execution unit 7.

DST execution unit 7 engages its DST client module to slice grouping based DS error encode the task 2 intermediate result. To begin the encoding, the DST client module determines whether the list of specific words and/or phrases is of a sufficient size to partition (e.g., greater than a Terabyte). If yes, it partitions the task 2 intermediate result (R2) into a plurality of partitions (e.g., R2_1 through R2_m). If the task 2 intermediate result is not of sufficient size to partition, it is not partitioned.

For each partition of the task 2 intermediate result, or for the task 2 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, and 7).

In FIG. 38, the distributed storage and task network (DSTN) module is performing task 3 (e.g., find specific translated words and/or phrases) on the translated data (R1-3). To begin, the DSTN module accesses the translated data (from the scratchpad memory or from the intermediate result memory and decodes it) and partitions it into a plurality of partitions in accordance with the DST allocation information. For each partition, the DSTN identifies a set of its DT execution modules to perform task 3 in accordance with the DST allocation information. From partition to partition, the set of DT execution modules may be the same, different, or a combination thereof. For the partitions, the allocated set of DT execution modules 90 executes task 3 to produce partial results 102 (e.g., $1^{st}$ through "zth") of specific translated words and/or phrases found in the data partitions.

As indicated in the DST allocation information of FIG. 32, DST execution unit 5 is assigned to process the first through "zth" partial results of task 3 to produce task 3 intermediate result (R3), which is a list of specific translated words and/or phrases found in the translated data. In particular, the processing module of DST execution 5 is engaged to aggregate the first through "zth" partial results of specific translated words and/or phrases to produce the task 3 intermediate result. The processing module stores the task 3 intermediate result as non-DS error encoded data in the scratchpad memory or in another section of memory of DST execution unit 7.

DST execution unit 5 engages its DST client module to slice grouping based DS error encode the task 3 intermediate result. To begin the encoding, the DST client module determines whether the list of specific translated words and/or phrases is of a sufficient size to partition (e.g., greater than a Terabyte). If yes, it partitions the task 3 intermediate result (R3) into a plurality of partitions (e.g., R3_1 through R3_m). If the task 3 intermediate result is not of sufficient size to partition, it is not partitioned.

For each partition of the task 3 intermediate result, or for the task 3 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, 5, and 7).

FIG. 39 is a diagram of an example of combining result information into final results 104 for the example of FIG. 30. In this example, the result information includes the list of specific words and/or phrases found in the data (task 2 intermediate result), the list of specific translated words and/or phrases found in the data (task 3 intermediate result), the list of non-words found in the data (task 1 first intermediate result R1-1), the list of unique words found in the data (task 1 second intermediate result R1-2), the list of translation errors due to non-words (task 1 sixth intermediate result R1-6), and the list of correctly translated words and/or phrases (task 1 seventh intermediate result R1-7). The task distribution module provides the result information to the requesting DST client module as the results 104.

Figure 40A:
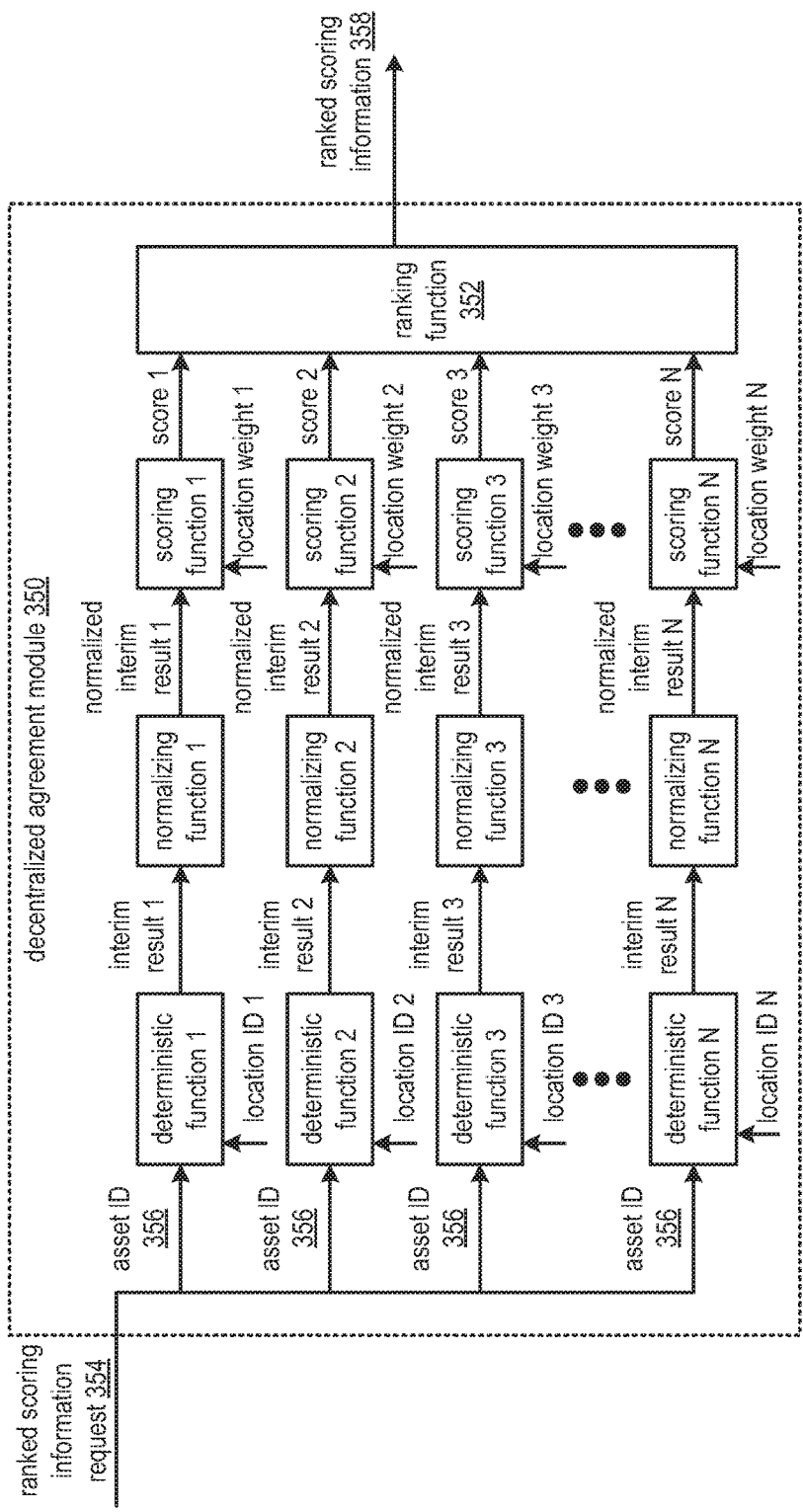
FIG. 40A is a schematic block diagram of an embodiment of a decentralized agreement module in accordance with the present invention.

FIG. 40A is a schematic block diagram of an embodiment of a decentralized agreement module 350 that includes a set of deterministic functions 1-N, a set of normalizing functions 1-N, a set of scoring functions 1-N, and a ranking function 352. Each of the deterministic function, the normalizing function, the scoring function, and the ranking function 352, may be implemented utilizing the processing module 84 of FIG. 3. The decentralized agreement module 350 may be implemented utilizing any module and/or unit of a dispersed storage network (DSN). For example, the decentralized agreement module is implemented utilizing the distributed storage and task (DST) client module 34 of FIG. 1.

The decentralized agreement module 350 functions to receive a ranked scoring information request 354 and to generate ranked scoring information 358 based on the ranked scoring information request 354 and other information. The ranked scoring information request 354 includes one or more of an asset identifier (ID) 356 of an asset associated with the request, an asset type indicator, one or more location identifiers of locations associated with the DSN, one or more corresponding location weights, and a requesting entity ID. The asset includes any portion of data associated with the DSN including one or more asset types including a data object, a data record, an encoded data slice, a data segment, a set of encoded data slices, and a plurality of sets of encoded data slices. As such, the asset ID 356 of the asset includes one or more of a data name, a data record identifier, a source name, a slice name, and a plurality of sets of slice names.

Each location of the DSN includes an aspect of a DSN resource. Examples of locations includes one or more of a storage unit, a memory device of the storage unit, a site, a storage pool of storage units, a pillar index associated with each encoded data slice of a set of encoded data slices generated by an information dispersal algorithm (IDA), a DST client module 34 of FIG. 1, a DST processing unit 16 of FIG. 1, a DST integrity processing unit 20 of FIG. 1, a DSTN managing unit 18 of FIG. 1, a user device 12 of FIG. 1, and a user device 14 of FIG. 1.

Each location is associated with a location weight based on one or more of a resource prioritization of utilization scheme and physical configuration of the DSN. The location weight includes an arbitrary bias which adjusts a proportion of selections to an associated location such that a probability that an asset will be mapped to that location is equal to the location weight divided by a sum of all location weights for all locations of comparison. For example, each storage pool of a plurality of storage pools is associated with a location weight based on storage capacity. For instance, storage pools with more storage capacity are associated with higher location weights than others. The other information may include a set of location identifiers and a set of location weights associated with the set of location identifiers. For example, the other information includes location identifiers and location weights associated with a set of memory devices of a storage unit when the requesting entity utilizes the decentralized agreement module 350 to produce ranked scoring information 358 with regards to selection of a memory device of the set of memory devices for accessing a particular encoded data slice (e.g., where the asset ID includes a slice name of the particular encoded data slice).

The decentralized agreement module 350 outputs substantially identical ranked scoring information for each ranked scoring information request that includes substantially identical content of the ranked scoring information request. For example, a first requesting entity issues a first ranked scoring information request to the decentralized agreement module 350 and receives first ranked scoring information. A second requesting entity issues a second ranked scoring information request to the decentralized agreement module and receives second ranked scoring information. The second ranked scoring information is substantially the same as the first ranked scoring information when the second ranked scoring information request is substantially the same as the first ranked scoring information request.

As such, two or more requesting entities may utilize the decentralized agreement module 350 to determine substantially identical ranked scoring information. As a specific example, the first requesting entity selects a first storage pool of a plurality of storage pools for storing a set of encoded data slices utilizing the decentralized agreement module 350 and the second requesting entity identifies the first storage pool of the plurality of storage pools for retrieving the set of encoded data slices utilizing the decentralized agreement module 350.

In an example of operation, the decentralized agreement module 350 receives the ranked scoring information request 354. Each deterministic function performs a deterministic function on a combination and/or concatenation (e.g., add, append, interleave) of the asset ID 356 of the ranked scoring information request 354 and an associated location ID of the set of location IDs to produce an interim result. The deterministic function includes at least one of a hashing function, a hash-based message authentication code function, a mask generating function, a cyclic redundancy code function, hashing module of a number of locations, consistent hashing, rendezvous hashing, and a sponge function. As a specific example, deterministic function 2 appends a location ID 2 of a storage pool 2 to a source name as the asset ID to produce a combined value and performs the mask generating function on the combined value to produce interim result 2.

With a set of interim results 1-N, each normalizing function performs a normalizing function on a corresponding interim result to produce a corresponding normalized interim result. The performing of the normalizing function includes dividing the interim result by a number of possible permutations of the output of the deterministic function to produce the normalized interim result. For example, normalizing function 2 performs the normalizing function on the interim result 2 to produce a normalized interim result 2.

With a set of normalized interim results 1-N, each scoring function performs a scoring function on a corresponding normalized interim result to produce a corresponding score. The performing of the scoring function includes dividing an associated location weight by a negative log of the normalized interim result. For example, scoring function 2 divides location weight 2 of the storage pool 2 (e.g., associated with location ID 2) by a negative log of the normalized interim result 2 to produce a score 2.

With a set of scores 1-N, the ranking function 352 performs a ranking function on the set of scores 1-N to generate the ranked scoring information 358. The ranking function includes rank ordering each score with other scores of the set of scores 1-N, where a highest score is ranked first. As such, a location associated with the highest score may be considered a highest priority location for resource utilization (e.g., accessing, storing, retrieving, etc., the given asset of the request). Having generated the ranked scoring information 358, the decentralized agreement module 350 outputs the ranked scoring information 358 to the requesting entity.

Figure 40B:
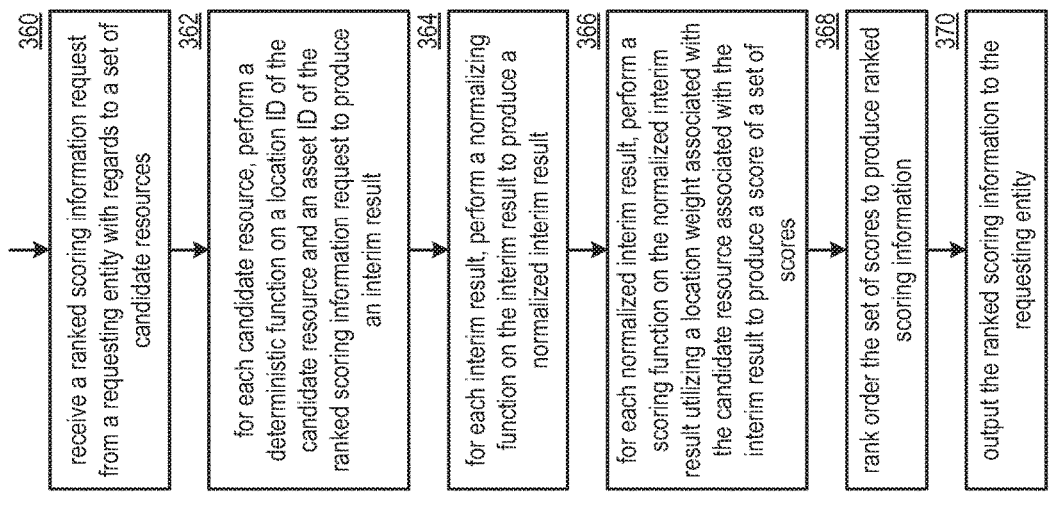
FIG. 40B is a flowchart illustrating an example of selecting the resource in accordance with the present invention.

FIG. 40B is a flowchart illustrating an example of selecting a resource. The method begins or continues at step 360 where a processing module (e.g., of a decentralized agreement module) receives a ranked scoring information request from a requesting entity with regards to a set of candidate resources. For each candidate resource, the method continues at step 362 where the processing module performs a deterministic function on a location identifier (ID) of the candidate resource and an asset ID of the ranked scoring information request to produce an interim result. As a specific example, the processing module combines the asset ID and the location ID of the candidate resource to produce a combined value and performs a hashing function on the combined value to produce the interim result.

For each interim result, the method continues at step 364 where the processing module performs a normalizing function on the interim result to produce a normalized interim result. As a specific example, the processing module obtains a permutation value associated with the deterministic function (e.g., maximum number of permutations of output of the deterministic function) and divides the interim result by the permutation value to produce the normalized interim result (e.g., with a value between 0 and 1).

For each normalized interim result, the method continues at step 366 where the processing module performs a scoring function on the normalized interim result utilizing a location weight associated with the candidate resource associated with the interim result to produce a score of a set of scores. As a specific example, the processing module divides the location weight by a negative log of the normalized interim result to produce the score.

The method continues at step 368 where the processing module rank orders the set of scores to produce ranked scoring information (e.g., ranking a highest value first). The method continues at step 370 where the processing module outputs the ranked scoring information to the requesting entity. The requesting entity may utilize the ranked scoring information to select one location of a plurality of locations.

Figure 40C:
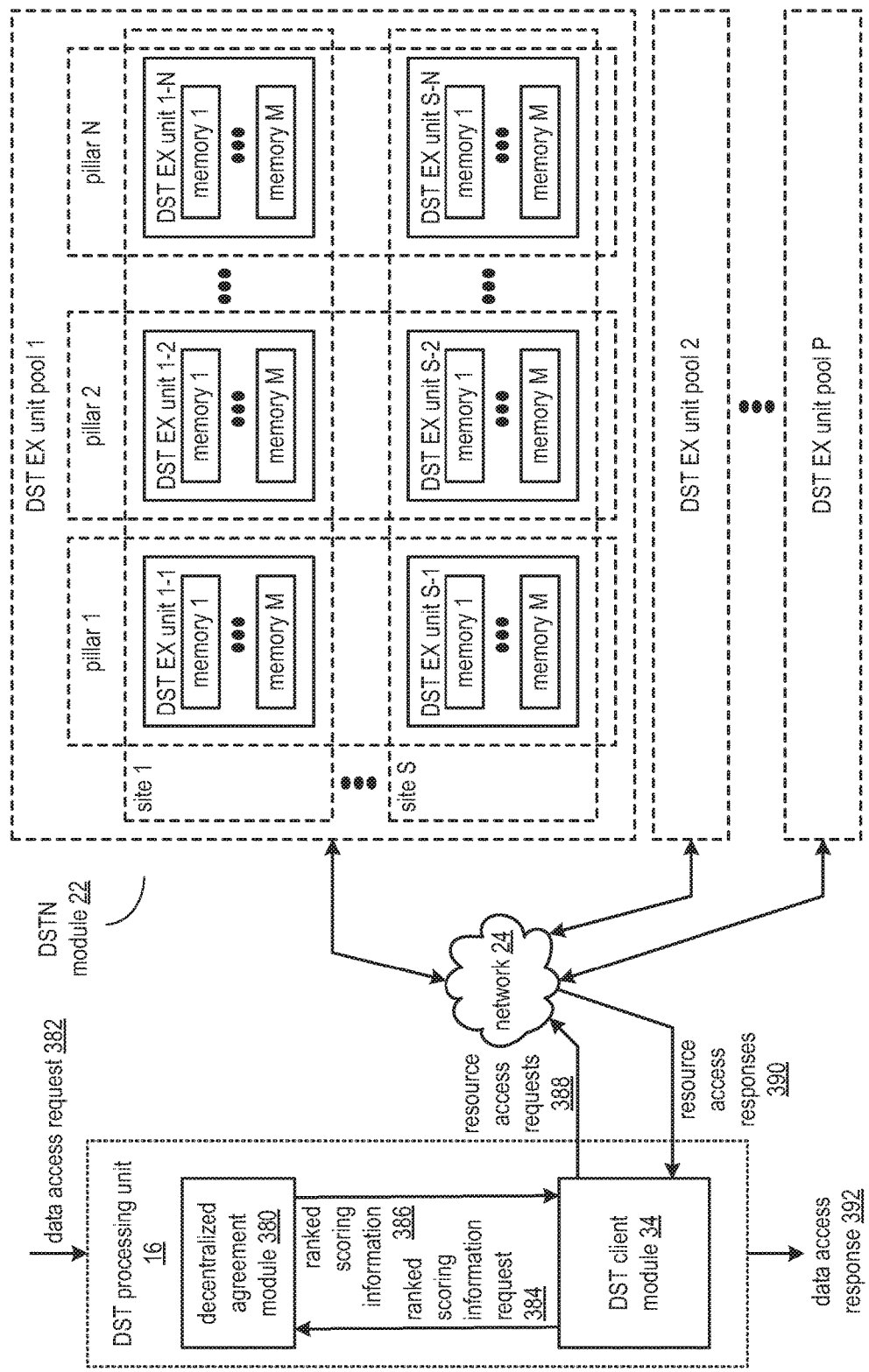
FIG. 40C is a schematic block diagram of an embodiment of a dispersed storage network (DSN) in accordance with the present invention.

FIG. 40C is a schematic block diagram of an embodiment of a dispersed storage network (DSN) that includes the distributed storage and task (DST) processing unit 16 of FIG. 1, the network 24 of FIG. 1, and the distributed storage and task network (DSTN) module 22 of FIG. 1. Hereafter, the DSTN module 22 may be interchangeably referred to as a DSN memory. The DST processing unit 16 includes a decentralized agreement module 380 and the DST client module 34 of FIG. 1. The decentralized agreement module 380 be implemented utilizing the decentralized agreement module 350 of FIG. 40A. The DSTN module 22 includes a plurality of DST execution (EX) unit pools 1-P. Each DST execution unit pool includes one or more sites 1-S. Each site includes one or more DST execution units 1-N. Each DST execution unit may be associated with at least one pillar of N pillars associated with an information dispersal algorithm (IDA), where a data segment is dispersed storage error encoded using the IDA to produce one or more sets of encoded data slices, and where each set includes N encoded data slices and like encoded data slices (e.g., slice 3's) of two or more sets of encoded data slices are included in a common pillar (e.g., pillar 3). Each site may not include every pillar and a given pillar may be implemented at more than one site. Each DST execution unit includes a plurality of memories 1-M. Each DST execution unit may be implemented utilizing the DST execution unit 36 of FIG. 1. Hereafter, a DST execution unit may be referred to interchangeably as a storage unit and a set of DST execution units may be interchangeably referred to as a set of storage units and/or as a storage unit set.

The DSN functions to receive data access requests 382, select resources of at least one DST execution unit pool for data access, utilize the selected DST execution unit pool for the data access, and issue a data access response 392 based on the data access. The selecting of the resources includes utilizing a decentralized agreement function of the decentralized agreement module 380, where a plurality of locations are ranked against each other. The selecting may include selecting one storage pool of the plurality of storage pools, selecting DST execution units at various sites of the plurality of sites, selecting a memory of the plurality of memories for each DST execution unit, and selecting combinations of memories, DST execution units, sites, pillars, and storage pools.

In an example of operation, the DST client module 34 receives the data access request 382 from a requesting entity, where the data access request 382 includes at least one of a store data request, a retrieve data request, a delete data request, a data name, and a requesting entity identifier (ID). Having received the data access request 382, the DST client module 34 determines a DSN address associated with the data access request. The DSN address includes at least one of a source name (e.g., including a vault ID and an object number associated with the data name), a data segment ID, a set of slice names, a plurality of sets of slice names. The determining includes at least one of generating (e.g., for the store data request) and retrieving (e.g., from a DSN directory, from a dispersed hierarchical index) based on the data name (e.g., for the retrieve data request).

Having determined the DSN address, the DST client module 34 selects a plurality of resource levels (e.g., DST EX unit pool, site, DST execution unit, pillar, memory) associated with the DSTN module 22. The determining may be based on one or more of the data name, the requesting entity ID, a predetermination, a lookup, a DSN performance indicator, and interpreting an error message. For example, the DST client module 34 selects the DST execution unit pool as a first resource level and a set of memory devices of a plurality of memory devices as a second resource level based on a system registry lookup for a vault associated with the requesting entity.

Having selected the plurality of resource levels, the DST client module 34, for each resource level, issues a ranked scoring information request 384 to the decentralized agreement module 380 utilizing the DSN address as an asset ID. The decentralized agreement module 380 performs the decentralized agreement function based on the asset ID (e.g., the DSN address), identifiers of locations of the selected resource levels, and location weights of the locations to generate ranked scoring information 386.

For each resource level, the DST client module 34 receives corresponding ranked scoring information 386. Having received the ranked scoring information 386, the DST client module 34 identifies one or more resources associated with the resource level based on the rank scoring information 386. For example, the DST client module 34 identifies a DST execution unit pool associated with a highest score and identifies a set of memory devices within DST execution units of the identified DST execution unit pool with a highest score.

Having identified the one or more resources, the DST client module 34 accesses the DSTN module 22 based on the identified one or more resources associated with each resource level. For example, the DST client module 34 issues resource access requests 388 (e.g., write slice requests when storing data, read slice requests when recovering data) to the identified DST execution unit pool, where the resource access requests 388 further identify the identified set of memory devices. Having accessed the DSTN module 22, the DST client module 34 receives resource access responses 390 (e.g., write slice responses, read slice responses). The DST client module 34 issues the data access response 392 based on the received resource access responses 390. For example, the DST client module 34 decodes received encoded data slices to reproduce data and generates the data access response 392 to include the reproduced data.

Figure 40D:
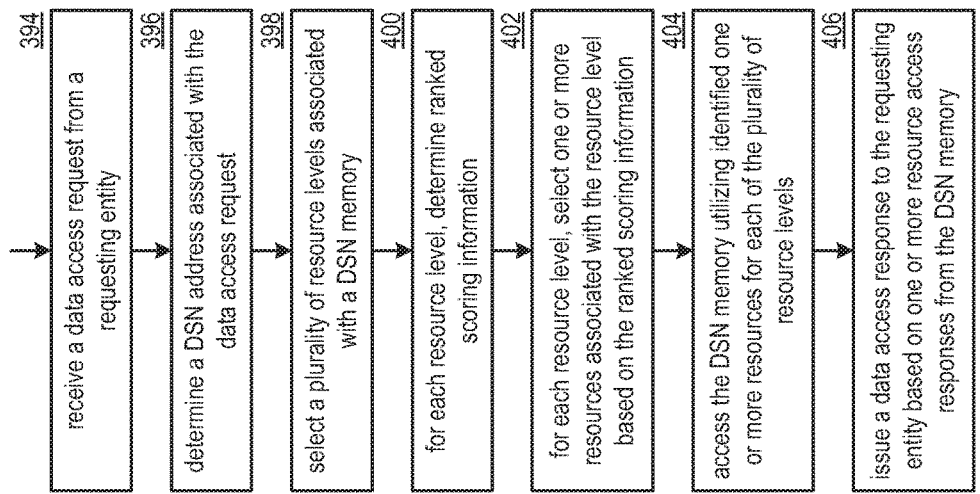
FIG. 40D is a flowchart illustrating an example of accessing a dispersed storage network (DSN) memory in accordance with the present invention.

FIG. 40D is a flowchart illustrating an example of accessing a dispersed storage network (DSN) memory. The method begins or continues at step 394 where a processing module (e.g., of a distributed storage and task (DST) client module) receives a data access request from a requesting entity. The data access request includes one or more of a storage request, a retrieval request, a requesting entity identifier, and a data identifier (ID). The method continues at step 396 where the processing module determines a DSN address associated with the data access request. For example, the processing module generates the DSN address for the storage request. As another example, the processing module performs a lookup for the retrieval request based on the data identifier.

The method continues at step 398 where the processing module selects a plurality of resource levels associated with the DSN memory. The selecting may be based on one or more of a predetermination, a range of weights associated with available resources, a resource performance level, and a resource performance requirement level. For each resource level, the method continues at step 400 where the processing module determines ranked scoring information. For example, the processing module issues a ranked scoring information request to a decentralized agreement module based on the DSN address and receives corresponding ranked scoring information for the resource level, where the decentralized agreement module performs a decentralized agreement protocol function on the DSN address using the associated resource identifiers and resource weights for the resource level to produce the ranked scoring information for the resource level.

For each resource level, the method continues at step 402 where the processing module selects one or more resources associated with the resource level based on the ranked scoring information. For example, the processing module selects a resource associated with a highest score when one resource is required. As another example, the processing module selects a plurality of resources associated with highest scores when a plurality of resources are required.

The method continues at step 404 where the processing module accesses the DSN memory utilizing the selected one or more resources for each of the plurality of resource levels. For example, the processing module identifies network addressing information based on the selected resources including one or more of a storage unit Internet protocol address and a memory device identifier, generates a set of encoded data slice access requests based on the data access request and the DSN address, and sends the set of encoded data slice access requests to the DSN memory utilizing the identified network addressing information.

The method continues at step 406 where the processing module issues a data access response to the requesting entity based on one or more resource access responses from the DSN memory. For example, the processing module issues a data storage status indicator when storing data. As another example, the processing module generates the data access response to include recovered data when retrieving data.

Figure 41A:
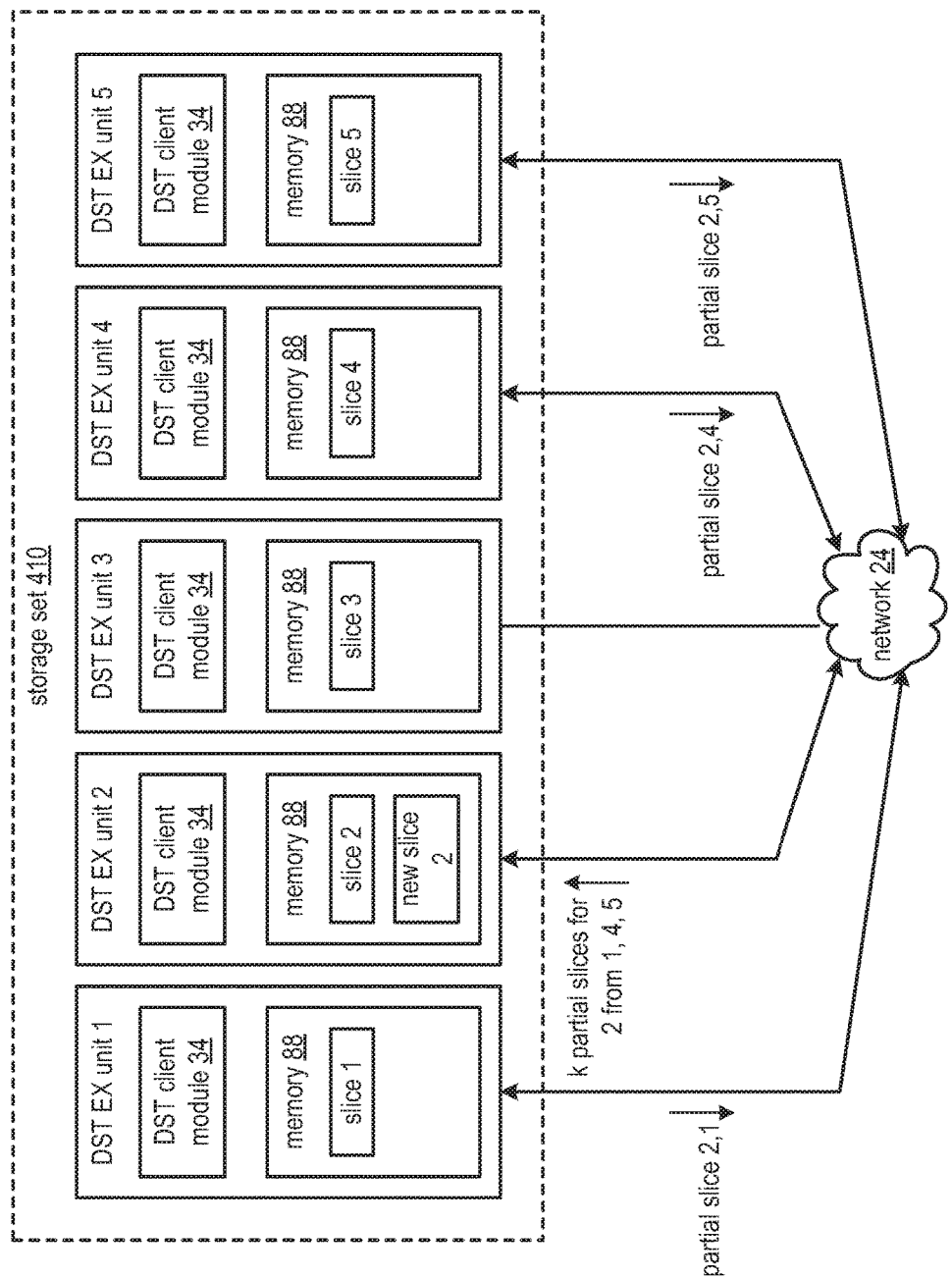
FIG. 41A is a schematic block diagram of another embodiment of a dispersed storage network (DSN) in accordance with the present invention.

FIG. 41A is a schematic block diagram of another embodiment of a dispersed storage network (DSN) that includes a storage set 410 and the network 24 of FIG. 1. The storage set 410 includes a set of distributed storage and task (DST) execution (EX) units 1-5. Each DST execution unit includes the DST client module 34 of FIG. 1 and the memory 88 of FIG. 3. Each DST execution unit may be implemented utilizing the DST execution unit 36 of FIG. 1. Hereafter, each DST execution unit may be interchangeably referred to as a storage unit and the storage set 410 may be interchangeably referred to as a set of storage units. The DSN functions to re-encode data that is stored in the storage set 410, where each data segment of a plurality of data segments of the data is dispersed storage error encoded utilizing previous dispersed storage error encoding parameters to produce a set of encoded data slices that are stored in the set of DST execution units 1-5. For example, a DST processing unit 16 of FIG. 1 dispersed storage error encodes the data segment utilizing the previous dispersed storage error encoding parameters having a previous threshold number to produce the set of encoded data slices 1-5 stored in the set of memories 88 of the set of DST execution units 1-5. For instance, the of storage units of the DSN stores the set of encoded data slices.

The parameters of the previous dispersed storage error encoding parameters includes an information dispersal algorithm (IDA) width (e.g., 5) and a decode threshold number k (e.g., 3 for the previous threshold number), where at least a decode threshold number of encoded data slices of the set of encoded data slices are required to recover a corresponding data segment. FIG. 41B illustrates an example of encoding the data segment to produce the set of encoded data slices, where the data is encoded utilizing a secret sharing approach, the IDA width is 5, and the decode threshold number is 3. An encoding matrix (D) is matrix multiplied by a data matrix (D) to produce a coded matrix (C), where the coded matrix includes encoded data blocks 416 and where the encoded data blocks 416 forms the set of slices 1-5 for storage in the storage set 410. The encoding matrix includes an IDA width number of rows (e.g., 5) and a decode threshold number of columns (e.g., 3, the previous threshold number). The data matrix includes a decode threshold number of rows, where one row includes the data for encoding and the other rows includes random numbers (e.g., R1, R2). As a specific example of the matrix multiplication, encoded data slice X11=aD+bR1+cR2.

Returning to FIG. 41A, in an example of operation of the re-encoding of the data, a conversion agent (e.g., the DST processing unit 16 of FIG. 1, one or more DST execution units of the set of DST execution units 1-5, and the distributed storage and task network (DSTN) managing unit 20 of FIG. 1) determines to create the new set of encoded data slices based on a change request from the previous threshold number (e.g., previous decode threshold number of 3) to an updated threshold number (e.g., updated decode threshold number of 2). The determining may be based on one or more of interpreting a request, detecting an unfavorable storage performance level (e.g., unfavorable reliability level including too much or too little), and interpreting a dispersed storage error encoding parameter change schedule. For example, a collective of the DST execution units acts as the conversion agent to detect the unfavorable reliability level and indicates to convert the set of encoded data slices using a lowered decode threshold number when the unfavorable reliability level includes a measured reliability level that is greater than a maximum desired reliability level (e.g., too much liability, not enough network performance).

Having determined to convert the set of encoded data slices, for each encoded data slice of the set of encoded data slices, the conversion agent selects participating storage units to produce a decode threshold number of partially encoded data slices with regards to the encoded data slice. The selecting may be based on one or more of a storage unit availability level, a storage unit performance level, and a predetermination. For example, the conversion agent selects DST execution units 1, 4, and 5 when the DST execution units 1, 4, and 5 are available now and exhibit favorable performance levels to work together to produce a new encoded data slice 2 for storage in the memory 88 of the DST execution unit 2.

With the participating storage units selected, each participating storage unit generates a corresponding partially re-encoded data slice with regards to the encoded data slice. For example, DST execution unit 1 generates a partially re-encoded data slice 2 for encoded data slice 2 based on encoded data slice 1, DST execution unit 4 generates a partially re-encoded data slice 2 for encoded data slice 2 based on encoded data slice 4, and DST execution unit 5 generates a partially re-encoded data slice 2 for encoded data slice 2 based on encoded data slice 5.

The generating of the partially re-encoded data slice includes a partial decoding step and a partial re-encoding step. The partial decoding step includes a storage unit (e.g., DST execution unit 1) of the DSN partially decoding a first encoded data slice (e.g., encoded data slice 2) of the set of encoded data slices 1-5 in accordance with the previous dispersed storage error encoding parameters having the previous threshold number (e.g., 3) to produce a partially decoded first encoded data slice (e.g., 2,1), wherein the first encoded data slice (e.g., encoded data slice 2) is stored by another storage unit (e.g., DST execution unit 2) of the DSN, where the another storage unit is in the set of storage units, and where the data segment of a data object is encoded into the set of encoded data slices 1-5 in accordance with the previous dispersed storage error encoding parameters.

The partial re-encodings step includes the storage unit (e.g., DST execution unit 1) partially re-encoding the partially decoded first encoded data slice (e.g., 2, 1) in accordance with the updated dispersed storage error encoding parameters having the updated threshold number to produce a first partially re-encoded data slice (e.g., 2,1), where the first partially re-encoded data slice is used to create the new first encoded data slice (e.g., new encoded data slice 2) of the new set of encoded data slices that corresponds to the data segment being dispersed storage error encoded in accordance with the updated dispersed storage error encoding parameters.

Figure 41D:
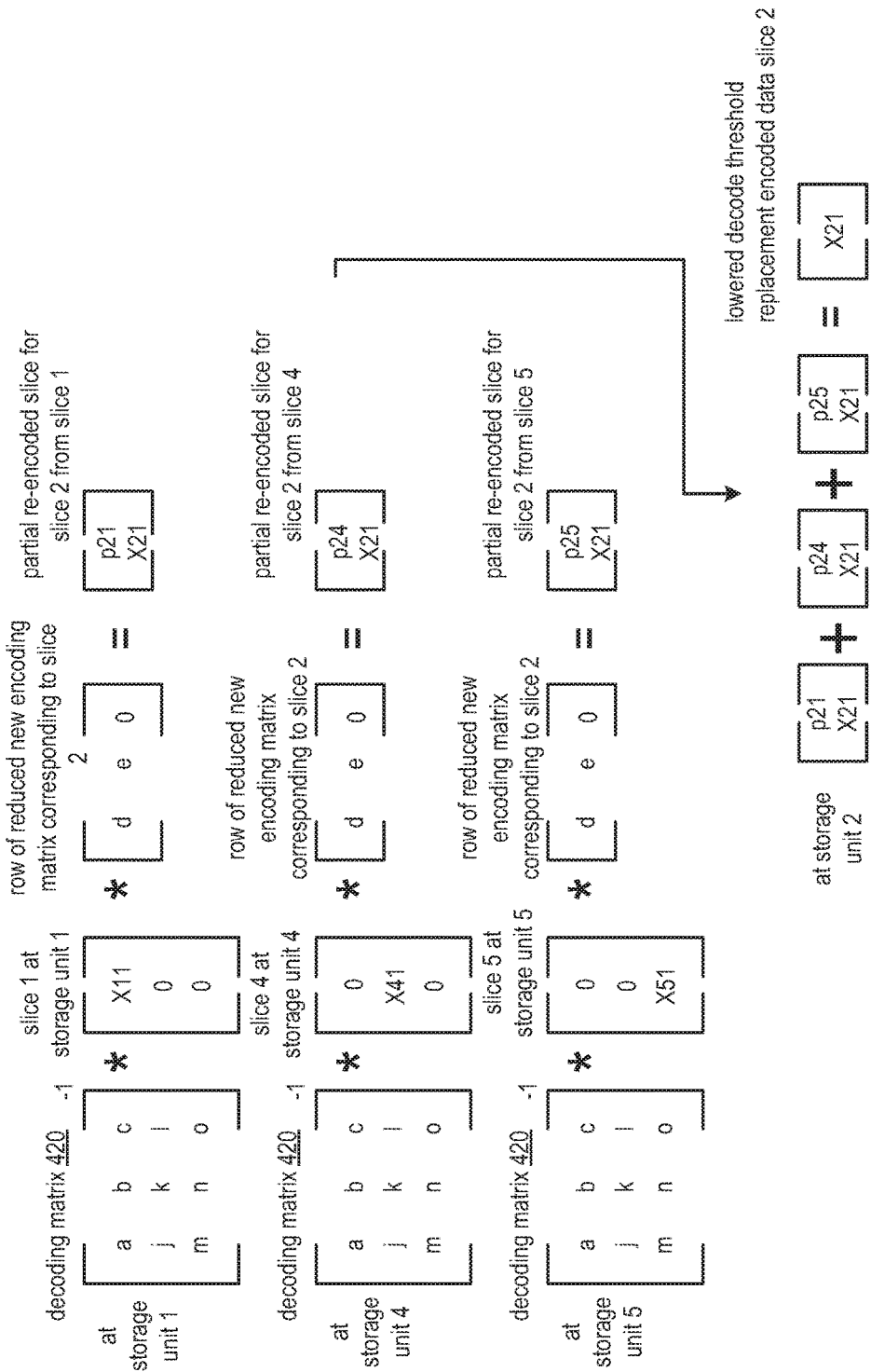
FIG. 41D is a diagram illustrating an example of re-encoding an encoded data slice in accordance with the present invention.

FIG. 41D illustrates an example of the generating of the partial encoded data slices by the decode threshold number of participating storage units, where the storage unit obtains a decoding matrix 420 corresponding to the previous dispersed storage error encoding parameters. For example, the DST execution unit 1 generates the decoding matrix 420 by creating an inverse matrix that includes only rows of the encoding matrix of FIG. 41B corresponding to the decode threshold number of participating storage units. For instance, the inverse matrix includes rows 1, 4, and 5 corresponding to storage units 1, 4, and 5. Having obtained the decoding matrix 420, the storage unit generates a reduced data matrix based on a second encoded data slice (e.g., the encoded data slice 1) of the set of encoded data slices that correspond to the data segment being encoded in accordance with the previous dispersed storage error encoding parameters. For example, the DST execution unit 1 forms the reduced data matrix that includes the encoded data slice 1 (e.g., X11) in a first row and zeros in another two rows. Having generated the reduced data matrix, the storage unit matrix multiplies the decoding matrix and the reduced data matrix to produce the partially decoded first encoded data slice (e.g., 2,1).

Having performed the partial decoding step, the storage unit performs the partial re-encodings step. For example, the storage unit (e.g., DST execution unit 1) obtains a new encoding matrix corresponding to the updated dispersed storage error encoding parameters. The obtaining includes at least one of interpreting system registry information, receiving the new encoding matrix, and modifying encoding matrix of FIG. 41B (e.g., decode threshold of 3) to produce the new encoding matrix of FIG. 41C. The modifying includes eliminating and/or zeroing out a last column of the encoding matrix when reducing the decode threshold number and adding a new column to the encoding matrix when incrementing the decode threshold number. For example, the storage unit modifies the encoding matrix of FIG. 41B by eliminating (e.g., zeroing out in the example of FIG. 41D when matrix multiplied) the third column to produce the new encoding matrix of FIG. 41C.

Having obtained the new encoding matrix, the storage unit reduces the new encoding matrix based on a matrix position corresponding to the new first encoded data slice (e.g., encoded data slice 2) of the new set of encoded data slices that corresponds to the data segment being dispersed storage error encoded in accordance with the updated dispersed storage error encoding parameters. For example, the storage unit eliminates all rows except for the second row corresponding to the encoded data slice 2 to produce a reduced new encoding matrix (e.g., d e 0). Having produced the reduced new encoding matrix, the storage unit matrix multiplies the reduced new encoding matrix with the partially decoded first encoded data slice to produce the first partially re-encoded data slice. Alternatively, the storage unit performs the matrix multiplication steps together. For example, the storage unit matrix multiplies the decoding matrix 420 by the reduced data matrix and by the reduced new encoding matrix to produce the first partially re-encoded data slice (e.g., p21 X21).

In a similar fashion, storage unit 4 matrix multiplies the decoding matrix 420 by a reduced data matrix that includes encoded data slice 4 by the reduced new encoding matrix to produce a re-partially encoded data slice for encoded data slice 2 from encoded data slice 4 (e.g., p24 X21) and storage unit 5 matrix multiplies the decoding matrix 420 by a reduced data matrix that includes encoded data slice 5 by the reduced new encoding matrix to produce a partially re-encoded data slice for encoded data slice 2 from encoded data slice 5 (e.g., p25 X21).

Returning to FIG. 41A, with the partially encoded data slices generated, the storage unit (e.g., storage unit 1) receives a plurality of second partially re-encoded data slices from a sub-set of other storage units (e.g., DST execution units 3, 4, 5) of the DSN, where the plurality of second partially re-encoded data slices is created in accordance with the updated dispersed storage error encoding parameters (e.g., to produce a new encoded data slice 1). The receiving may include the storage unit receiving the plurality of second partially re-encoded data slices from the sub-set of other storage units, wherein the sub-set of other storage units is in the set of storage units.

The receiving further includes receiving one of the plurality of second partially re-encoded data slices from a first other storage unit of the sub-set of other storage units, where the first other storage unit generated the one of the plurality of second partially re-encoded data slices by partially decoding a second encoded data slice (e.g., encoded data slice 1 of DST EX unit 1) of the set of encoded data slices in accordance with the previous dispersed storage error encoding parameters and an encoded data slice of the set of encoded data slices stored by the first other storage unit to produce a first partially decoded second encoded data slice and partially re-encoded the first partially decoded second encoded data slice in accordance with the updated dispersed storage error encoding parameters to produce the one of the plurality of second partially re-encoded data slices. The receiving further includes receiving another one of the plurality of second partially re-encoded data slices from a second other storage unit of the sub-set of other storage units, where the second other storage unit generated the another one of the plurality of second partially re-encoded data slices by partially decoding the second encoded data slice of the set of encoded data slices in accordance with the previous dispersed storage error encoding parameters and an encoded data slice of the set of encoded data slices stored by the second other storage unit to produce a second partially decoded second encoded data slice, and partially re-encoded the second partially decoded second encoded data slice in accordance with the updated dispersed storage error encoding parameters to produce the another one of the plurality of second partially re-encoded data slices. For instance, the DST execution unit 1 receives partially re-encoded data slices from DST execution units 3-5.

As another example of the receiving, the participating storage units (e.g., DST execution units 1, 4, and 5) send, via the network 24, corresponding partially re-encoded data slices to the storage unit 2 associated with the encoded data slice. For example, DST execution unit 1 sends the partially re-encoded data slice 2 for encoded data slice 2 based on encoded data slice 1 (e.g., partially re-encoded data slice 2, 1) to the DST execution unit 2, DST execution unit 4 sends the partially re-encoded data slice 2 for encoded data slice 2 based on encoded data slice 4 (e.g., partially re-encoded data slice 2, 4) to the DST execution unit 2, and DST execution unit 5 sends the partially re-encoded data slice 2 for encoded data slice 2 based on encoded data slice 5 (e.g., partially re-encoded data slice 2, 5) to the DST execution unit 2.

Having received the threshold number (e.g., previous decode threshold number) of partially re-encoded data slices, the storage unit generates a new second encoded data slice of the new set of encoded data slices from the plurality of second partially re-encoded data slices. The generating includes the storage unit performing an arithmetic function on the plurality of second partially re-encoded data slices to produce the new second encoded data slice. The arithmetic function includes one or more of an exclusive OR function, an addition function (e.g., in a field of math of the dispersed storage error encoding), a subtraction function, a multiplication function, and a division function.

As an example of the generating of the new second encoded data slice, the storage unit associated with encoded data slice generates a corresponding new encoded data slice utilizing the received decode threshold number of partially re-encoded data slices. FIG. 41D further illustrates an example of the generating of the corresponding encoded data slice, where the decode threshold number of received partial encoded data slices are added in the field of math (e.g., exclusive OR function) of the encoding to produce the new encoded data slice. For example, the DST execution unit 2 performs an exclusive OR function on the partially encoded data slices p21 X21, p24 X21, and p25 X21 to produce the new encoded data slice X21 (e.g., new encoded data slice 2 for storage in the memory 88 of the DST execution unit 2). In a similar fashion, each storage unit receives a corresponding decode threshold number of partial encoded data slices and generates a corresponding new encoded data slice for storage in accordance with the new decode threshold number.

Returning to FIG. 41A, having generated the corresponding new encoded data slice, the storage unit associated with encoded data slice stores the corresponding encoded data slice in the memory 88, where the new encoded data slice is substantially the same as if the data segment is dispersed storage error encoded utilizing the new decode threshold. The storing further includes a set of storage units of the DSN storing the new set of encoded data slices.

FIG. 41C illustrates an example of encoding the data segment utilizing the new threshold (e.g., new threshold), where a column of the encoding matrix of FIG. 41B is eliminated to produce a new encoding matrix E and a corresponding row of the data matrix is eliminated to produce a new data matrix D reflecting the reduction of the previous threshold number to produce the new threshold number. When the new threshold number is greater than the previous threshold number, an additional column is added to the encoding matrix and an additional row is added to the data matrix (e.g., another random number, i.e. R3). The encoding matrix is matrix multiplied by the new data matrix to produce a new encoded matrix that includes encoded data blocks 418 of the new set of encoded data slices. For example, slice X11=aD+bR1.

Figure 41E:
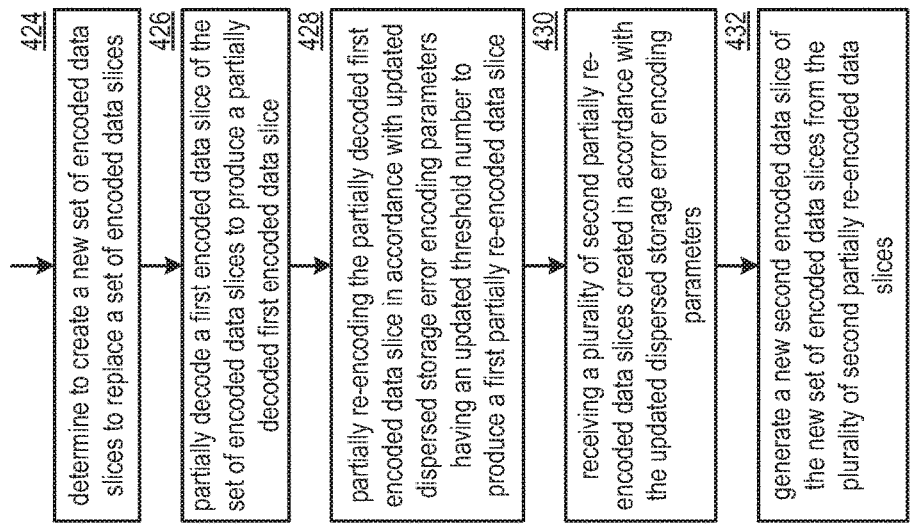
FIG. 41E is a flowchart illustrating an example of re-encoding data in accordance with the present invention.

FIG. 41E is a flowchart illustrating an example of configuring a set of storage units. In particular, a method is presented for use in conjunction with one or more functions and features described in conjunction with FIGS. 1-39, 41A-D, and also FIG. 41E. The method includes step 424 where a processing module of a computing device of one or more computing devices of a dispersed storage network (DSN) determines to create a new set of encoded data slices to replace a set of encoded data slices based on a change request from a previous threshold number (e.g., a previous decode threshold number) of previous dispersed storage error encoding parameters to an updated threshold number (e.g., an updated decode threshold number) of updated dispersed storage error encoding parameters, where a data segment of a data object is encoded into the set of encoded data slices in accordance with the previous dispersed storage error encoding parameters, and where a set of storage units of the DSN stores the set of encoded data slices.

The method continues at step 426 where a storage unit of the DSN partially decodes a first encoded data slice of the set of encoded data slices in accordance with the previous dispersed storage error encoding parameters having the previous threshold number to produce a partially decoded first encoded data slice, where the first encoded data slice is stored by another storage unit of the DSN, and where the data segment of the data object is encoded into the set of encoded data slices in accordance with the previous dispersed storage error encoding parameters, and where the another storage unit is in the set of storage units. The partially decoding includes obtaining a decoding matrix corresponding to the previous dispersed storage error encoding parameters, generating a reduced data matrix based on a second encoded data slice of the set of encoded data slices that correspond to the data segment being encoded in accordance with the previous dispersed storage error encoding parameters, and matrix multiplying the decoding matrix and the reduced data matrix to produce the partially decoded first encoded data slice.

The method continues at step 428 where the storage unit partially re-encodes the partially decoded first encoded data slice in accordance with updated dispersed storage error encoding parameters having an updated threshold number to produce a first partially re-encoded data slice, where the first partially re-encoded data slice is used to create a new first encoded data slice of the new set of encoded data slices that corresponds to the data segment being dispersed storage error encoded in accordance with the updated dispersed storage error encoding parameters. The partially re-encoding includes obtaining a new encoding matrix corresponding to the updated dispersed storage error encoding parameters, reducing the new encoding matrix based on a matrix position corresponding to the new first encoded data slice of the new set of encoded data slices that corresponds to the data segment being dispersed storage error encoded in accordance with the updated dispersed storage error encoding parameters, and matrix multiplying the reduced new encoding matrix with the partially decoded first encoded data slice to produce the first partially re-encoded data slice.

The method continues at step 430 where the storage unit receives a plurality of second partially re-encoded data slices from a sub-set of other storage units of the DSN, where the plurality of second partially re-encoded data slices is created in accordance with the updated dispersed storage error encoding parameters. The receiving may include the storage unit receiving the plurality of second partially re-encoded data slices from the sub-set of other storage units, where the sub-set of other storage units is in the set of storage units. The receiving the plurality of second partially re-encoded data slices may further include receiving one of the plurality of second partially re-encoded data slices from a first other storage unit of the sub-set of other storage units, where the first other storage unit generated the one of the plurality of second partially re-encoded data slices. For example, the first other storage unit generates the one of the plurality of second partially re-encoded data slices by partially decoding a second encoded data slice of the set of encoded data slices in accordance with the previous dispersed storage error encoding parameters and an encoded data slice of the set of encoded data slices stored by the first other storage unit to produce a first partially decoded second encoded data slice and partially re-encoding the first partially decoded second encoded data slice in accordance with the updated dispersed storage error encoding parameters to produce the one of the plurality of second partially re-encoded data slices.

The receiving the plurality of second partially re-encoded data slices may further include receiving another one of the plurality of second partially re-encoded data slices from a second other storage unit of the sub-set of other storage units, where the second other storage unit generated the another one of the plurality of second partially re-encoded data slices. For example, the second other storage unit generates the another one of the plurality of second partially re-encoded data slices by partially decoding the second encoded data slice of the set of encoded data slices in accordance with the previous dispersed storage error encoding parameters and an encoded data slice of the set of encoded data slices stored by the second other storage unit to produce a second partially decoded second encoded data slice and partially re-encoding the second partially decoded second encoded data slice in accordance with the updated dispersed storage error encoding parameters to produce the another one of the plurality of second partially re-encoded data slices.

The method continues at step 432 where the storage unit generates a new second encoded data slice of the new set of encoded data slices from the plurality of second partially re-encoded data slices. The generating the new second encoded data slice includes performing an arithmetic function on the plurality of second partially re-encoded data slices to produce the new second encoded data slice. The arithmetic function includes one or more of an exclusive OR function, an addition function (e.g., in a field of math of the encoding), a subtraction function, a multiplication function, and a division function.

The method described above in conjunction with the processing module, the computing device, the one or more computing devices, the storage unit, the another storage unit, the first other storage unit, the second other storage unit, etc., can alternatively be performed by other modules of the dispersed storage network or by other devices. In addition, at least one memory section (e.g., a non-transitory computer readable storage medium) that stores operational instructions can, when executed by one or more processing modules of one or more computing devices of the dispersed storage network (DSN), cause the one or more computing devices to perform any or all of the method steps described above.

Figure 42A:
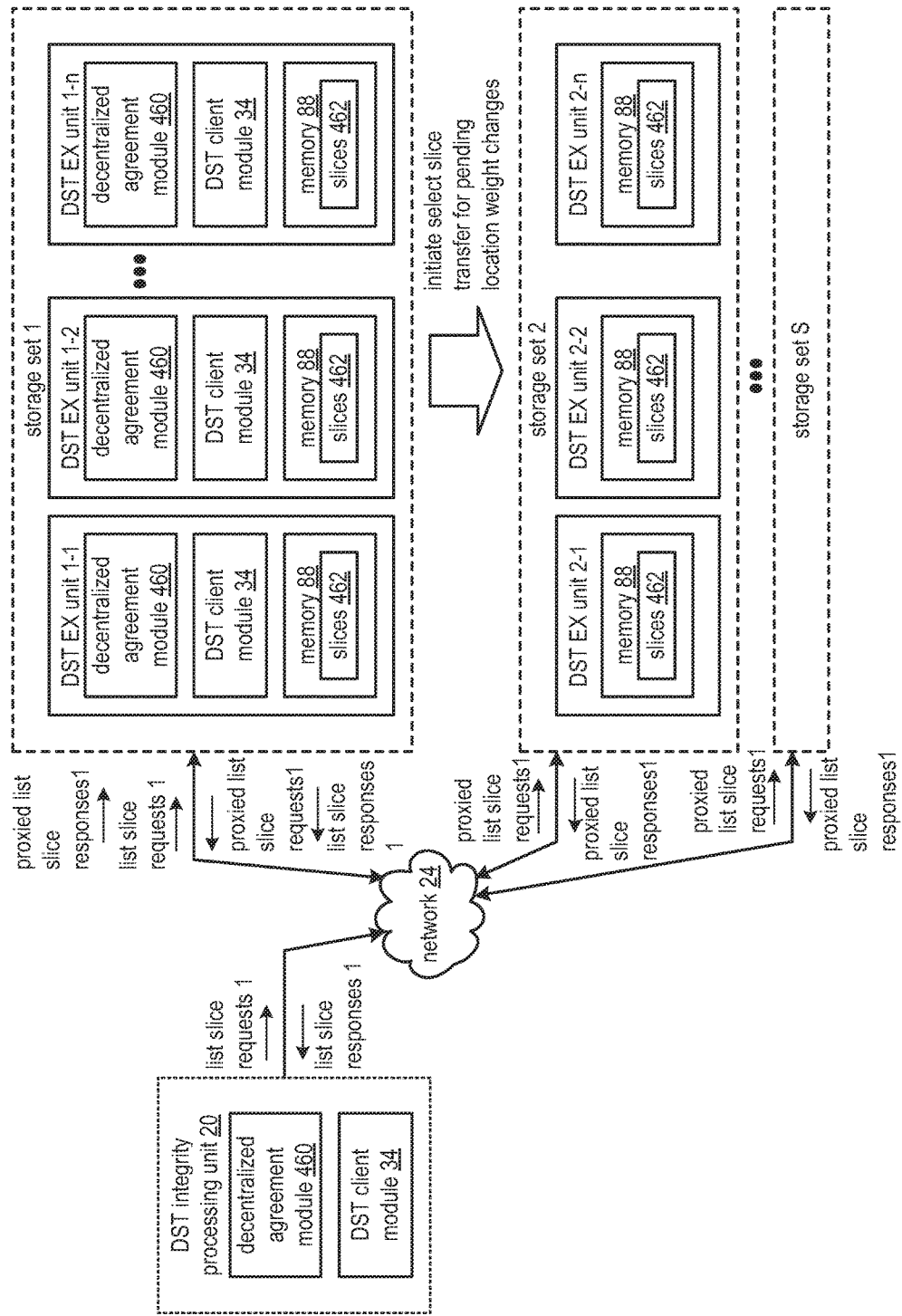
FIG. 42A is a schematic block diagram of another embodiment of a dispersed storage network (DSN) in accordance with the present invention.

FIG. 42A is a schematic block diagram of another embodiment of a dispersed storage network (DSN) that includes the distributed storage and task (DST) integrity processing unit 20 of FIG. 1, the network 24 of FIG. 1, and a plurality of storage sets 1-S. The DST integrity processing unit 20 includes a decentralized agreement module 460 and the DST client module 34 of FIG. 1. The decentralized agreement module 460 may be implemented utilizing the decentralized agreement module 350 of FIG. 40A. Each storage set includes a set of n DST execution (EX) units. Each DST execution unit includes the decentralized agreement module 460, the DST client module 34 of FIG. 1, and the memory 88 of FIG. 3. Each DST execution unit may be implemented utilizing the DST execution unit 36 of FIG. 1. Each DST execution unit may be interchangeably referred to as a storage unit and a storage set may be interchangeably referred to as a set of storage units. The DSN functions to identify stored encoded data slices during a slice migration activity.

In an example of operation of the identifying of the stored encoded data slices 462 during the slice migration activity, a storage unit of the storage set 1 receives, via the network 24, a list slice request from the DST integrity processing unit 20, where the slice migration activity includes the set of storage units of storage set 1 transferring encoded data slices to storage units of the storage set 2 in accordance with pending location weight changes (e.g., weighting factors of a distributed agreement protocol function). The list slice request includes a slice name range in accordance with current weighting factors, where the distributed agreement module 460 of the DST integrity processing unit 20 performs the distributed agreement protocol function on a DSN address of the slice name range utilizing the current weighting factors to determine that the DSN address has been associated with the storage set 1.

Having received the list slice request, the storage unit identifies one or more other storage units affiliated with the slice name range, where the one or more storage units are associated with the slice migration activity. For example, the storage unit utilizes the decentralized agreement module 460 performs a distributed agreement protocol function on a DSN address of the list slice request utilizing pending weighting factors to identify the one or more other storage units.

Having identified the one or more other storage units, the storage unit issues, via the network 24, a proxied list slice request to the identified one or more other storage units. The issuing includes generating proxied list slice requests to include a DSN address range in accordance with one or more of the list slice request and a DSN address range affiliated with the pending weighting factors.

The storage unit selects received proxied list slice responses associated with the list slice request, where the one or more other storage units sends the proxied list slice responses in response to the proxied list slice request and where each proxied list slice response includes a list of slice names associated with the DSN address range of the pending weighting factors stored in the memory 88 of a storage unit sending the proxied list slice response. The selecting includes performing the distributed agreement protocol function on a slice name of the received proxied list slice response using the current weighting factors to produce scores and identifying responses associated with a highest score for the storage unit.

Having selected the received proxied list slice responses, the DST client module 34 of the storage unit issues, via the network 24, a list slice response to the DST integrity processing unit 20 based on the selected list slice responses and locally stored encoded data slices associated with the list slice request. For example, the storage unit identifies locally stored encoded data slices, generates the list slice response to include slice names of the locally stored encoded data slices and slice names of the selected list slice responses.

Figure 42B:
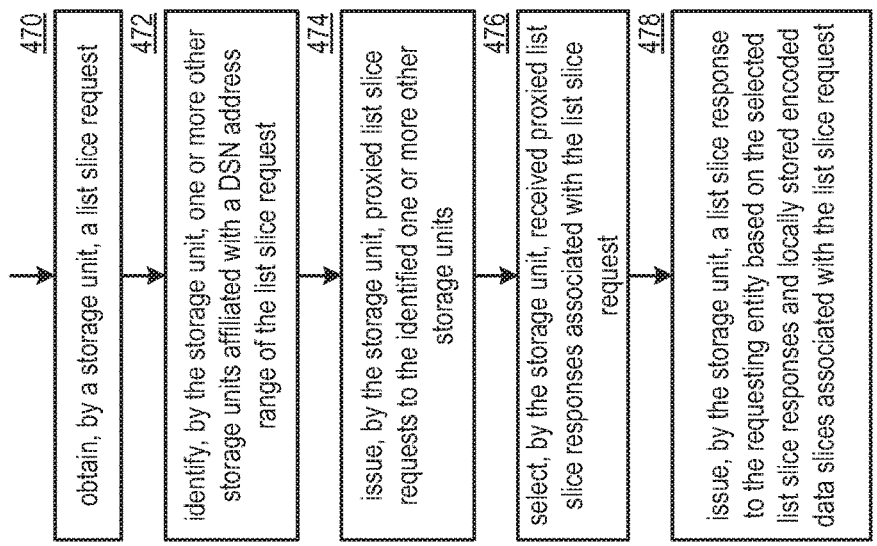
FIG. 42B is a flowchart illustrating an example of identifying stored encoded data slices during a slice migration activity in accordance with the present invention.

FIG. 42B is a flowchart illustrating an example of identifying stored encoded data slices during a slice migration activity. The method includes step 470 where a processing module (e.g., of a distributed storage and task (DST) execution unit) obtains a list slice request. The obtaining includes at least one of receiving from a requesting entity, and generating based on one or more of a storage error detection schedule, a predetermination, etc., where a plurality of storage units of a dispersed storage network (DSN) that includes the storage unit.

The method continues at step 472 where the processing module identifies one or more other storage units affiliated with a DSN address range of the list slice request. For example, the processing module performs a distributed agreement protocol function on the DSN address of the list slice request using pending weighting factors of the plurality of storage units.

The method continues at step 474 where the processing module issues a proxied list slice requests to the identified one or more other storage units. For example, the processing module generates the proxied list slice requests to include a DSN address range in accordance with one or more of the list slice request and a DSN address range affiliated with the pending weighting factors.

The method continues at step 476 where the processing module selects received proxied list slice responses associated with the list slice request. For example, the processing module performs the distributed agreement protocol function on a slice name of a received proxied list slice response using the current weighting factors to produce scores and identifies responses associated with a high score for the storage unit.

The method continues at step 478 where the processing module issues a list slice response to the requesting entity based on the selected list slice responses and locally stored encoded data slices associated with the list slice request. For example, the processing module identifies the locally stored encoded data slices, generates the list slice response to include slice names of the locally stored encoded data slices and slice names of the selected list slice responses, and sends the generated list slice response to the requesting entity.

Figure 43A:
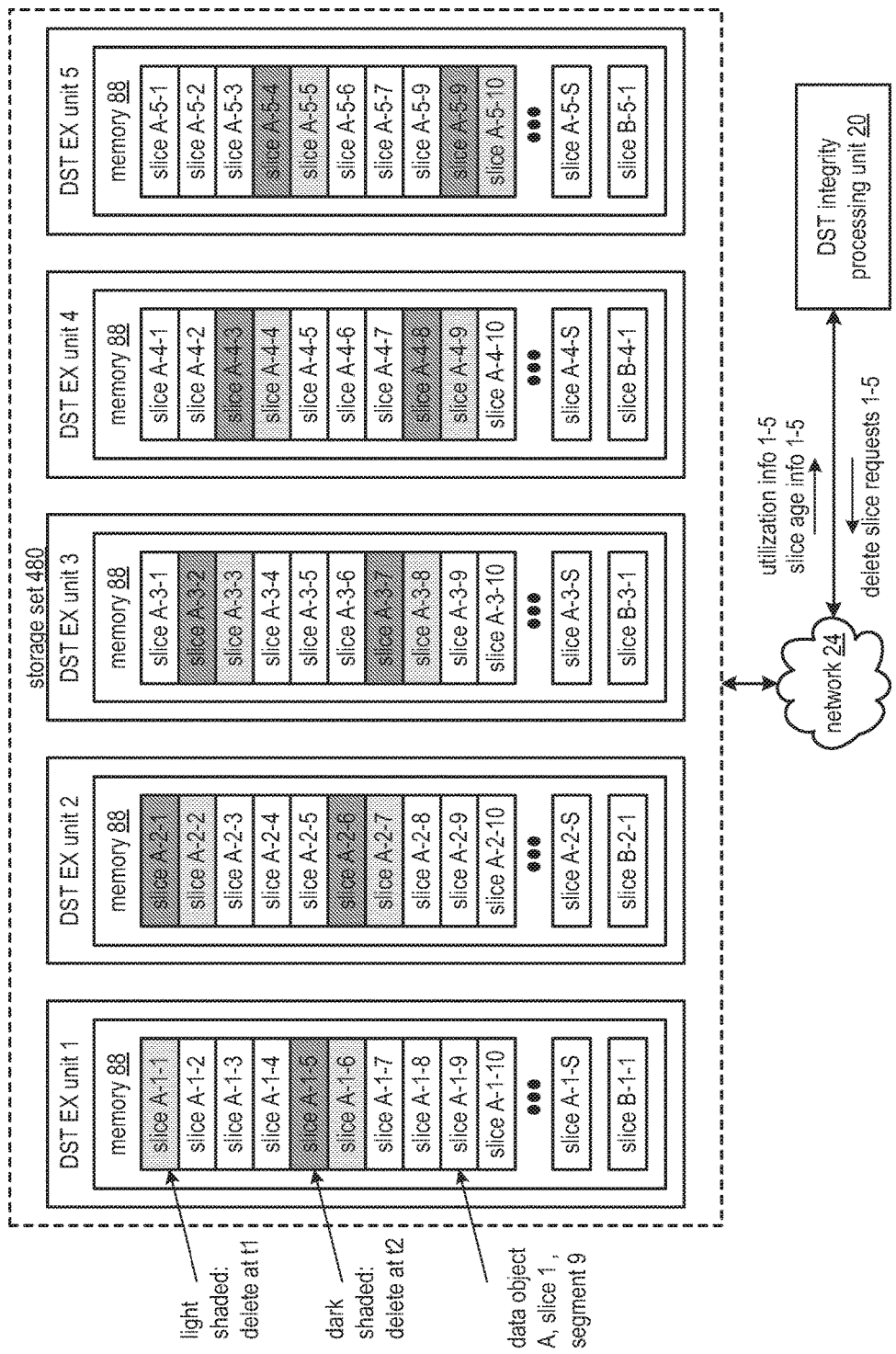
FIG. 43A is a schematic block diagram of another embodiment of a dispersed storage network (DSN) in accordance with the present invention.

FIG. 43A is a schematic block diagram of another embodiment of dispersed storage network (DSN) that includes a storage set 480, the network 24 of FIG. 1, and the distributed storage and task (DST) integrity processing unit 20 of FIG. 1. Alternatively, the DST integrity processing unit 20 may be implemented utilizing one or more of the DST processing unit 16 of FIG. 1 and a DST execution unit 36 of FIG. 1. The storage set 480 includes a set of DST execution (EX) units 1-5. Each DST execution unit includes the memory 88 of FIG. 3. Each DST execution unit may be implemented utilizing the DST execution unit 36 of FIG. 1. Hereafter, each DST execution unit may be interchangeably referred to as a storage unit and the storage set may be interchangeably referred to as a set of storage units. The DSN functions to reclaim storage capacity of the set of the storage set.

In an example of operation of the reclaiming of the storage capacity, the DST integrity processing unit 20 determines to reclaim the storage capacity based on utilization information. The utilization information includes one or more of a storage capacity level of a memory 88, a storage capacity level of a DST execution unit, a storage utilization level of a memory 88, and a storage utilization level of the DST execution unit. The determining includes obtaining the utilization information (e.g., receiving utilization information 1-5) and indicating to reclaim the storage capacity when a level of storage capacity utilization is greater than a storage capacity utilization threshold level.

Having determined to reclaim the storage capacity, the DST integrity processing unit 20 determines slice age information for a plurality of sets of encoded data slices of each of a plurality of stored data objects, where a data object is dispersed storage error encoded to produce a plurality of sets of encoded data slices that are stored in the set of DST execution units 1-5. For example, a data object A is divided into S data segments, where each data segment is dispersed storage error encoded to produce a corresponding set of encoded data slices 1-5 of S sets of encoded data slices 1-5. The determining includes one or more of interpreting a query response, interpreting an error message, and extracting the slice age information from metadata of the plurality of sets of encoded data slices. For example, the DST integrity processing unit 20 receives slice age information 1-5 from the DST execution units 1-5 with regards to the stored data object A including a first set of encoded data slices A-1-1, A-2-1, A-3-1, A-4-1, and A-5-1 through a Sth set of encoded data slices A-1-S, A-2-S, A-3-S, A-4-S, and A-5-S; and receives slice age information 1-5 from the DST execution units 1-5 with regards to a stored data object B.

Having determined the slice age information, the DST integrity processing unit 20 selects a plurality of sets of encoded data slices of the plurality of storage data objects based on the slice age information. For example, the DST integrity processing unit 20 selects a plurality of sets of encoded data slices associated with an oldest slice age of the plurality of stored data objects.

When substantially each set of the selected plurality of sets of encoded data slices includes less than or equal to a decode threshold number of encoded data slices, the DST integrity processing unit 20 identifies all encoded data slices of the selected plurality of sets of encoded data slices of the selected plurality of sets of encoded data slices for deletion. For example, the DST integrity processing unit 20 interprets the slice age information to determine a number of available encoded data slices for each set.

When substantially each set of the selected plurality of sets of encoded data slices includes more than the decode threshold number of encoded data slices, for each set of encoded data slices of the selected plurality of sets of encoded data slices, the DST integrity processing unit 20 identifies at least one encoded data slice for deletion resulting in at least a decode threshold number of remaining available encoded data slices of the set of encoded data slices. For example, the DST integrity processing unit 20 selects a different storage unit for each set of encoded data slices in a round-robin fashion to evenly distribute capacity reclamation, where the deleting repeats every n sets of encoded data slices, where n=an information dispersal algorithm (IDA) with of the encoding of the data (e.g., n=5). For instance, when only one encoded data slice of each set of encoded data slices is required for deletion, the DST integrity processing unit 20 selects encoded data slices A-1-1, A-2-2, A-3-3, A-4-4, A-5-5, A-1-6, A-2-7, A-3-8, etc., for deletion. In another instance, when to encoded data slices of each set of encoded data slices are required for deletion, the DST integrity processing unit 20 additionally selects encoded data slices A-2-1, A-3-2, A-4-3, A-5-4, A-1-5, A-2-6, A-3-7 etc., for deletion where remaining encoded data slices of each set of encoded data slices includes the decode threshold number of encoded data slices.

Having identified the encoded data slices for deletion, the DST integrity processing unit 20 facilitates deletion of the identified encoded data slices for deletion. For example, the DST integrity processing unit 20 issues, via the network 24, delete slice requests 1-5 to the DST execution units 1-5 perform the deletion, where the delete slice requests 1-5 includes identifiers of the identified encoded data slices for deletion.

Figure 43B:
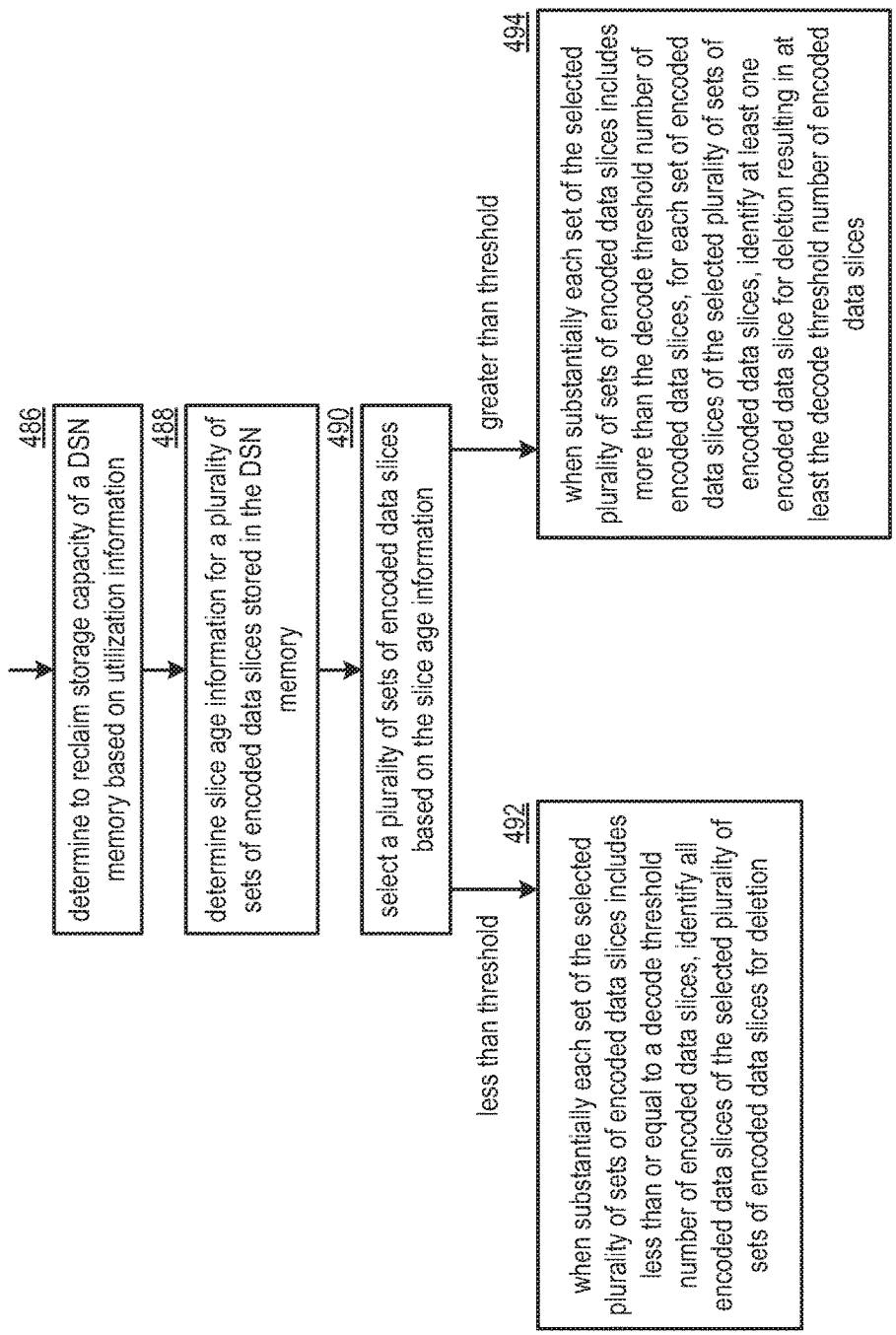
FIG. 43B is a flowchart illustrating an example of reclaiming storage capacity of a dispersed storage network (DSN) memory in accordance with the present invention.

FIG. 43B is a flowchart illustrating an example of reclaiming storage capacity of a dispersed storage network (DSN) memory. The method includes step 486 where a processing module (e.g., of a distributed storage and task (DST) integrity processing unit) determines to reclaim storage capacity of a DSN memory based on utilization information. For example, the processing module obtains the utilization information and indicates to reclaim the storage capacity when a level of storage capacity utilization is greater than a storage capacity utilization threshold level.

The method continues at step 488 where the processing module determines slice age information for a plurality of sets of encoded data slices stored in the DSN memory. The determining includes at least one of interpreting a query response, interpreting an error message, and extracting the slice age information from metadata of encoded data slices.

The method continues at step 490 where the processing module selects a plurality of sets of encoded data slices based on the slice age information. For example, the processing module identifies a plurality of sets of encoded data slices associated with an oldest slice age of a plurality of stored data objects (e.g., lowest priority for reliable ongoing storage). The method branches to step 494 when an interpretation of the slice age information indicates that each set of the selected plurality of sets of encoded data slices includes more than a decode threshold number of encoded data slices. The method continues to step 482 when each set of the selected plurality of sets of encoded data slices includes less than or equal to the decode threshold number of encoded data slices.

When substantially each set of the selected plurality of sets of encoded data slices includes less than or equal to the decode threshold number of encoded data slices, the method continues at step 492 where the processing module identifies all encoded data slices of the selected plurality of sets of encoded data slices for deletion. When substantially each set of the selected plurality of sets of encoded data slices includes more than the decode threshold number of encoded data slices, for each set of encoded data slices of the selected plurality of sets of encoded data slices, the method continues at step 494 where the processing module identifies at least one encoded data slice for deletion resulting in at least the decode threshold number of encoded data slices (e.g., remaining). Having identified the encoded data slices for deletion, the processing module facilitates deletion of the identified encoded data slices for deletion.

Figure 44A:
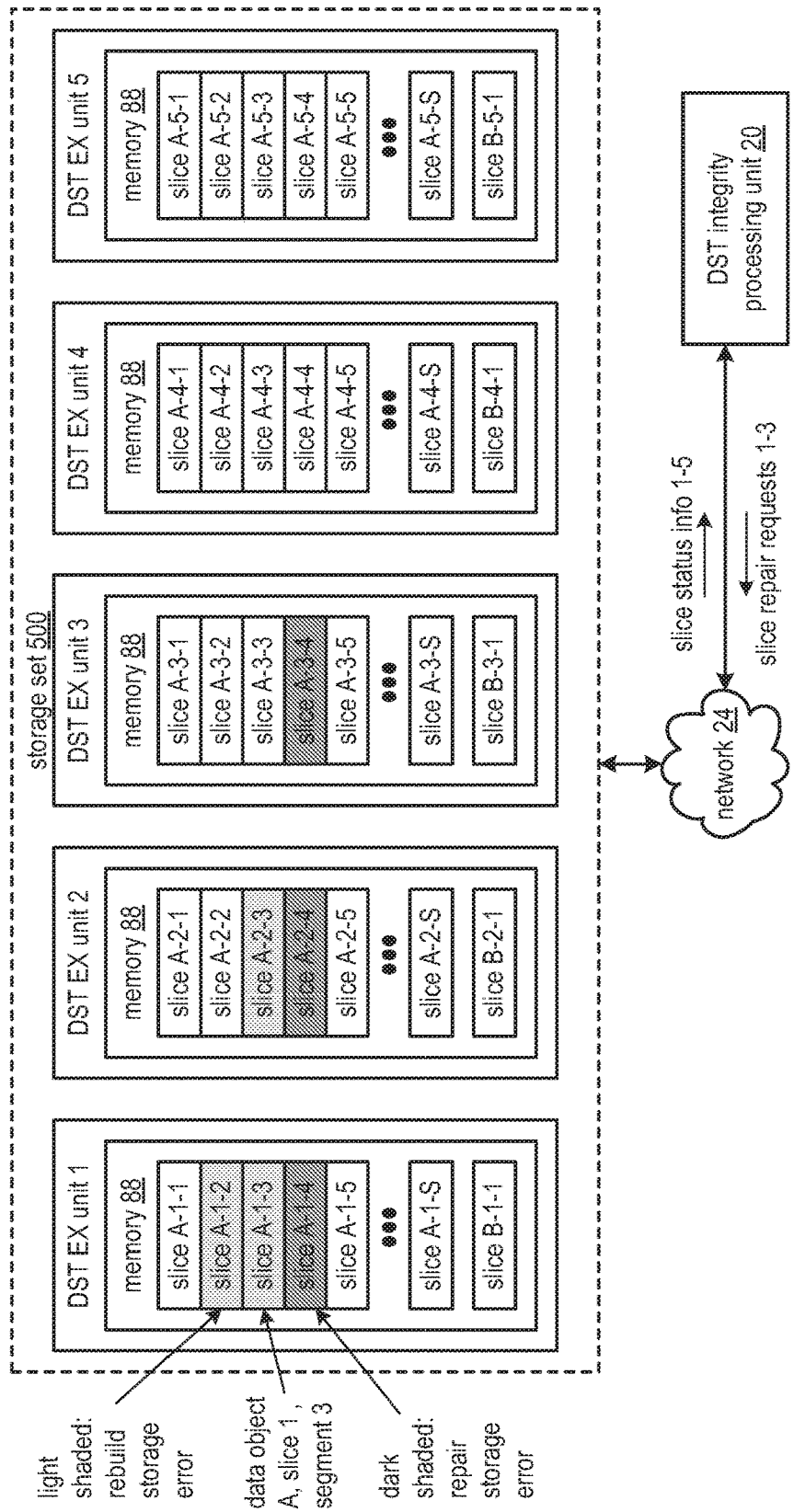
FIG. 44A is a schematic block diagram of another embodiment of a dispersed storage network (DSN) in accordance with the present invention.

FIG. 44A is a schematic block diagram of another embodiment of a dispersed storage network (DSN) that includes a storage set 500, the network 24 of FIG. 1, and the distributed storage and task (DST) integrity processing unit 20 of FIG. 1. Alternatively, the DST integrity processing unit 20 may be implemented utilizing one or more of the DST processing unit 16 of FIG. 1 and a DST execution unit 36 of FIG. 1. The storage set includes a set of DST execution (EX) units 1-5. Each DST execution unit includes the memory 88 of FIG. 3. Each DST execution unit may be implemented utilizing the DST execution unit 36 of FIG. 1. Hereafter, each DST execution unit may be interchangeably referred to as a storage unit and the storage set may be interchangeably referred to as a set of storage units. The DSN functions to select a storage error abatement function.

In an example of operation of the selection of the storage error abatement function, the DST integrity processing unit 20 detects a storage error associated with one or more sets of a plurality of sets of stored encoded data slices of a store data object, where the data object is divided into a plurality of S data segments, and where each data segment is dispersed storage error encoded to produce a set of encoded data slices of the plurality of sets of encoded data slices for storage in the set of DST execution units 1-5. For example, the DST integrity processing unit 20 interprets slice status information 1-5 received, via the network 24, from the DST execution units 1-5, to identify encoded data slices associated with the storage error. As another example, the DST integrity processing unit 20 interprets an error message. As yet another example, the DST integrity processing unit receives a rebuilding request.

For each set of encoded data slices associated with the detected storage error, the DST integrity processing unit 20 determines an availability status of each encoded data slice. For example, the DST integrity processing unit 20 counts a number of available encoded data slices based on the slice status information 1-5. As another example, the DST integrity processing unit 20 counts a number of unavailable encoded data slices based on slice status information 1-5.

When the set of encoded data slices associated with the detected storage error includes at least a decode threshold number of available encoded data slices, the DST integrity processing unit 20 and initiates a rebuilding function to abate the detected storage error. For example, for each available encoded data slice, the DST integrity processing unit 20 facilitates utilization of the rebuilding function (e.g., decode a decode threshold number of available encoded data slices to produce a recovered data segment, re-encode the recovered data segment to produce a rebuilt encoded data slice) to produce a rebuilt encoded data slice, and for each rebuilt encoded data slice, facilitate replacement of an unavailable encoded data slice with a corresponding rebuilt encoded data slice.

When the set of encoded data slices associated with the detected storage error includes less than the at least a decode threshold number of available encoded data slices, the DST integrity processing unit 20 initiates a slice repair function to abate the detected storage error. For example, for each unavailable encoded data slice, the DST integrity processing unit 20 facilitates utilization of the slice repair function (e.g., issue slice repair requests 1-3 to the associated storage units) to produce a repaired encoded data slice, and for each repaired encoded data slice, facilitate replacement of an unavailable encoded data slice with a corresponding repaired encoded data slice, where a storage unit performs the slice repair function. The performing of the slice repair function by the storage unit includes one or more of performing a filesystem repair operation, performing a memory recovery technique, and performing an individual data block rebuilding of an encoded data slice.

FIG. 44B is a flowchart illustrating an example of selecting a storage error abatement function. The method includes step 504 where a processing module (e.g., of a distributed storage and task (DST) integrity processing unit), for each set of encoded data slices associated with a detected storage error, determines an availability status of each encoded data slice of the set of encoded data slices, where data is dispersed storage error encoded to produce a plurality of sets of encoded data slices that includes the set of encoded data slices. The determining includes one or more of interpreting slice status information, interpreting an error message, receiving a rebuilding request, counting the number of available encoded data slices, and counting a number of unavailable encoded data slices. The method branches to step 508 when the set of encoded data slices associated with the detected storage error includes less than the at least a decode threshold number of available encoded data slices. The method continues to step 506 when the set of encoded data slices associated with the detected storage error includes at least the decode threshold number of available encoded data slices.

When the set of encoded data slices associated with the detected storage error includes the at least a decode threshold number of available encoded data slices, the method continues at step 506 where the processing module initiates a rebuilding function to abate the detected storage error. The initiating includes, for each unavailable encoded data slice, the processing module facilitating utilization of the rebuilding function to produce a rebuilt encoded data slice, and for each rebuilt encoded data slice, replaces an unavailable encoded data slice with a corresponding rebuilt encoded data slice. For example, the processing module decodes a decode threshold number of available encoded data slices to produce a recovered data segment, re-encodes the recovered data segment to produce a rebuilt encoded data slice, and sends the rebuilt encoded data slice to a storage unit associated with the unavailable encoded data slice for storage.

When a set of encoded data slices associated with the detected storage error includes less than the at least a decode threshold number of available encoded data slices, the method continues at step 508 where the processing module initiates a slice repair function to abate the detected storage error. The initiating includes, for each unavailable encoded data slice, facilitating utilization of the slice repair function to produce a repaired encoded data slice, and for each repaired encoded data slice, replacing an unavailable encoded data slice with a corresponding repaired encoded data slice, where a storage unit performs the slice repair function. For example, the processing module issues slice repair requests to associated storage units to initiate the slice repair function.

Figure 45A:
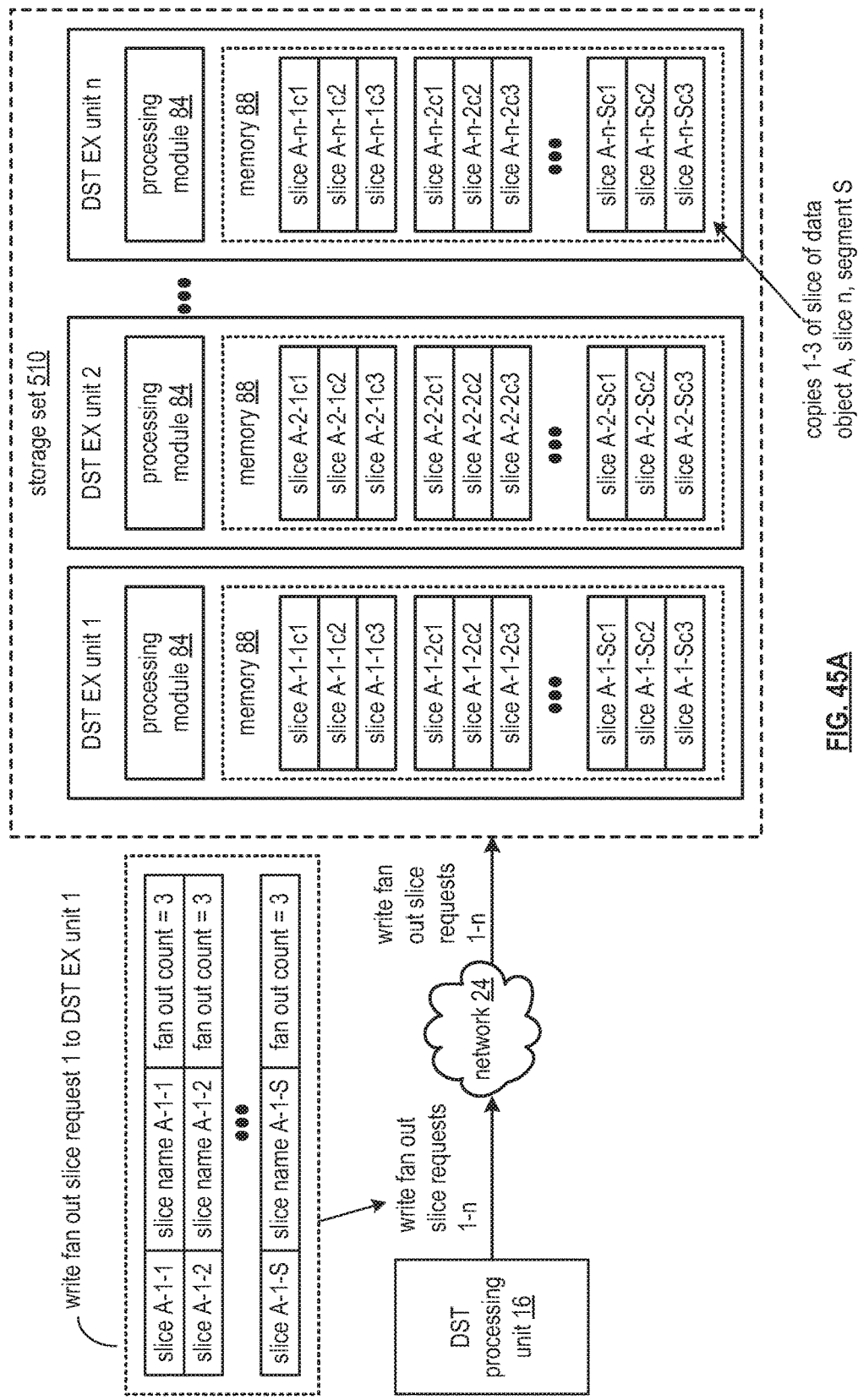
FIG. 45A is a schematic block diagram of another embodiment of a dispersed storage network (DSN) in accordance with the present invention.

FIG. 45A is a schematic block diagram of another embodiment of a dispersed storage network (DSN) that includes the distributed storage and task (DST) processing unit 16 of FIG. 1, the network 24 of FIG. 1, and a storage set 510. The storage set 510 includes a set of DST execution (EX) units 1-n. Each DST execution unit includes the processing module 84 of FIG. 3 and the memory 88 of FIG. 3. Each DST execution unit may be implemented utilizing the DST execution unit 36 of FIG. 1. Hereafter, each DST execution unit may be interchangeably referred to as a storage unit and the storage set may be interchangeably referred to as a set of storage units. The DSN functions to redundantly store data.

In an example of operation of the redundant storing of the data, a DST execution unit receives a write fan out slice request, where the request includes one or more of an encoded data slice for storage, a slice name of the encoded data slice, and a fan out count, where data is divided into a plurality of S data segments, and each data segment is dispersed storage error encoded to produce a set of encoded data slices of a plurality of sets of encoded data slices. For example, a first set of encoded data slices includes encoded data slices A-1-1, A-2-1, through A-n-1 and a Sth set of encoded data slices includes encoded data slices A-1-S, A-2-S, through A-n-S. For instance, the DST processing unit 16 generates a write fan out slice request 1 to include encoded data slice A-1-1, a slice name for encoded data slice A-1-1 and a fan out count of 3 for the encoded data slice A-1-1, etc., through the Sth encoded data slice A-1-S; and sends, via the network 24, the write fan out slice requests 1-n to the set of DST execution units 1-n.

Having received the write fan out slice request, the DST execution unit generates a plurality of replicated encoded data slices of the received encoded data slice in accordance with the fan out count. For example, the DST execution unit generates a fan out count number of 3 total replicate encoded data slices of the encoded data slice for storage (e.g., DST execution unit 1 and generates encoded data slices A-1-1c1, A-1-1c2, and A-1-1c3 as the three copies of the encoded data slice.

Having generated the replicated encoded data slices, for each replicated encoded data slice, the DST execution unit applies a deterministic function to the received slice name and a replicate encoded data slice of gunfire to produce a unique slice name for storage of and associated copy of the encoded data slice. The applying includes identifying the replicate encoded data slice identity (e.g., 1, 2, 3), selecting the deterministic function, (e.g., a predetermined function, received in the request, extracted from system registry information), performing the selected deterministic function on the slice name and the identity of the replicate encoded data slice to produce the unique slice name. Having produced the slice names, the DST execution unit facilitates storage of the replicated encoded data slices in the memory 88.

Having stored the replicated encoded data slices, for each stored replicated encoded data slice, the DST execution unit associates a storage location with a corresponding unique slice name of the replicated encoded data slice. The associating includes updating a slice name-to-storage location table that associates the unique slice name and the storage location. Alternatively, or in addition to, the DST execution unit receives the unique slice names for the copies of encoded data slices in the request in lieu of the fan out count.

Having associated the storage locations with the unique slice names, the DST execution unit issues a write response to the DST processing unit 16 that includes a status of storing of the plurality of replicate encoded data slices. For example, the DST execution unit 1 generates a write response 1 indicating that three copies of each encoded data slice to be stored in the DST execution unit 1 has been stored, and sends, via the network 24, the write response 1 to the DST processing unit 16.

Figure 45B:
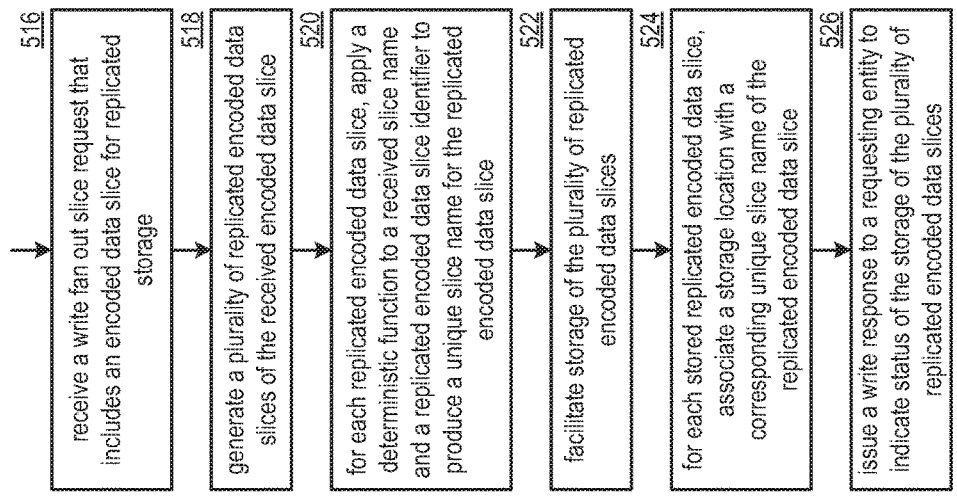
FIG. 45B is a flowchart illustrating an example of redundantly storing data in accordance with the present invention.

FIG. 45B is a flowchart illustrating an example of redundantly storing data. The method includes step 516 where a processing module (e.g., of a distributed storage and task (DST) execution unit) receives a write fan out slice request that includes an encoded data slice for replicated storage. The method continues at step 518 where the processing module generates a plurality of replicated encoded data slices of the received encoded data slice. The generating includes determining a number of replicated encoded data slices to generate (e.g., interpreting a fan out count, counting the number of received slice names), and copying the received encoded data slice to produce the determined number of replicated encoded data slices.

For each replicated encoded data slice, the method continues at step 520 where the processing module applies a deterministic function to a received slice name and a replicated encoded data slice identifier to produce a unique slice name for the replicated encoded data slice. For example, the processing module identifies the replicated encoded data slice identifier, selects the deterministic function, and performs the selected deterministic function on the slice name and the identifier of the replicated encoded data slice to produce the unique slice name. Alternatively, the processing module extracts a unique slice name for each replicated encoded data slice from the write fan out request when receiving the two or more slice names for a common encoded data slice.

The method continues at step 522 where the processing module facilitates storage of the plurality of replicated encoded data slices. For example, the processing module stores the plurality of replicated encoded data slices in a local memory. For each stored replicated encoded data slice, the method continues at step 524 where the processing module associates a storage location with a corresponding unique slice name of the replicated encoded data slice. For example, the processing module updates a slice name-to-location table that associates the unique slice name and the storage location.

The method continues at step 526 where the processing module issues a write response to a requesting entity to indicate status of the storage of the plurality of replicated encoded data slices. For example, for each replicated encoded data slice, the processing module generates a corresponding storage status indicator (e.g., number of replicated encoded data slices successfully stored) with regards to storage of the replicated encoded data slice, generates the write response to include the storage status indicator of each replicated encoded data slice, and sends the write response to the requesting entity.

Figure 46A:
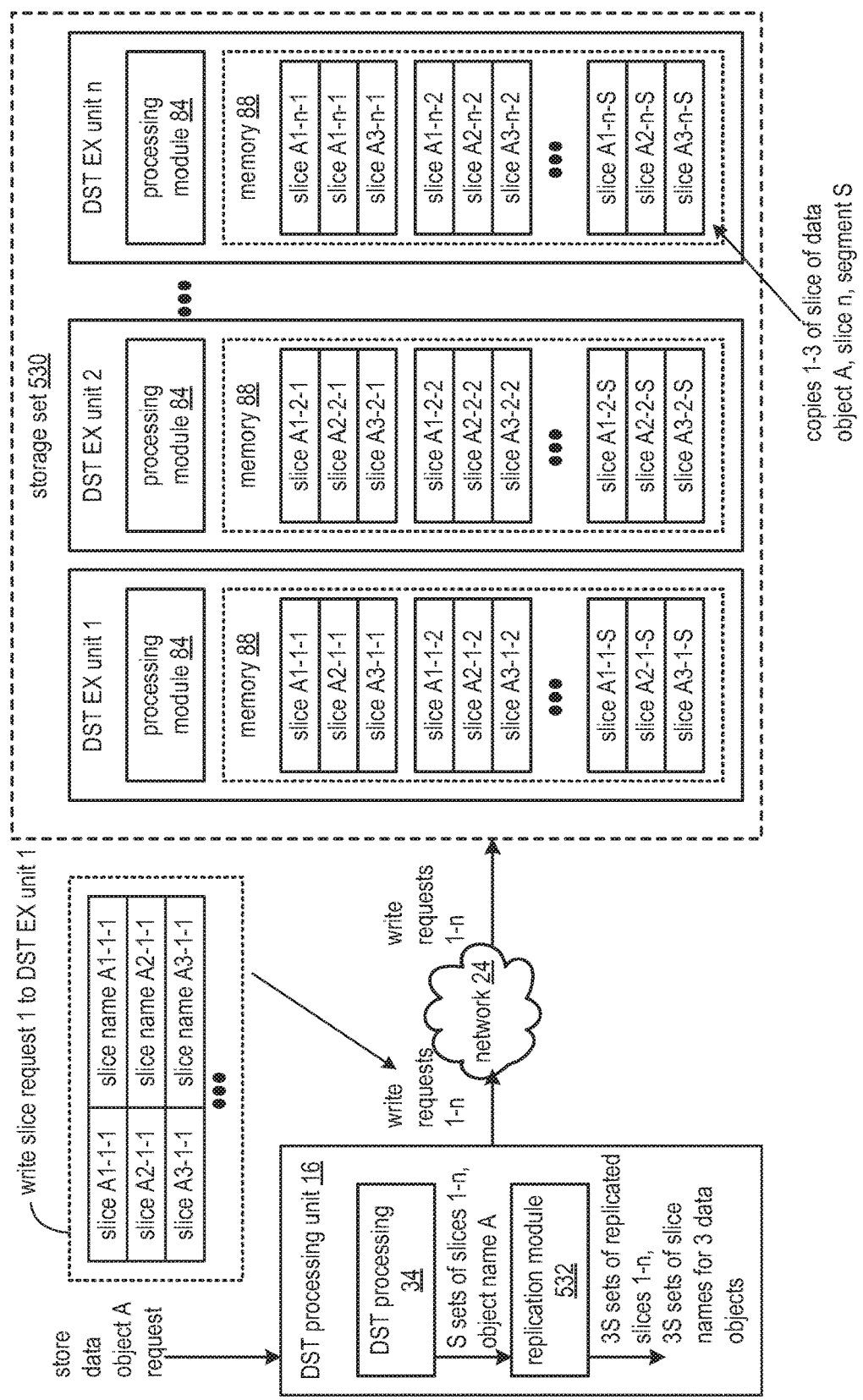
FIG. 46A is a schematic block diagram of another embodiment of a dispersed storage network (DSN) in accordance with the present invention.

FIG. 46A is a schematic block diagram of another embodiment of a dispersed storage network (DSN) that includes the distributed storage and task (DST) processing unit 16 of FIG. 1, the network 24 of FIG. 1, and a storage set 530. The DST processing unit 16 includes the DST processing 34 of FIG. 1 and a replication module 532. The replication module 532 may be implemented utilizing the processing module 84 of FIG. 3. The storage set includes a set of DST execution (EX) units 1-n. Each DST execution unit includes the processing module 84 of FIG. 3 and the memory 88 of FIG. 3. Each DST execution unit may be implemented utilizing the DST execution unit 36 of FIG. 1. Hereafter, each DST execution unit may be interchangeably referred to as a storage unit and the storage set may be interchangeably referred to as a set of storage units. The DSN functions to redundantly store data.

In an example of operation of the redundant storing of the data, the DST processing unit 16 receives a store data object request, where the request includes one or more of a data object for storage, a data object name, and an instance count. For example, the DST processing unit 16 receives a store data object A request that includes a data object A, a data object name A, and an instance count=3. Having received the store data object request, the DST processing 34 of the DST processing divides the received data object into a plurality of S data segments and dispersed storage error encodes each data segment to produce a plurality of S sets of encoded data slices.

Having produced the plurality of sets of encoded data slices, for each data object name, the DST processing 34 generates a corresponding plurality of sets of slice names for the plurality of sets of encoded data slices. For example, the DST processing 34 generates a random object number, combines the random object number with a vault identifier associated with the stored data object request to produce a source name, and generates S number of sets of slice names that includes one or more of the source name, a segment identifier (e.g., 1-S), and a slice index number (e.g., 1-n).

With the plurality of sets of slice names produced, the replication module 532 replicates the plurality of sets of encoded data slices based on the instance count to produce an instance count number of plurality of sets of replicated encoded data slices. For example, a first plurality of sets of encoded data slices includes a first set of encoded data slices that includes encoded data slices A1-1-1, A1-2-1, through A1-n-1 and a Sth set of encoded data slices includes encoded data slices A1-1-S, A1-2-S, through A1-n-S. As another example, a second plurality of sets of encoded data slices includes a first set of encoded data slices that includes encoded data slices A2-1-1, A2-2-1, through A2-n-1 and a Sth set of encoded data slices includes encoded data slices A2-1-S, A2-2-S, through A2-n-S. In yet another example, in all, the replication module 532 generates 3S sets of replicated encoded data slices 1-n when the instance count is 3.

With the encoded data slices replicated, the DST processing unit 16 facilitates storage of the replicated encoded data slices utilizing the corresponding plurality of sets of slice names. For example, the DST processing unit 16, for each storage unit of the set of storage units, generates a write slice request of a set of write slice request 1-n, where the write slice request includes an instant count number of replicated encoded data slices for each encoded data slice corresponding to the storage unit for each set of encoded data slices, and sends, via the network 24, the generated read slice request to the storage unit. For example, the DST processing unit 16 issues a read slice request 1 to the DST execution unit 1, where the write slice request 1 includes encoded data slice A1-1-1 and a slice name for encoded data slice A1-1-1, encoded data slice A2-1-1 and a slice name for encoded data slice A2-1-1, encoded data slice A3-1-1 and a slice name for encoded data slice A3-1-1, etc., through encoded data slice A1-1-S and a slice name for encoded data slice A1-1-S, encoded data slice A2-1-S and a slice name for encoded data slice A2-1-S, encoded data slice A3-1-S and a slice name for encoded data slice A3-1-S.

Figure 46B:
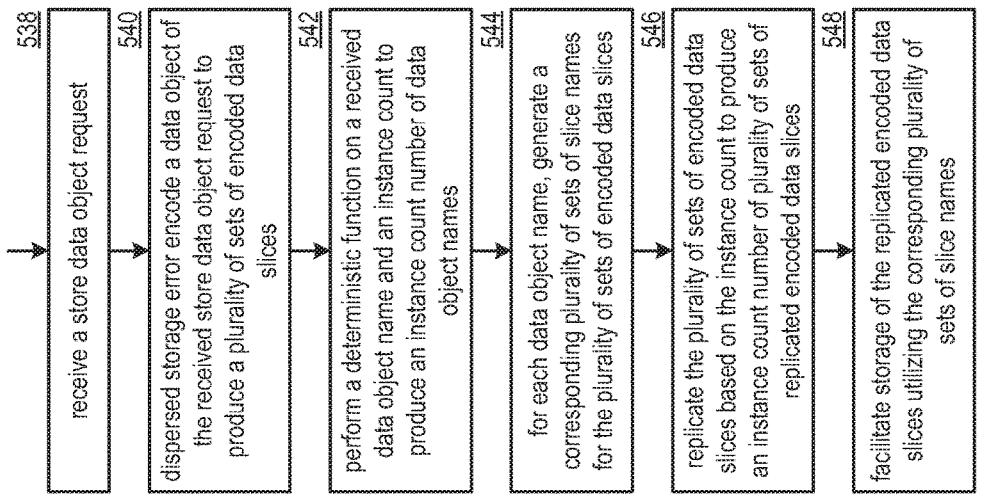
FIG. 46B is a flowchart illustrating another example of redundantly storing data in accordance with the present invention.

FIG. 46B is a flowchart illustrating another example of redundantly storing data. The method includes step 538 where a processing module (e.g., of a distributed storage and task (DST) processing unit) receives a store data object request. The method continues at step 540 where the processing module dispersed storage error encodes a data object of the received store data object request to produce a plurality of sets of encoded data slices.

The method continues at step 542 where the processing module performs a deterministic function on a received data object name and an instance count to produce an instance count number of data object names. The deterministic function may include one or more of a hashing function, a hash-based message authentication code function, a sponge function, and a mask generating function. For example, the processing module selects the deterministic function, performs the selected deterministic function on the received data object name and the instance count to produce the instance count number of data object names.

For each data object name, the method continues at step 544 where the processing module generates a corresponding plurality of sets of slice names for the plurality of sets of encoded data slices. For example, the processing module generates a random object number, combines the random object number with a vault identifier to produce a source name, and generates S sets of slice names in accordance with a number of segments S of the data object.

The method continues at step 546 where the processing module replicates the plurality of sets of encoded data slices based on the instance count to produce an instance count number of plurality of sets of replicated encoded data slices. The method continues at step 548 where the processing module facilitates storage of the replicated encoded data slices utilizing the corresponding plurality of sets of slice names. For example, for each storage unit of a set of storage units, the processing module generates a write slice request that includes an instance count number of replicated encoded data slices for each encoded data slice corresponding to the storage unit for each set of encoded data slices, and sends the generated write slice requests to the storage unit.

Figure 47A:
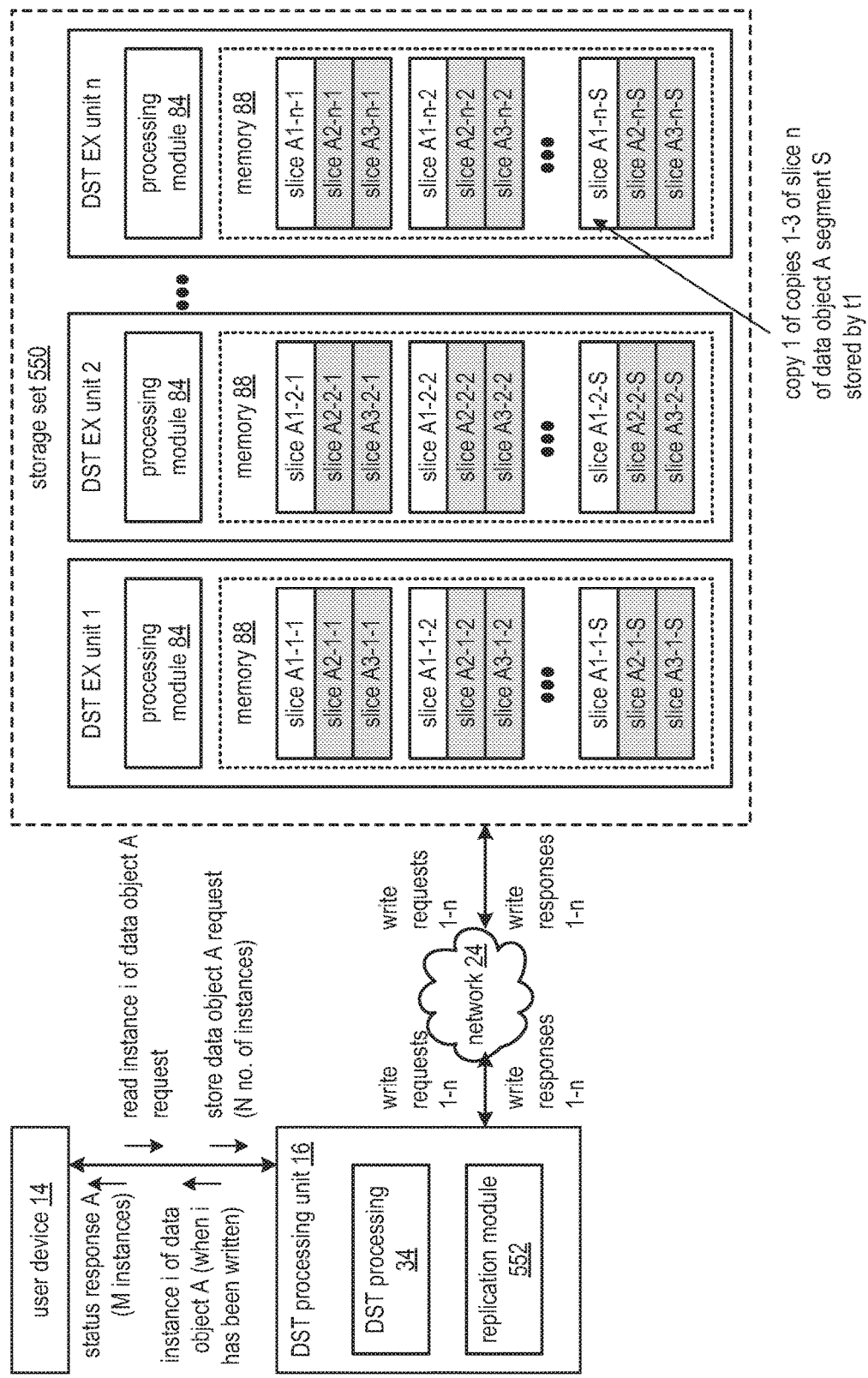
FIG. 47A is a schematic block diagram of another embodiment of a dispersed storage network (DSN) in accordance with the present invention.

FIG. 47A is a schematic block diagram of another embodiment of dispersed storage network (DSN) that includes the user device 14 of FIG. 1, the distributed storage and task (DST) processing unit 16 of FIG. 1, the network 24 of FIG. 1, and a storage set 550. The DST processing unit 16 includes the DST processing 34 of FIG. 1 and a replication module 552. The replication module 552 may be implemented utilizing the replication module 532 of FIG. 46A. The storage set includes a set of DST execution (EX) units 1-n. Each DST execution unit includes the processing module 84 of FIG. 3 and the memory 88 of FIG. 3. Each DST execution unit may be implemented utilizing the DST execution unit 36 of FIG. 1. Hereafter, each DST execution unit may be interchangeably referred to as a storage unit and the storage set may be interchangeably referred to as a set of storage units. The DSN functions to access redundantly stored data.

In an example of operation of the accessing of the redundantly stored data, the DST processing unit 16 receives a store data object request from the user device 14. The store data object request includes one or more of a data object (e.g., data object A) for storage and an instance count N (e.g., 3). Having received the store data object request, the DST processing unit 16 initiates storage of N instances of the received data object in the storage set. For example, the DST processing 34 dispersed storage error encodes the data object A to produce sets of encoded data slices and generates one or more unique sets of slice names for each instance. The replication module 552 replicates the sets of encoded data slices to produce N replicated sets of encoded data slices. The DST processing unit 16 sequentially stores each replicated sets of encoded data slices from instance 1 through N. For the example, the DST processing unit issues, via the network 24, a set of write requests 1-n to the storage set 550, where the set of write requests 1-n facilitates sending encoded data slices A1-1-1, A1-1-2, through A1-1-S to DST execution unit 1, encoded data slices A1-2-1, A1-2-2, through A1-2-S to DST execution unit 2, etc., for the first instance of the sets of encoded data slices etc. (e.g., for the other instances).

The DST execution units issues, via the network 24, write responses 1-n to the DST processing unit 16 in response to the write requests 1-n indicating status (e.g., successfully stored, not stored yet, storage failure) of storage of sets of encoded data slices of the one or more instances. For example, at a time t1, the DST execution units 1-n issue write responses 1-n indicating that only the first instance of the sets of encoded data slices have been successfully stored so far.

The DST processing unit 16 issues a status response to the user device 14 when detecting that M is of the N instances have been successfully stored (e.g., at a given time frame). For example, at time t1, the DST processing unit 16 interprets received write responses to identify a successfully stored instance, generates a status response A, and issues a status response A to the user device 14 indicating that M=1 instance has been successfully stored. Alternatively, or in addition to, the DST processing unit 16 issues the status response to the user device 14 in response to a status request received from the user device 14.

The DST processing 16 issues an instance i of the data object to the user device 14 when receiving a read instance i data object request from the user device 14 and the instance i has been successfully written to the storage set. For example, the DST processing unit 16 receives a read instance i of data object A request from the user device 14, determines whether the instance i has been successfully written (e.g., query a status table, interpret received list slice responses, interprets received read slice responses), and when successfully written, recovers the instance i (e.g., retrieves at least a decode threshold number of encoded data slices for each of the sets of encoded data slices associated with the instance, and for each set, dispersed storage error decodes the retrieved at least a decode threshold number of encoded data slices to reproduce a data segment of the data object A), and sends the ith reproduced instance of data object A to the user device 14.

Figure 47B:
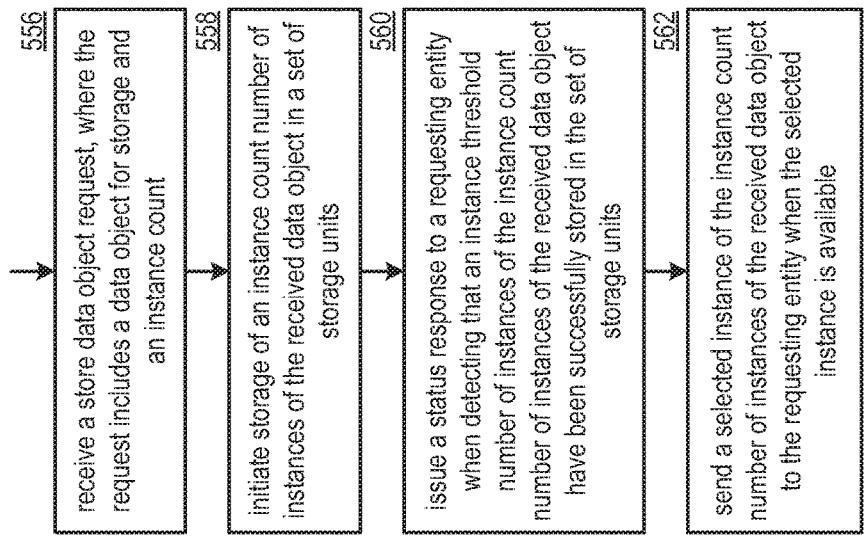
FIG. 47B is a flowchart illustrating an example of accessing redundantly stored data in accordance with the present invention.

FIG. 47B is a flowchart illustrating an example of accessing redundantly stored data. The method includes step 556 where a processing module (e.g., of a distributed storage and task (DST) processing unit) receives a store data object request, where the request includes a data object for storage and an instance count. The store data object request includes one or more of a data object for storage, and instance count N, an identifier of a requesting entity, and a name of the data object.

The method continues at step 558 where the processing module initiates storage of an instance count number of instances of the received data object in a set of storage units. For example, the processing module dispersed storage error encodes the data object to produce sets of encoded data slices, for each instance, generates one or more unique sets of slice names, replicates sets of encoded data slices to produce N replicated sets of encoded data slices, and sequentially stores each replicated sets of encoded data slices from instance 1 to instance N.

The method continues at step 560 where the processing module issues a status response to a requesting entity when detecting that an instance threshold number of instances of the instance count number of instances of the received data object have been successfully stored in the set of storage units. For example, the processing module interprets received write responses to identify a successfully stored instance, generates and sends the status response to the requesting entity when the number of successfully stored instances is substantially the same as the instance threshold number. Alternatively, or in addition to, the processing module issues the status response receiving a status request from the requesting entity.

The method continues at step 562 where the processing module sends a selected instance of the instance count number of instances of the received data object to the requesting entity when the selected instance is available. For example, the processing module receives a read instance request, determines whether the instance has been successfully stored, when successfully stored, recovers the instance, and sends the selected instance to the requesting entity.

Figure 48A:
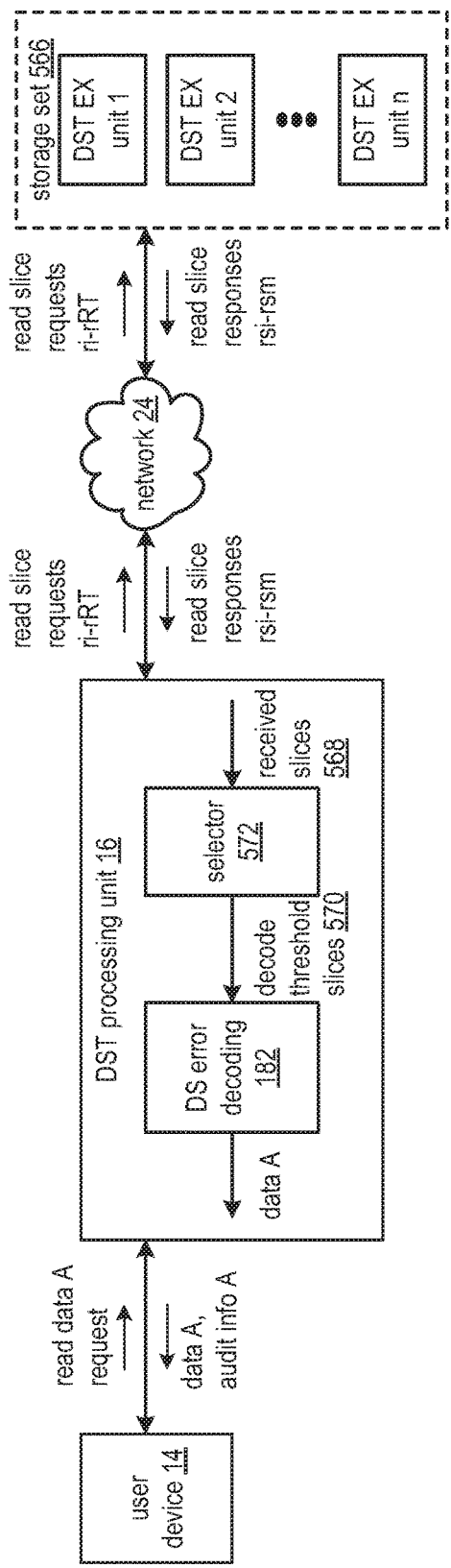
FIG. 48A is a schematic block diagram of another embodiment of a dispersed storage network (DSN) in accordance with the present invention.

FIG. 48A is a schematic block diagram of another embodiment of dispersed storage network (DSN) that includes the user device 14 of FIG. 1, the distributed storage and task (DST) processing unit 16 of FIG. 1, the network 24 of FIG. 1, and a storage set 566. The DST processing unit 16 includes the dispersed storage (DS) error decoding 182 of FIG. 13 and a selector 572. The selector 572 may be implemented utilizing the processing module 84 of FIG. 3. The storage set 566 includes a set of DST execution (EX) units 1-n. Each DST execution unit may be implemented utilizing the DST execution unit 36 of FIG. 1. Hereafter, each DST execution unit may be interchangeably referred to as a storage unit and the storage set may be interchangeably referred to as a set of storage units. The DSN functions to generate audit information when retrieving a data object that has been stored in the storage set. The audit information includes one or more of a data object identifier (ID), identifiers of requested slices, identifiers of received slices, and identifiers of slices utilized to reproduce the data object.

In an example of operation of the generating of the audit information when retrieving the stored data object from the storage set, the DST processing unit 16 receives a read data object request from the user device 14 to reproduce the data object, where the data object is dispersed storage error encoded to produce a plurality of sets of encoded data slices that are stored in the storage set and where at least a decode threshold number of encoded data slices for each set of encoded data slices are required to recover the data object. For example, the DST processing unit 16 receives a read data object A request from the user device 14, where the request includes a name of the data object A.

Having received the read data object request, the selector 572, for each set of encoded data slices, selects a read threshold number of encoded data slices for retrieval. The read threshold is greater than or equal to the decode threshold and less than or equal to an information dispersal algorithm (IDA) width. The selecting may be based on one or more of a storage unit performance level, a storage unit availability level, and a predetermination. Having selected the encoded data slices, the DST processing unit 16 produces the slice names associated with the selected encoded data slices (e.g., based on a directory lookup) and temporarily stores the slice names as a component of audit information.

Having selected the read threshold number of encoded data slices for retrieval, the DST processing unit 16 issues read slice requests to at least some of the storage units of the storage set to recover the selected read threshold number of encoded data slices. For example, the DST processing unit 16 identifies storage units associated with the slice names of the selected read threshold number of encoded data slices, generates the read slice request, and sends, via the network 24, the read slice requests (e.g., read slice requests ri-rRT) to the identified storage units.

Having sent the read slice requests, the DST processing unit 16 receives read slice responses from at least some of the storage units. For example, the DST processing unit 16 receives, via the network 24, the read slice responses (e.g., read slice responses rsi-rsm) from the at least some of the storage units, where the read slice responses include encoded data slices 568 and slice names of the encoded data slices. Having produced the slice names, the DST processing unit 16 temporarily stores the slice names of the received encoded data slices 560 as another component of the audit information For received encoded data slices 568 of a set of encoded data slices of the plurality of sets of encoded data slices, the selector 572 selects a decode threshold number of encoded data slices 570. The selecting includes one or more of selecting first received encoded data slices, performing a random selection, selecting slices from a list, etc. Having selected the decode threshold number of encoded data slices 570, the selector 572 temporarily stores identifiers of the selected decode threshold number of encoded data slices as yet another component of the audit information.

For each set of encoded data slices, the DS error decoding 182 dispersed storage error decodes the selected decode threshold number of encoded data slices 570 to reproduce the data object. For example, the DS error decoding 182 decodes a corresponding decode threshold number of encoded data slices 570 from each set of the plurality of sets of encoded data slices to reproduce data object A.

Having reproduced the data object, the DST processing unit 16 sends the reproduced data object and the audit information to the user device 14, where the audit information includes, for each set of encoded data slices, the identifiers of the selected read threshold number of encoded data slices, the identifiers of the received encoded data slices, and the identifiers of the selected decode threshold number of encoded data slices. Alternatively, or in addition to, the DST processing unit 16 facilitates storage of the audit information in one or more of a local memory and as one or more sets of encoded audit slices in the storage set 566.

Figure 48B:
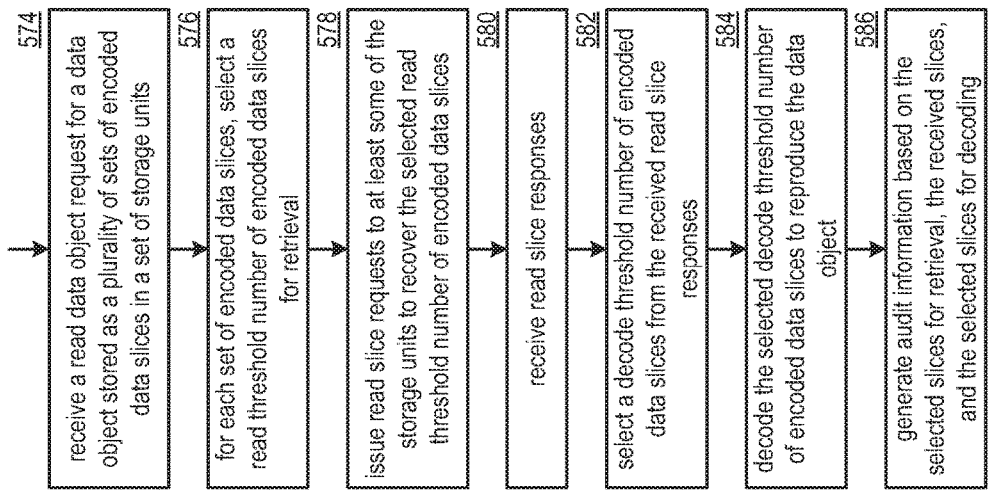
FIG. 48B is a flowchart illustrating an example of generating audit information when retrieving data that has been stored in a dispersed storage network (DSN) memory in accordance with the present invention.

FIG. 48B is a flowchart illustrating an example of generating audit information when retrieving data that has been stored in a dispersed storage network (DSN) memory. The method includes step 574 where a processing module (e.g., of a distributed storage and task (DST) processing unit) receives a read data object request for a data object stored as a plurality of sets of encoded data slices in a set of storage units. For each set of encoded data slices, the method continues at step 576 where the processing module selects a read threshold number of encoded data slice for retrieval. The selecting may be based on one or more of a storage unit performance level, a storage unit availability level, retrieval history, and a predetermination. The selecting further includes the processing module temporarily storing identifiers (e.g., slice names, of the selected read threshold number of encoded data slices (e.g., in a local memory).

The method continues at step 578 where the processing module issues read slice requests to at least some of the storage units to recover the selected read threshold number of encoded data slices. For example, the processing module identifies storage units associated with the read threshold number of encoded data slices, generates the read slice request, and sends the read slice requests to the identified storage units.

The method continues at step 580 where the processing module receives read slice responses. The receiving includes temporarily storing identifiers of received encoded data slices of the received read slice responses. The method continues at step 582 where the processing module selects a decode threshold number of encoded data slices from the received read slice responses. The selecting includes at least one of selecting first received slices, performing a random selection within a timeframe, and selecting in accordance with a slice selection list. The selecting further includes temporally storing identifiers of the selected decode threshold number of encoded data slices.

The method continues at step 584 where the processing module decodes the selected decode threshold number of encoded data slices to reproduce the data object. The decoding may further include the processing module sending the reproduced data object to a requesting entity. The method continues at step 586 where the processing module generates audit information based on the selected slices for retrieval, the received slices, and the selected slices for decoding. For example, the processing module generates the audit information to include one or more of an identifier of the data object, the identifiers of the selected read threshold number of encoded data slices, the identifiers of the received encoded data slices, and the identifiers of the selected decode threshold number of encoded data slices. Alternatively, or in addition to, the processing module facilitate storage of the audit information in one or more of a local memory and the set of storage units.

Figure 49A:
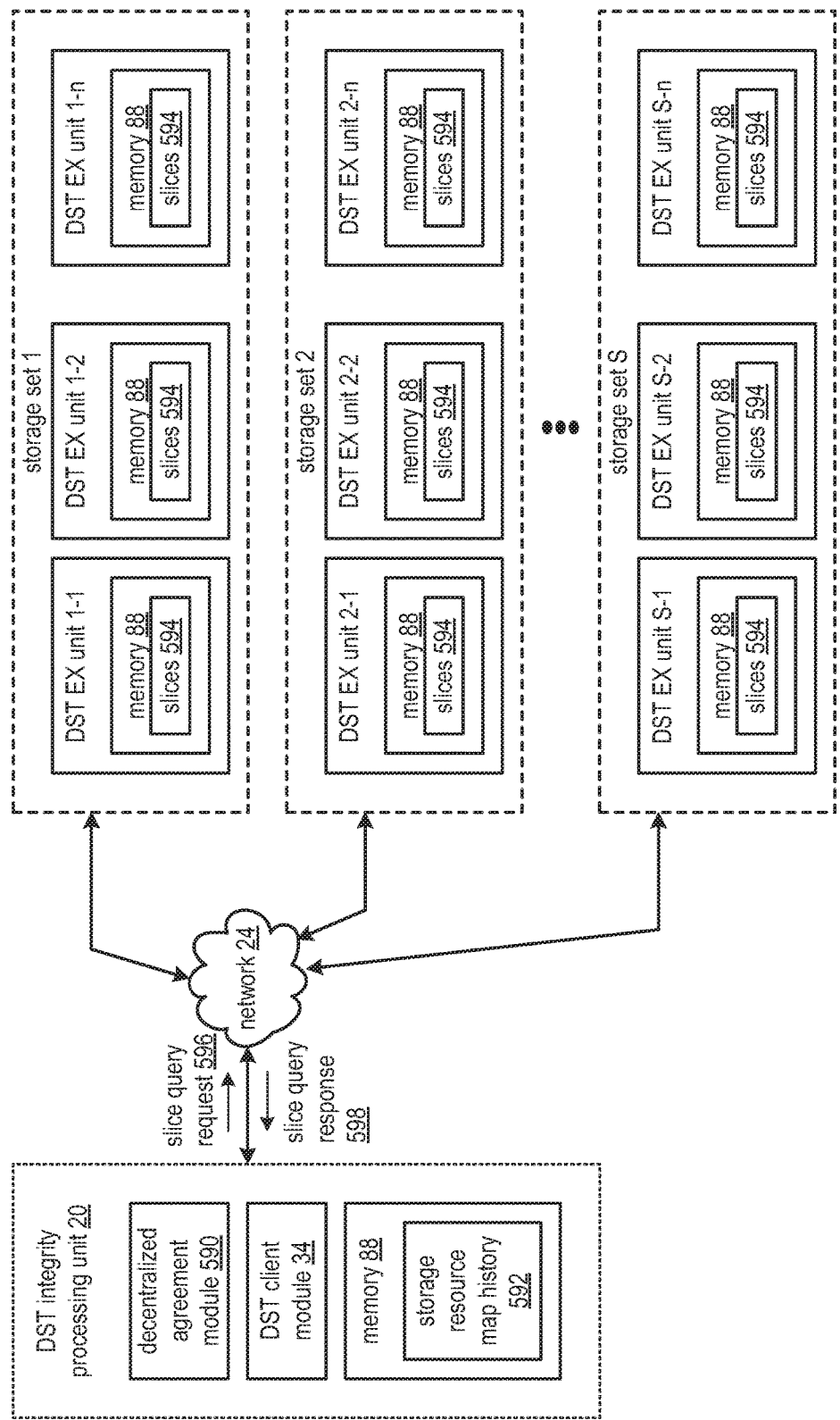
FIG. 49A is a schematic block diagram of another embodiment of a dispersed storage network (DSN) in accordance with the present invention.

FIG. 49A is a schematic block diagram of another embodiment of a dispersed storage network (DSN) that includes the distribute storage and task (DST) integrity processing unit 20 of FIG. 1, the network 24 of FIG. 1, and a plurality of storage sets 1-S. The DST integrity processing unit 20 includes a decentralized agreement module 590, the DST client module 34 of FIG. 1, and the memory 88 of FIG. 3. The decentralized agreement module 590 may be implemented utilizing the decentralized agreement module 350 of FIG. 40A. Each storage set includes a set of DST execution (EX) units 1-n. Each DST execution unit includes the memory 88 of FIG. 3. Each DST execution unit may be implemented utilizing the DST execution unit 36 of FIG. 1. Hereafter, each DST execution unit may be interchangeably referred to as a storage unit and each storage set may be interchangeably referred to as a set of storage units. The DSN functions to search for misplaced data.

In an example of operation of the searching for the misplaced data, the DST integrity processing unit 20 detects a missing encoded data slice storage error associated with a current revision of a storage resource mapping, where storage resources of the DSN are selected for storage of the data in accordance with the decentralized agreement module 590 performing a distributed agreement protocol function on an identifier of the data utilizing the current revision of the storage resource mapping. For example, the processing module performs the detection by performing the distributed agreement protocol function on an identifier of the data using the current storage resource mapping to identify current storage resources, issues a slice query request 596 to the identified current storage resources, and indicates the missing encoded data slice when a received slice query response 598 does not include an associate identifier of the data (e.g., a slice name).

For one or more previous revisions of the storage resource mapping, the DST integrity processing unit 20 accesses a storage resource mapping history 592 maintained within the memory 88 of the DST integrity processing unit 20 to identify a next oldest revision of the storage resource mapping. For example, the DST client module 34 accesses the memory 88 of the DST integrity processing unit 20 to recover the storage resource map history 592.

Having accessed the storage resource mapping history 592, the DST client module 34 determines whether the data of the storage error is available from a previous storage resource in accordance with the identify next oldest revision of the storage resource mapping. For example, the decentralized agreement module 590 applies the distributed agreement protocol function to the identifier the data using the next oldest storage resource mapping to identify the previous storage resources, issues, via the network 24, another query request to the previous storage resources, receives a query response, indicates not available when the response does not include the associated identifier the data, and repeats the steps of the determining to identify a further next oldest revision of the storage resource mapping and to determine whether the data is available from another previous resource in accordance with the identified further next oldest previous storage resource.

When locating the data within a location cycle) e.g., within a predetermined number of recursive searches), the DST integrity processing unit 20 facilitates migration of the data. For example, the DST integrity processing unit 20 recovers slices 594 from the identify previous storage resource and stores the recovered slices 594 in the current storage resources.

Figure 49B:
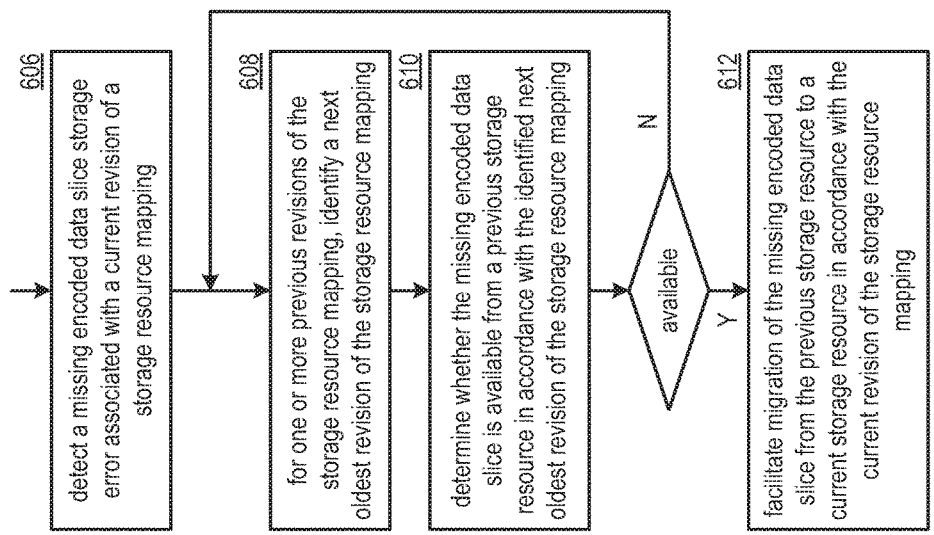
FIG. 49B is a flowchart illustrating an example of searching for misplaced data in accordance with the present invention.

FIG. 49B is a flowchart illustrating an example of searching for misplaced data. The method includes step 606 where a processing module (e.g., of a distributed storage and task (DST) integrity processing unit) detects a missing encoded data slice storage error associated with a current revision of a storage resource mapping. For example, for a given identifier the data, the processing module performs a distributed agreement protocol function on the identifier of the data using the current storage resource mapping to identify current storage resources, issues a slice query request to the identified current storage resources, and indicates the missing encoded data slice when a received slice query response does not include an associated identifier of the data (e.g., a correct slice name).

For one or more previous revisions of the storage resource mapping, the method continues at step 608 where the processing module identifies a next oldest revision of the storage resource mapping. For example, the processing module accesses a stored storage resource mapping and identifies a next oldest revision identifier.

The method continues at step 610 where the processing module determines whether the missing encoded data slice is available from a previous storage resource in accordance with the identified next oldest revision of the storage resource mapping. For example, the processing module applies the distributed agreement protocol function to the identifier the data using the next oldest storage resource mapping to identify the previous storage resource, issues another query request, receives a query response, indicates not available when the response does not include the associated identifier the data, and repeats the steps of identifying a further next oldest revision of the storage resource mapping and determining whether the data is available from another previous resource in accordance with the identified further next oldest previous storage resource. The method loops back to step 608 when the missing encoded data slice is not available from the previous storage resource. The method continues to step 612 when the missing encoded data slice is available from the previous storage resource.

The method continues at step 612 where the processing module facilitates migration of the missing encoded data slice from the previous storage resource to a current storage resource in accordance with the current revision of the storage resource mapping when the missing encoded data slices available from the previous storage resource. For example, the processing module recovers encoded data slices from the identify previous storage resource and stores the recovered encoded data slices in the current storage resource.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc., described with reference to one or more of the embodiments discussed herein. Further, from figure to figure, the embodiments may incorporate the same or similarly named functions, steps, modules, etc., that may use the same or different reference numbers and, as such, the functions, steps, modules, etc., may be the same or similar functions, steps, modules, etc., or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. A method comprises:
    determining to create a new set of encoded data slices based on an unfavorable storage performance level associated with one or more storage units (SUs) within a dispersed storage network (DSN);
    partially decoding, by a storage unit (SU) of the DSN, a first encoded data slice of a set of encoded data slices in accordance with previous dispersed storage error encoding parameters having a previous threshold number to produce a partially decoded first encoded data slice, wherein the first encoded data slice is stored by another SU of the DSN and is transmitted from the another SU via the DSN and received via an interface of the SU that is configured to interface and communicate with the DSN, and wherein a data segment of a data object is encoded into the set of encoded data slices in accordance with the previous dispersed storage error encoding parameters;
    partially re-encoding, by the SU, the partially decoded first encoded data slice in accordance with updated dispersed storage error encoding parameters having an updated threshold number to produce a first partially re-encoded data slice, wherein the first partially re-encoded data slice is used to create a new first encoded data slice of the new set of encoded data slices that corresponds to the data segment being dispersed storage error encoded in accordance with the updated dispersed storage error encoding parameters, wherein the partially re-encoding comprises:
        obtaining a new encoding matrix corresponding to the updated dispersed storage error encoding parameters;
        reducing the new encoding matrix based on a matrix position corresponding to the new first encoded data slice of the new set of encoded data slices that corresponds to the data segment being dispersed storage error encoded in accordance with the updated dispersed storage error encoding parameters; and
        matrix multiplying the reduced new encoding matrix with the partially decoded first encoded data slice to produce the first partially re-encoded data slice;
    receiving, by the SU via the DSN and via the interface of the SU, a plurality of second partially re-encoded data slices from a sub-set of other SUs of the DSN, wherein the plurality of second partially re-encoded data slices is created in accordance with the updated dispersed storage error encoding parameters based on partially re-encoding by the sub-set of other SUs of the DSN; and
    generating, by the SU, a new second encoded data slice of the new set of encoded data slices from the plurality of second partially re-encoded data slices.

2. The method of claim 1, wherein the partially decoding comprises:
    obtaining a decoding matrix corresponding to the previous dispersed storage error encoding parameters;
    generating a reduced data matrix based on a second encoded data slice of the set of encoded data slices that correspond to the data segment being encoded in accordance with the previous dispersed storage error encoding parameters; and
    matrix multiplying the decoding matrix and the reduced data matrix to produce the partially decoded first encoded data slice.

3. The method of claim 1, wherein the DSN includes at least one of a wireless communication system, a wire lined communication system, a non-public intranet system, a public internet system, a local area network (LAN), or a wide area network (WAN).

4. The method of claim 1, wherein the receiving the plurality of second partially re-encoded data slices comprises:
receiving one of the plurality of second partially re-encoded data slices from a first other SU of the sub-set of other SUs, wherein the first other SU generated the one of the plurality of second partially re-encoded data slices by:
partially decoding a second encoded data slice of the set of encoded data slices in accordance with the previous dispersed storage error encoding parameters and an encoded data slice of the set of encoded data slices stored by the first other SU to produce a first partially decoded second encoded data slice; and
partially re-encoding the first partially decoded second encoded data slice in accordance with the updated dispersed storage error encoding parameters to produce the one of the plurality of second partially re-encoded data slices; and
receiving another one of the plurality of second partially re-encoded data slices from a second other SU of the sub-set of other SUs, wherein the second other SU generated the another one of the plurality of second partially re-encoded data slices by:
partially decoding the second encoded data slice of the set of encoded data slices in accordance with the previous dispersed storage error encoding parameters and an encoded data slice of the set of encoded data slices stored by the second other SU to produce a second partially decoded second encoded data slice; and
partially re-encoding the second partially decoded second encoded data slice in accordance with the updated dispersed storage error encoding parameters to produce the another one of the plurality of second partially re-encoded data slices.

5. The method of claim 1, wherein the generating the new second encoded data slice comprises:
performing an arithmetic function on the plurality of second partially re-encoded data slices to produce the new second encoded data slice.

6. The method of claim 5, wherein the arithmetic function comprises at least one of:
an exclusive OR function;
an addition function;
a subtraction function;
a multiplication function; or
a division function.

7. The method of claim 1 further comprises:
storing, by a set of SUs of the DSN, the set of encoded data slices, wherein the another SU is in the set of SUs; and
receiving, by the SU, the plurality of second partially re-encoded data slices from the sub-set of other SUs, wherein the sub-set of other SUs is in the set of SUs.

8. The method of claim 1 further comprises:
determining to create the new set of encoded data slices based on a change request from the previous threshold number to the updated threshold number.

9. A non-transitory computer readable storage medium comprises:
at least one memory section that stores operational instructions that, when executed by one or more processing modules of one or more computing devices of a dispersed storage network (DSN), causes the one or more computing devices to:
determine to create a new set of encoded data slices based on an unfavorable storage performance level associated with one or more storage units (SUs) within a dispersed storage network (DSN);
partially decode, by a storage unit (SU) of the DSN, a first encoded data slice of a set of encoded data slices in accordance with previous dispersed storage error encoding parameters having a previous threshold number to produce a partially decoded first encoded data slice, wherein the first encoded data slice is stored by another SU of the DSN and is transmitted from the another SU via the DSN and received via an interface of the SU that is configured to interface and communicate with the DSN, and wherein a data segment of a data object is encoded into the set of encoded data slices in accordance with the previous dispersed storage error encoding parameters;
partially re-encode, by the SU, the partially decoded first encoded data slice in accordance with updated dispersed storage error encoding parameters having an updated threshold number to produce a first partially re-encoded data slice, wherein the first partially re-encoded data slice is used to create a new first encoded data slice of the new set of encoded data slices that corresponds to the data segment being dispersed storage error encoded in accordance with the updated dispersed storage error encoding parameters, wherein the partially re-encode, by the SU, is performed by:
obtaining a new encoding matrix corresponding to the updated dispersed storage error encoding parameters;
reducing the new encoding matrix based on a matrix position corresponding to the new first encoded data slice of the new set of encoded data slices that corresponds to the data segment being dispersed storage error encoded in accordance with the updated dispersed storage error encoding parameters; and
matrix multiplying the reduced new encoding matrix with the partially decoded first encoded data slice to produce the first partially re-encoded data slice;
receive, by the SU via the DSN and via the interface of the SU, a plurality of second partially re-encoded data slices from a sub-set of other SUs of the DSN, wherein the plurality of second partially re-encoded data slices is created in accordance with the updated dispersed storage error encoding parameters based on partially re-encoding by the sub-set of other SUs of the DSN; and
generate, by the SU, a new second encoded data slice of the new set of encoded data slices from the plurality of second partially re-encoded data slices.

10. The non-transitory computer readable storage medium of claim 9, wherein the one or more processing modules functions to execute the operational instructions stored by the at least one memory section to cause the one or more computing devices of the DSN to partially decode by:
obtaining a decoding matrix corresponding to the previous dispersed storage error encoding parameters;
generating a reduced data matrix based on a second encoded data slice of the set of encoded data slices that correspond to the data segment being encoded in accordance with the previous dispersed storage error encoding parameters; and matrix multiplying the decoding matrix and the reduced data matrix to produce the partially decoded first encoded data slice.

11. The non-transitory computer readable storage medium of claim 9, wherein the DSN includes at least one of a wireless communication system, a wire lined communication system, a non-public intranet system, a public internet system, a local area network (LAN), or a wide area network (WAN).

12. The non-transitory computer readable storage medium of claim 9, wherein the one or more processing modules functions to execute the operational instructions stored by the at least one memory section to cause the one or more computing devices of the DSN to receive the plurality of second partially re-encoded data slices by:

receiving one of the plurality of second partially re-encoded data slices from a first other SU of the sub-set of other SUs, wherein the first other SU generated the one of the plurality of second partially re-encoded data slices by:

partially decoding a second encoded data slice of the set of encoded data slices in accordance with the previous dispersed storage error encoding parameters and an encoded data slice of the set of encoded data slices stored by the first other SU to produce a first partially decoded second encoded data slice; and partially re-encoding the first partially decoded second encoded data slice in accordance with the updated dispersed storage error encoding parameters to produce the one of the plurality of second partially re-encoded data slices; and receiving another one of the plurality of second partially re-encoded data slices from a second other SU of the sub-set of other SUs, wherein the second other SU generated the another one of the plurality of second partially re-encoded data slices by:

partially decoding the second encoded data slice of the set of encoded data slices in accordance with the previous dispersed storage error encoding parameters and an encoded data slice of the set of encoded data slices stored by the second other SU to produce a second partially decoded second encoded data slice; and partially re-encoding the second partially decoded second encoded data slice in accordance with the updated dispersed storage error encoding parameters to produce the another one of the plurality of second partially re-encoded data slices.

13. The non-transitory computer readable storage medium of claim 9, wherein the one or more processing modules functions to execute the operational instructions stored by the at least one memory section to cause the one or more computing devices of the DSN to generate the new second encoded data slice by:

performing an arithmetic function on the plurality of second partially re-encoded data slices to produce the new second encoded data slice.

14. The non-transitory computer readable storage medium of claim 13, wherein the arithmetic function comprises at least one of:

an exclusive OR function;

an addition function;

a subtraction function;

a multiplication function; or a division function.

15. The non-transitory computer readable storage medium of claim 9 further comprises:

the at least one memory section stores further operational instructions that, when executed by the one or more processing modules, causes the one or more computing devices of the DSN to:

store, by a set of SUs of the DSN, the set of encoded data slices, wherein the another SU is in the set of SUs; and receive, by the SU, the plurality of second partially re-encoded data slices from the sub-set of other SUs, wherein the sub-set of other SUs is in the set of SUs.

16. The non-transitory computer readable storage medium of claim 9 further comprises:

the at least one memory section stores further operational instructions that, when executed by the one or more processing modules, causes the one or more computing devices of the DSN to:

determine to create the new set of encoded data slices based on a change request from the previous threshold number to the updated threshold number.

* * * * *